(12) United States Patent
Enomoto et al.

(10) Patent No.: US 6,482,727 B2
(45) Date of Patent: Nov. 19, 2002

(54) METHOD OF PRODUCING A SEMICONDUCTOR INTEGRATED CIRCUIT DEVICE AND THE SEMICONDUCTOR INTEGRATED CIRCUIT DEVICE

(75) Inventors: Hiroyuki Enomoto, Mitaka (JP); Hiroyuki Maruyama, Ome (JP); Makoto Yoshida, Suwon-Si (KR)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/036,449

(22) Filed: Jan. 7, 2002

(65) Prior Publication Data

US 2002/0094610 A1 Jul. 18, 2002

(30) Foreign Application Priority Data

Jan. 12, 2001 (JP) .......................... 2001-005460

(51) Int. Cl.[7] .......................................... H01L 21/3205
(52) U.S. Cl. ...................... 438/586; 438/595; 438/624; 438/637; 438/639
(58) Field of Search .................... 438/586, 595, 438/597, 622, 624, 634, 637, 639, 640

(56) References Cited

U.S. PATENT DOCUMENTS

| | | | | |
|---|---|---|---|---|
| 5,817,562 A | * | 10/1998 | Chang et al. | 438/305 |
| 5,942,803 A | * | 8/1999 | Shim et al. | 257/774 |
| 6,037,211 A | * | 3/2000 | Jeng et al. | 438/253 |
| 6,136,716 A | * | 3/2000 | Tu | 438/694 |
| 6,300,238 B1 | * | 10/2001 | Lee et al. | 438/624 |

FOREIGN PATENT DOCUMENTS

| | | |
|---|---|---|
| JP | 11-68064 | 3/1999 |
| JP | 11-135781 | 5/1999 |

* cited by examiner

Primary Examiner—T. N. Quach
(74) Attorney, Agent, or Firm—Miles & Stockbridge P.C.

(57) ABSTRACT

An amount of a semiconductor substrate cut due to etching in the bottom of a contact hole formed by the SAC technique is reduced. Silicon oxide films are dry etched under the conditions of increasing the etching selective ratio of the silicon oxide films to an insulating film. Then, the conditions are changed to those increasing the etching selective ratio of the insulating film to the silicon oxide films and the insulating film is etched by a predetermined amount.

41 Claims, 50 Drawing Sheets

METHOD OF PRODUCING A SEMICONDUCTOR INTEGRATED CIRCUIT DEVICE AND THE SEMICONDUCTOR INTEGRATED CIRCUIT DEVICE

BACKGROUND OF THE INVENTION

The present invention relates to a method of producing a semiconductor integrated circuit device and a semiconductor integrated circuit device, particularly to an effective technique adapted to manufacture of a semiconductor integrated circuit device having a DRAM (Dynamic Random Access Memory).

In a recent large DRAM of 64 or 256 megabits (Mbits), in forming a contact hole for connecting a bit line or information storage capacitive element to a semiconductor substrate in a space between gate electrodes of a miniaturized memory cell selecting MISFET, the top and sidewalls of the gate electrodes are covered with a silicon nitride film, a silicon oxide film burying the space between the gate electrodes is formed over the silicon nitride film including the space between the gate electrodes and then a contact hole is formed utilizing the different of an etching rate between the silicon oxide film and the silicon nitride film. At that time, the Self Align Contact (SAC) technique is adopted in which a contact hole is opened self-aligningly to the space between the gate electrodes utilizing the different of an etching rate between the silicon oxide film and the silicon nitride film.

As for the SAC technique, it is described in Japanese Patent Laid-Opens No. 135781/1999 and No. 68064/1999, for example. In Japanese Patent Laid-Open No. 135781/1999, it discloses a technique in which a contact hole is opened by the SAC technique and then a sidewall insulating film for protecting an interlayer insulating film is formed in wet etching for removing a natural oxide film that is formed inside the contact hole. Additionally, in Japanese Patent Laid-Open No. 68064/1999, it discloses a technique in which a polycrystalline silicon film is used as an etching stopper in forming a contact hole by the SAC technique and a sidewall comprised of a silicon oxide film is formed on the inner walls of the contact hole to prevent leakage from being generated through the polycrystalline silicon film after opening the contact hole.

SUMMARY OF THE INVENTION

However, the inventors found the following problems in the Self Align (SAC) technique described above.

More specifically, as an aspect ratio (a ratio between a space height and a space width) of the space between the gate electrodes is increased, voids tend to be generated in the silicon oxide film burying the space. Additionally, when the space is buried with a coating film such as an organic SOG film or inorganic SOG film or a low dielectric constant insulating film having a dielectric constant of three or less, voids are hardly generated right after burying. However, these films are liable to wet etching and thus voids might be generated due to the cleaning process after forming the contact holes.

When the voids are generated, a problem arises that the adjacent contact holes are short-circuited by a conductive film through the voids when the contact holes are buried with a conductive film such as a polycrystalline silicon film after forming the contact holes.

As one scheme to avoid such a problem, it is considered to adopt a technique in which a sidewall protecting film comprised of a silicon nitride film or silicon oxide film is deposited over the sidewalls of contact holes after forming the contact holes and thereby openings of the voids are blocked or void generation is prevented beforehand. In this case, the sidewall protecting film is also deposited over the bottom of the contact holes. Thus, the sidewall protecting film deposited over the bottom of the contact holes is removed using etchback and a semiconductor substrate is to be exposed in the bottom of the contact holes.

However, when the technique of depositing the sidewall protecting film over the sidewalls of the contact hole is adopted, a problem occurs that an amount of the semiconductor substrate cut is increased in the bottom of the contact hole because the etching process for removing the sidewall protecting film in the bottom of the contact hole is increased. Furthermore, a problem arises that the shallow junction of a diffused layer cannot be coped because the amount of the semiconductor substrate cut is increased in the bottom of the contact hole. Moreover, a problem occurs that contact resistance in the bottom of the contact hole is increased because of the cut of the semiconductor substrate due to etching or damage contamination.

Besides, the sidewall protecting film decreases the coverage at the corners in the bottom of the contact hole. Thus, the film thickness becomes thinner in the lower part of the sidewalls of the contact hole and sidewall protection is not achieved sufficiently. Therefore, a problem arises that etching the interlayer insulating film proceeds at that portion and the adjacent contact holes are short-circuited due to the conductive film burying the contact hole.

The purpose of the invention is to provide a technique capable of reducing an amount of a semiconductor substrate cut due to etching in the bottom of a hole part in a semiconductor integrated circuit device having hole parts formed by the SAC technique.

Additionally, another purpose of the invention is to provide a technique capable of preventing the adjacent hole parts from being short-circuited due to a conductive film burying the hole parts in the semiconductor integrated circuit device having the hole parts formed by the SAC technique.

The aforesaid and other purposes and novel features of the invention will be apparent from the description of the specification and accompanying drawings.

The followings are the brief summary of representative inventions among the inventions disclosed in the specification.

That is, the invention includes the steps of: forming a first conductive film over a semiconductor substrate and then forming a first insulating film over the first conductive film; forming a plurality of gate electrodes and a cap insulating film covering the upper part of the gate electrodes by etching the first conductive film and the first insulating film; forming a third insulating film over the semiconductor substrate including the sidewalls and upper part of the cap insulating film; forming a fourth insulating film over the third insulating film; forming a first hole part by etching the fourth insulating film; etching the third insulating film exposed in the bottom of the first hole part by a predetermined amount after the step of forming the first hole part; forming a fifth insulating film having a film thickness not fully burying a space between the plurality of the gate electrodes over the fourth insulating film and the sidewalls and bottom of the first hole part; and forming a second hole part by applying anisotropic etching to the fifth insulating film. Etching conditions are different in the step of etching the fourth insulating film and the step of etching the third insulating film.

Additionally, the invention includes the steps of: forming a first conductive film over a semiconductor substrate and then forming a first insulating film over the first conductive film; forming a plurality of gate electrodes and a cap insulating film covering the upper part of the gate electrodes by etching the first conductive film and the first insulating film; forming a second insulating film by oxidizing the sidewalls of the plurality of gate electrodes and the surface of the semiconductor substrate between the plurality of gate electrodes; forming a third insulating film over the semiconductor substrate including the upper part of the second insulating film and the upper part and sidewalls of the cap insulating film; forming a fourth insulating film over the third insulating film; forming a first hole part by etching the fourth insulating film; etching the third insulating film exposed in the bottom of the first hole part using the second insulating film as an etching stopper after the step of forming the first hole part; forming a fifth insulating film having a film thickness not fully burying the space between the plurality of gate electrodes over the fourth insulating film and the sidewalls and bottom of the first hole part; applying anisotropic etching to the fifth insulating film to expose the second insulating film; and forming a second hole part by removing the second insulating film exposed from the fifth insulating film. Etching conditions are different in the step of etching the fourth insulating film and the step of etching the third insulating film.

Furthermore, the invention includes the steps of: forming a first conductive film over a semiconductor substrate and then forming a first insulating film over the first conductive film; forming a plurality of gate electrodes and a cap insulating film covering the upper part of the gate electrodes by etching the first conductive film and the first insulating film; forming a third insulating film over the semiconductor substrate including the sidewalls and upper part of the cap insulating film; forming a fourth insulating film over the third insulating film; forming a first hole part by etching the fourth insulating film; etching the third insulating film exposed in the bottom of the first hole part by a predetermined amount after the step of forming the first hole part; forming a fifth insulating film having a film thickness not fully burying a space between the plurality of the gate electrodes over the fourth insulating film and the sidewalls and bottom of the first hole part; forming a second hole part by applying anisotropic etching to the fifth insulating film; and forming a second conductive film inside the second hole part. The third insulating film is overlapped with the fifth insulating film in the bottom of the second hole part.

Moreover, the invention includes the steps of: forming a first conductive film over a semiconductor substrate and then forming a first insulating film over the first conductive film; forming a plurality of gate electrodes and a cap insulating film covering the upper part of the gate electrodes by etching the first conductive film and the first insulating film; forming a second insulating film by oxidizing the sidewalls of the plurality of gate electrodes and the surface of the semiconductor substrate between the plurality of gate electrodes; forming a third insulating film over the semiconductor substrate including the upper part of the second insulating film and the sidewalls and upper part of the cap insulating film; forming a fourth insulating film over the third insulating film; forming a first hole part by etching the fourth insulating film; etching the third insulating film exposed in the bottom of the first hole part using the second insulating film as an etching stopper after the step of forming the first hole part; forming a fifth insulating film having a film thickness not fully burying the space between the plurality of gate electrodes over the fourth insulating film and the sidewalls and bottom of the first hole part; applying anisotropic etching to the fifth insulating film to expose the second insulating film; forming a second hole part by removing the second insulating film exposed from the fifth insulating film; and forming a second conductive film inside the second hole part. The third insulating film is overlapped with the fifth insulating film in the bottom of the second hole part.

Besides, the invention includes:
(a) a plurality of gate electrodes formed over a semiconductor substrate;
(b) a cap insulating film formed over the plurality of gate electrodes;
(c) a second hole part formed between the plurality of gate electrodes, the second hole part reaching the semiconductor substrate;
(d) a third insulating film configuring at least a part of the sidewalls of the cap insulating film, the sidewalls of the gate electrodes and the sidewalls of the second hole part;
(e) a fourth insulating film formed over the third insulating film;
(f) a fifth insulating film configuring the sidewalls of the second hole part; and
(g) a second conductive film formed inside the second hole part. The third insulating film is overlapped with the fifth insulating film in the bottom of the second hole part.

According to the invention, the etching conditions are changed in the midway of the formation in forming the second hole part reaching the semiconductor substrate by etching. Therefore, the semiconductor substrate underlying the bottom of the second hole part can be prevented from being cut.

Additionally, according to the invention, the semiconductor substrate can be prevented from being cut by etching in forming the second hole part reaching the semiconductor substrate. Therefore, a damaged layer due to etching can be prevented from generating in the semiconductor substrate.

Furthermore, according to the invention, an insulating film having a main component of silicon oxide can be prevented from being exposed in the sidewalls of the second hole part reaching the semiconductor substrate. Thus, the insulating film can be prevented from being wet etched by the cleaning process.

Moreover, according to the invention, the insulating film having a main component of silicon oxide can be prevented from being wet etched from the sidewalls of the second hole part. Therefore, the adjacent second hole parts can be prevented from being short-circuited.

BRIEF DESCRIPTION OF THE DRAWINGS

The teachings of the invention can be readily understood by considering the following detailed description in conjunction with the accompanying drawings, in which.

DETAILED DESCRIPTION OF THE INVENTION

Hereafter, embodiments of the invention will be described with reference to drawings. Additionally, in the entire drawings for describing the embodiments, members having the same functions are designated the same numerals and signs, omitting the repeating description.

Embodiment 1

Figure 1:
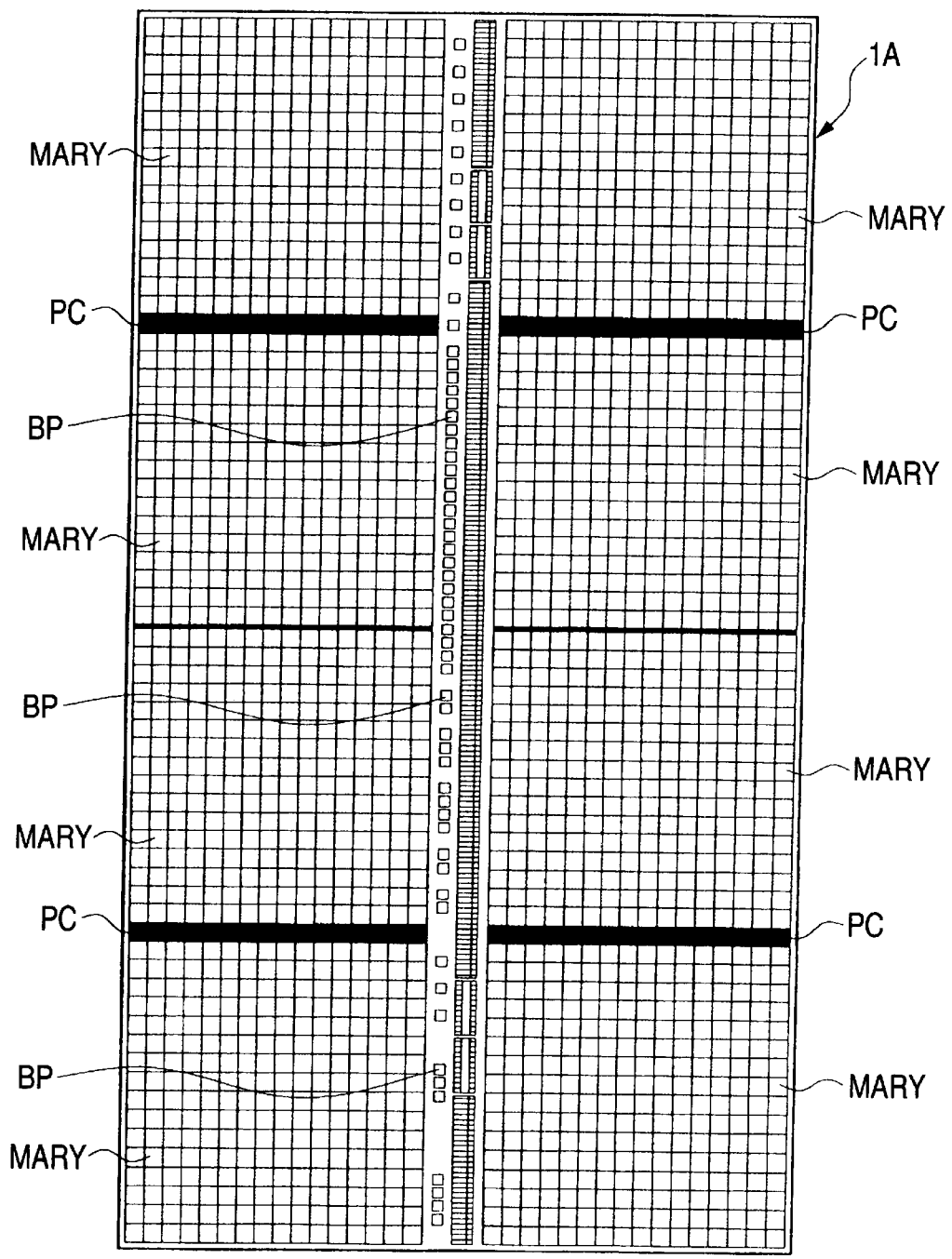
FIG. 1 depicts a whole plan view illustrating a semiconductor chip formed with a DRAM of one embodiment of the invention.

FIG. 1 depicts a whole plan view illustrating a semiconductor chip 1A formed with a DRAM (Dynamic Random Access Memory) of embodiment 1.

On a main surface of the rectangular semiconductor chip 1A is formed a DRAM having 256 Mbits of storage capacity, for example. This DRAM has a storage part comprised of a plurality of memory arrays (MARY) and a peripheral circuit part PC disposed therearound. Additionally, in the center part of the semiconductor chip 1A, a plurality of bonding pads BP to which a wire or bump electrode is connected are arranged in a row.

Figure 2:
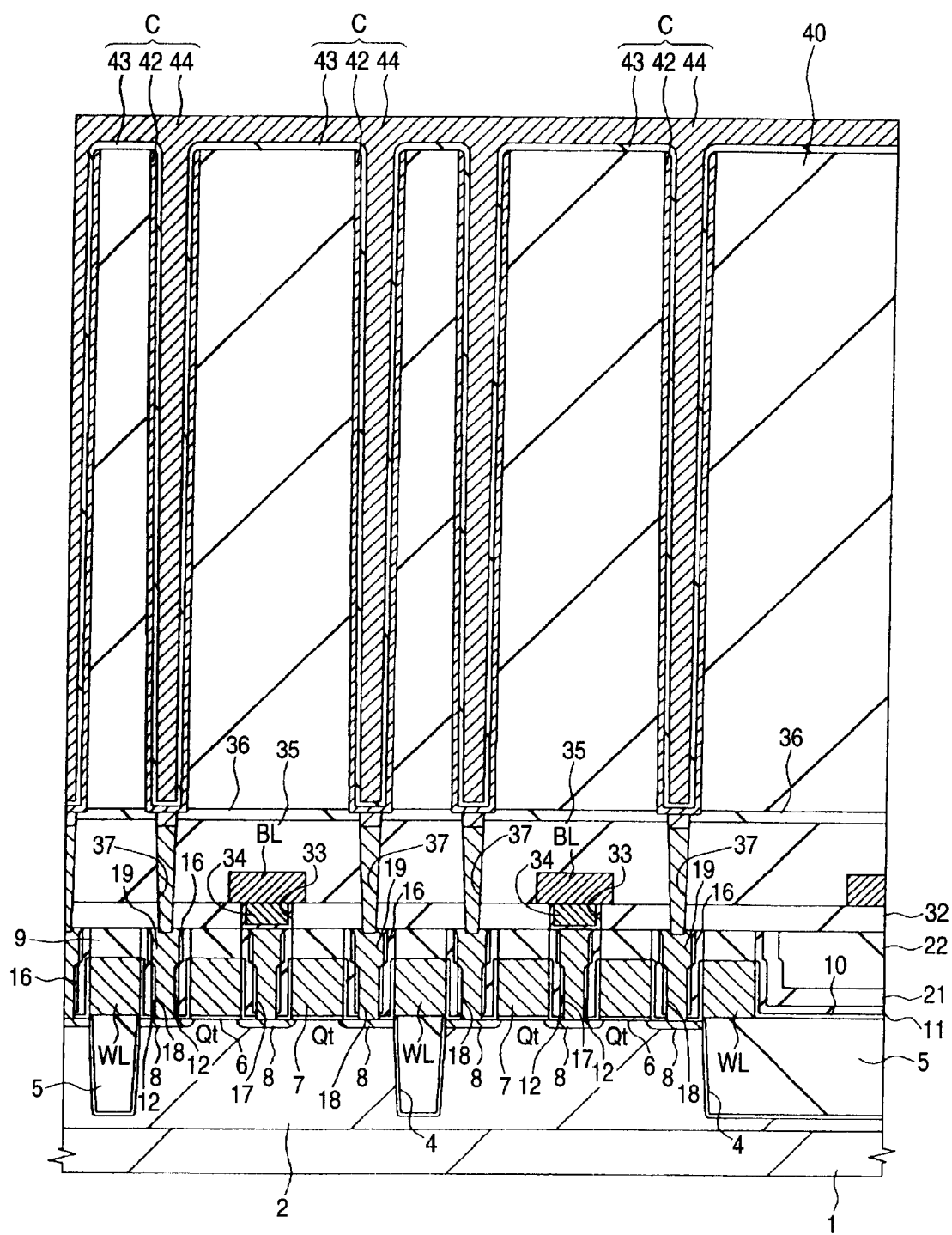
FIG. 2 depicts a section of a principal part of a semiconductor substrate illustrating a configuration of the DRAM of the embodiment of the invention.

FIG. 2 depicts a section of a principal part of a semiconductor substrate illustrating one end part of the storage part described above.

For example, or the main surface of the semiconductor substrate 1 comprised of p-type single crystal silicon are formed a p-type well 2, and or the p-type well 2 is formed a device isolation trench 4. On an active region of the p-type well 2 whose periphery is defined by the device isolation trenches 4 is formed a plurality of memory cells. Each memory cell has a memory cell selecting MISFET Qt configured of an n-channel MISFET (Metal Insulator Semiconductor Field Effect Transistor) and an information storage capacitive element C formed thereon. The memory cell selecting MISFET Qt is mainly configured of a gate insulating film 6, a gate electrode 7 and a pair of n-type semiconductor regions (source/drain regions) 8, which configure a word line WL in the region except the active region. The gate electrode 7 (word line WL) is configured of an n-type polycrystalline silicon film doped with P (phosphorus), for example.

On the semiconductor substrate 1 of the peripheral circuit part (PC), not shown in the drawing, is formed p-type and n-type wells. An n-channel MISFET is formed in the active region of the p-type well, and a p-channel MISFET is formed in the active region of the n-type well. The n-channel MISFET mainly has a gate insulating film, a gate electrode and a pair of n-type semiconductor regions (source/drain regions). In addition, the p-channel MISFET mainly has a gate insulating film, a gate electrode and a pair of p-type semiconductor regions (source/drain regions). That is, the peripheral circuit part (PC) has a complementary MISFET combining the n-channel MISFET with the p-channel MISFET.

On the sidewalls of the gate electrode 7 (word line WL) of the memory cell selecting MISFET Qt are formed insulating films 10 (second insulating film) and 11 (third insulating film). In the insulating films 10 and 11, the inner-side insulating film 10 is comprised of a silicon oxide film having a film thickness of about 2 to 5 nm, for example, and the outer-side insulating film 11 is comprised of a silicon nitride film having a film thickness of about 20 to 50 nm, for example.

In a space between the gate electrodes 7 (word lines WL) are formed contact holes 17 (second hole part) and 18 (second hole part). Additionally, an insulating film 12 (fifth insulating film) is formed over the sidewalls of the contact holes 17 and 18 so as to surround the periphery thereof. In the section transverse the gate electrode 7 (word line WL), a sidewall insulating film 16 comprised of the insulating films 10, 11 and 12 is formed. Inside the contact holes 17 and 18, a plug 19 (second conductive film) comprised of an n-type polycrystalline silicon film doped with P (phosphorous), for example, is formed.

As not shown in the drawing, the contact holes 17 and 18 are also adjacent each other in the direction of extending the gate electrode 7 (word line WL). A silicon oxide film 21 (fourth insulating film) is formed between the adjacent contact holes 17 and 18. A silicon oxide film 22 (fourth insulating film) is formed over the silicon oxide film 21.

A silicon oxide film 32 is formed over the memory cell selecting MISFET Qt and a bit line BL for reading data of memory cells is formed over the silicon oxide film 32. The bit line BL is comprised of a conductive film where a W (tungsten) film is layered over a TiN (titanium nitride), for example. The bit line BL is electrically connected to one of the n-type semiconductor regions (source/drain regions) 8 of the memory cell selecting MISFET Qt through a through hole 33 formed in the silicon oxide film 32 and the underlying contact hole 17. The inside of the through hole 33 is buried with a plug 34 comprised of a conductive film where a W film is layered over the TiN film, for example.

A silicon oxide film 35 and a silicon nitride film 36 are formed over the bit line BL and the information storage capacitive element C is formed over the silicon nitride film 36. The information storage capacitive element C is formed inside a deep trench 41 formed by etching a silicon oxide film 40 having a thick film thickness over the silicon nitride film 36, which has an under electrode 42, a capacitive insulating film 43 and an upper electrode 44.

The under electrode 42 of the information storage capacitive element C is comprised of an Ru (ruthenium) film, for example, which is electrically connected to the other of the n-type semiconductor regions (source/drain regions) 8 of the memory cell selecting MISFET Qt through a through hole 37 and the underlying contact hole 18. The capacitive insulating film 43 is comprised of a $Ta_2O_5$ film or BST ($Ba_xSr_{1-x}TiO_3$; Barium Strontium Titanate) film, for example, and the upper electrode 44 is comprised of an Ru film, for example.

Next, a method for fabricating the DRAM of the embodiment 1 configured as mentioned above will be described in the order of processes with reference to FIGS. 3 to 59.

Figure 3:
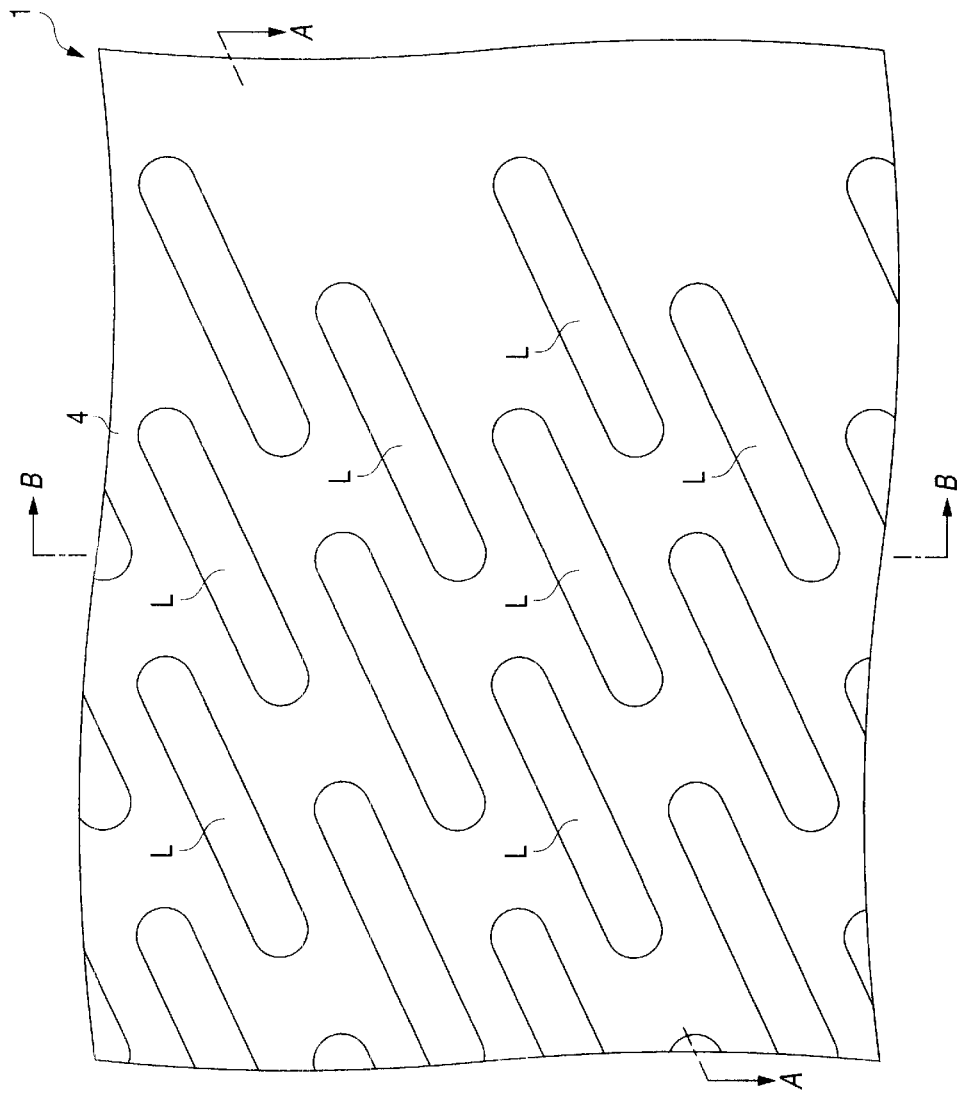
FIG. 3 depicts a plan view of a principal part illustrating a method for fabricating the DRAM of the embodiment of the invention.
Figure 4:
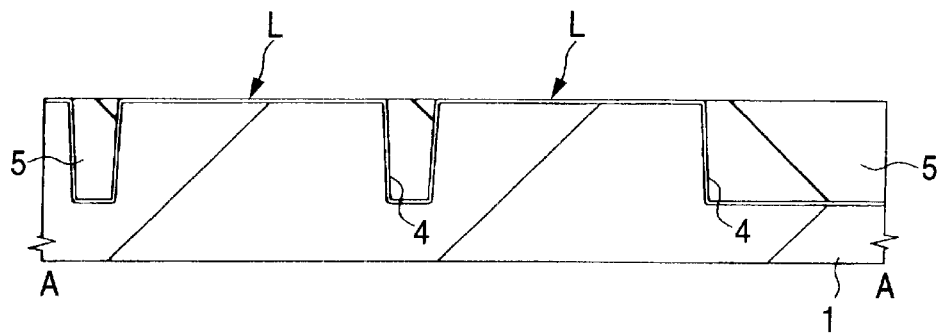
FIG. 4 depicts a section of a principal part illustrating the method for fabricating the DRAM of the embodiment of the invention.
Figure 5:
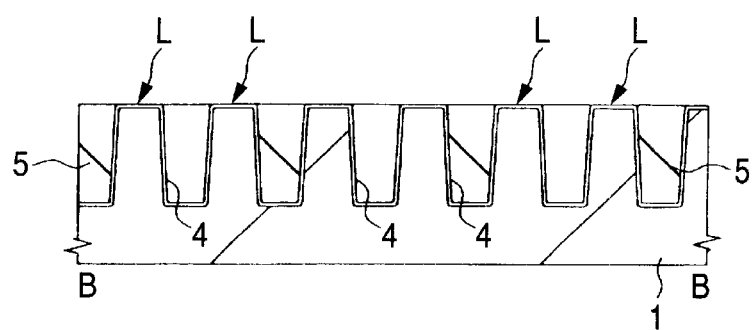
FIG. 5 depicts a section of a principal part illustrating the method for fabricating the DRAM of the embodiment of the invention.

First, as shown in FIGS. 3 (a plan view illustrating one end part of the storage part), FIG. 4 (a section along a line A—A shown in FIG. 3) and FIG. 5 (a section along a line B—B shown in FIG. 3), a device isolation trench 4 is formed in the device isolation region on the main surface of the semiconductor substrate 1. The device isolation trench 4 forms the main surface of the semiconductor substrate 1 by etching to form a trench having a depth of about 300 to 400 nm, a silicon oxide film 5 having a film thickness of about 600 nm is subsequently deposited over the semiconductor substrate 1 including the inside of the trench by CVD, for example, the silicon oxide film 5 outside the trench is then polished and removed by Chemical Mechanical Polishing (CMP). As shown in FIG. 3, the device isolation trench 4 is formed and thereby a plurality of active regions L having a long and narrow island-shaped pattern surrounded by the device isolation trench 4 is formed simultaneously.

Figure 6:
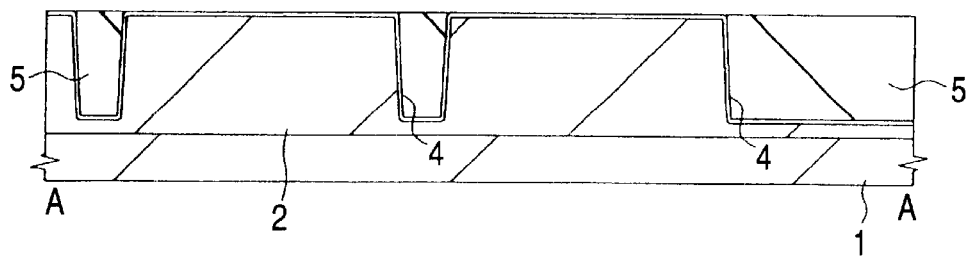
FIG. 6 depicts a section of a principal part during the process for fabricating the DRAM following FIG. 4.
Figure 7:
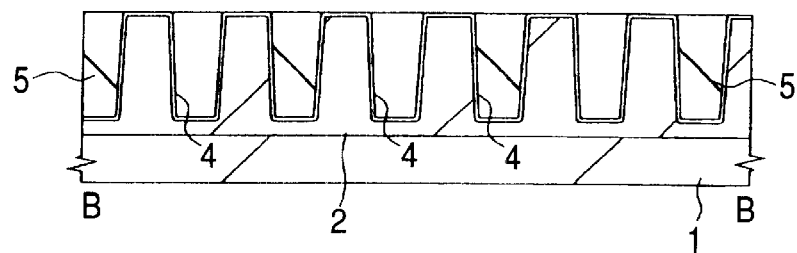
FIG. 7 depicts a section of a principal part during the process for fabricating the DRAM following FIG. 5.

Subsequently, as shown in FIGS. 6 and 7, B (boron) is implanted into the semiconductor substrate 1 and then the semiconductor substrate 1 is heated to diffuse the impurity into the semiconductor substrate 1. Thereby, the p-type well 2 is formed.

Figure 8:
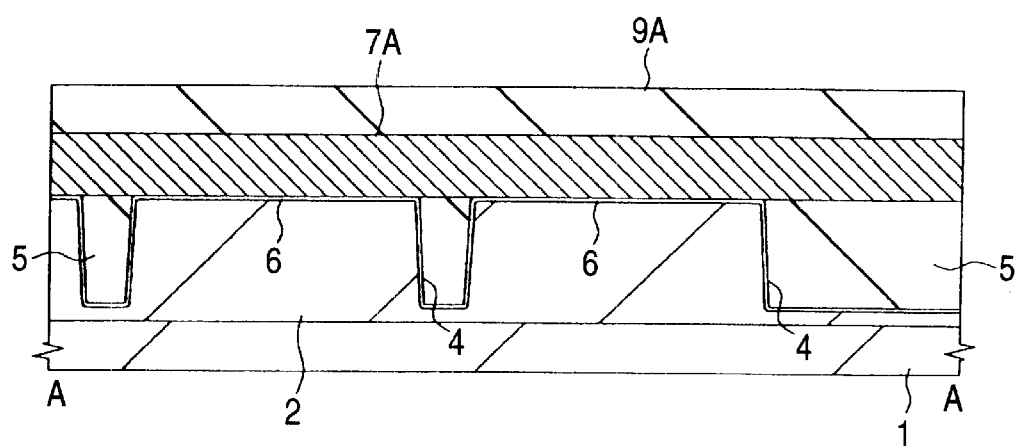
FIG. 8 depicts a section of a principal part during the process for fabricating the DRAM following FIG. 6.

Then, as shown in FIG. 8, the semiconductor substrate 1 is thermally oxidized to form the gate insulating film 6 comprised of a silicon oxide film having a film thickness of about 6 nm over the surface of the p-type well 2 and then a conductive film 7A (first conductive film) being a gate electrode material is formed over the gate insulating film 6. Subsequently, an insulating film 9A (first insulating film) being a cap insulating film material is formed over the conductive film 7A.

In order to form the conductive film 7A, an n-type polycrystalline silicon film having a film thickness of about 150 nm doped with P is deposited over the gate insulating film 6 by CVD, for example. Additionally, in order to form the insulating film 9A, a silicon nitride film having a film thickness of about 200 nm is deposited over the conductive film 7A by CVD, for example.

Figure 9:
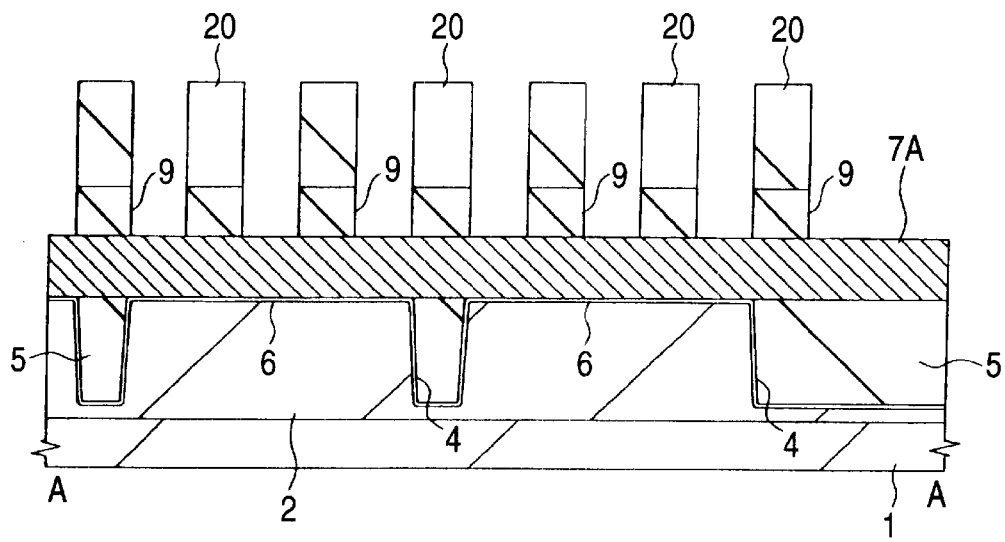
FIG. 9 depicts a section of a principal part during the process for fabricating the DRAM following FIG. 8.

Then, as shown in FIG. 9, a photoresist film 20 is used as a mask to dry etch the insulating film 9A. Thereby, a cap insulating film 9 is formed over the conductive film 7A in the region forming the gate electrode.

Figure 10:
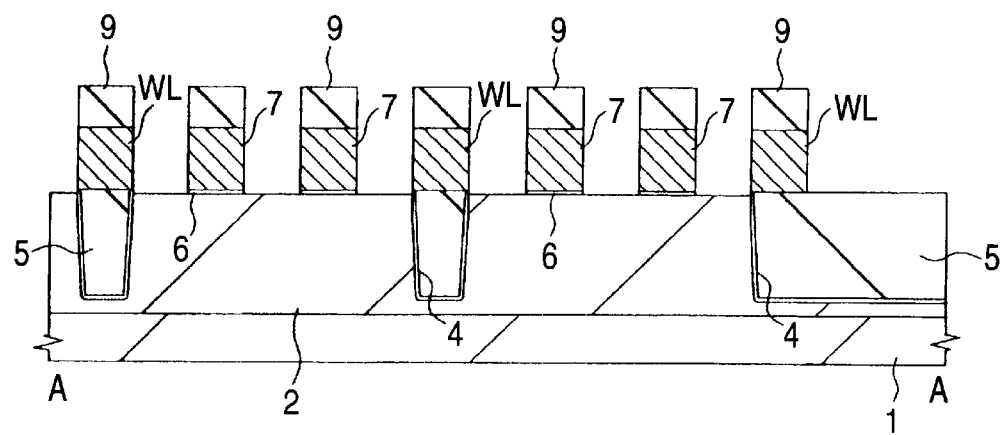
FIG. 10 depicts a section of a principal part during the process for fabricating the DRAM following FIG. 9.

Subsequently, the photoresist film 20 is removed and then the cap insulating film 9 is used as a mask to dry etch the conductive film 7A, as shown in FIG. 10. Thereby, the gate electrode 7 (word line WL) comprised of the n-type polycrystalline silicon film is formed.

Figure 11:
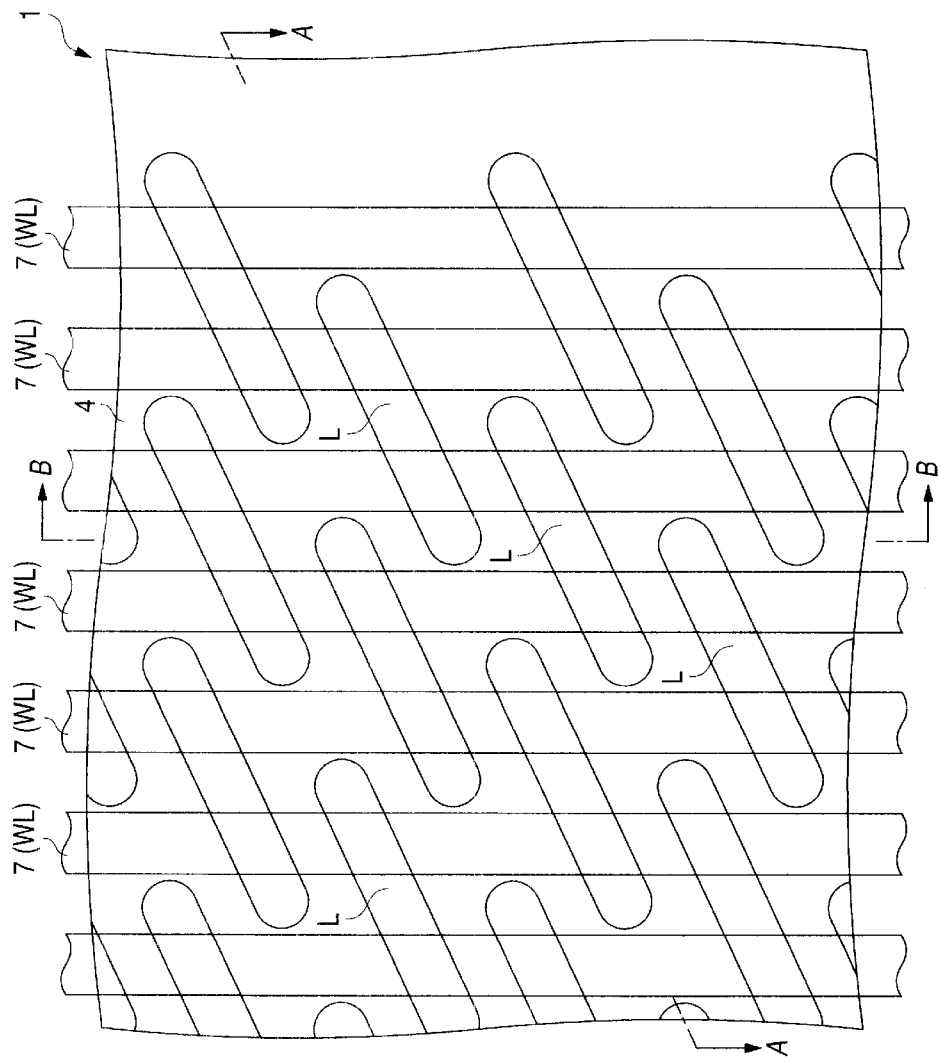
FIG. 11 depicts a plan view of a principal part illustrating the method for fabricating the DRAM of the embodiment of the invention.

Here, as shown in FIG. 11, the gate electrodes 7 (word lines WL) are extended in the direction crossing the long side of the active region L; the gate length thereof can be set about 0.13 to 1.4 μm, for example, and a space between the adjacent gate electrodes 7 (word lines WL) can be set about 0.12 μm, for example.

Subsequently, the gate insulating film 6 between the gate electrodes 7 (word lines WL) is removed by wet etching and then light oxidation is applied to the semiconductor substrate 1. Thereby, the cut part of the gate insulating film 6 under the gate electrode 7 (word line WL) is covered, the cut part has been side etched by the process for removing the gate insulating film 6 between the gate electrodes 7 (word lines WL) as described above. In addition, the insulating film 10 (second insulating film) comprised of a silicon oxide film having a film thickness of about 2 to 5 nm is formed over the sidewalls of the gate electrode 7 (word line WL) and the surface of the semiconductor substrate 1 in the space between the gate electrodes 7 (word lines WL) at this time.

Figure 12:
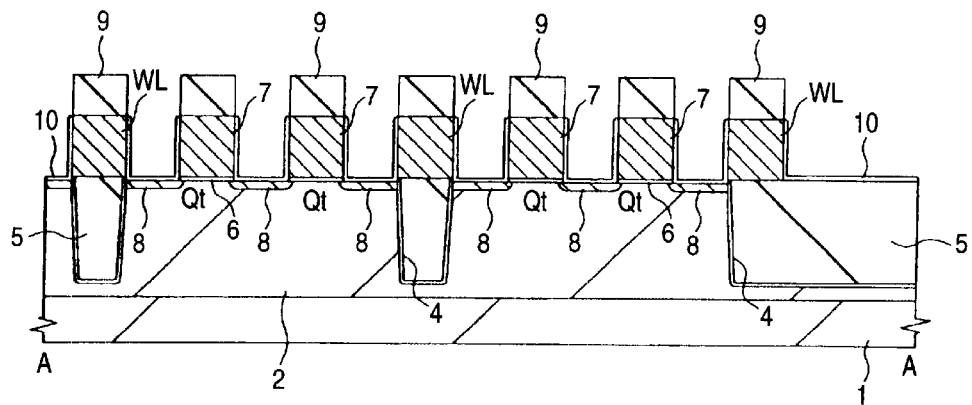
FIG. 12 depicts a section of a principal part during the process for fabricating the DRAM following FIG. 10.

After that, as shown in FIG. 12, the p-type well 2 is ion implanted with As (arsenic) and thereby the n-type semiconductor regions (source/drain regions) 8 are formed in the p-type well 2 on both sides of the gate electrode 7. The memory cell selecting MISFET Qt is almost completed by the processes until here.

Figure 13:
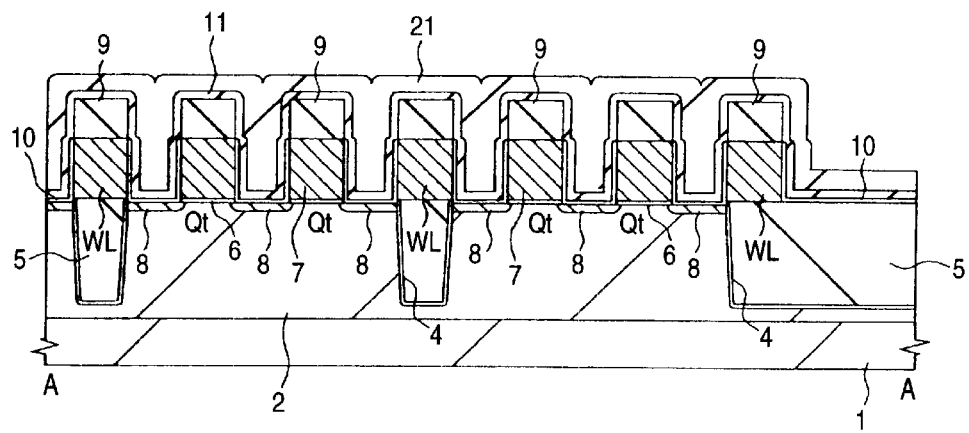
FIG. 13 depicts a section of a principal part during the process for fabricating the DRAM following FIG. 12.

Next, as shown in FIG. 13, a silicon nitride film having a film thickness of about 20 to 50 nm is deposited over the semiconductor substrate 1 by CVD, for example, and thereby the insulating film 11 (third insulating film) is formed. The insulating film 11 is used as an etching stopper for preventing the semiconductor substrate 1 from being cut in performing dry etching to form a contact hole in the space between the gate electrodes 7 in the later process.

Subsequently, a silicon oxide film 21 (fourth insulating film) having a film thickness of about 70 nm is deposited over the semiconductor substrate 1 by CVD, for example, and thereby the silicon oxide film 21 is buried in the space between the gate electrodes 7 (word lines WL). Instead of the silicon oxide film 21, an organic or inorganic SOG (Spin On Glass) film having wet etching resistance lower than that of the silicon oxide film 21 may be formed by coating, or a low dielectric constant insulating film having a dielectric constant of about four or less (fluorine-added silicon oxide (SiOF) film, for example) may be formed. When the organic or inorganic SOG film or low dielectric constant insulating film having a dielectric constant of about four or less is used instead of the silicon oxide film 21, wiring capacitance can be reduced. Thus, the working speed of the DRAM of the embodiment 1 can be enhanced.

At this time, a cavity (seam or void) might be generated in the silicon oxide film 21 buried in the space between the gate electrodes 7 (word lines WL). The contact holes 17 and 18 are formed in the space between the gate electrodes 7 (word lines WL) in the later processes. However, the insulating film 12 is formed over the sidewalls of the contact holes 17 and 18 (it will be described later with reference to FIGS. 28 to 31). Therefore, the insulating film 12 over the sidewalls of the contact holes 17 and 18 can prevent a conductive film from entering the cavity in burying the conductive film such as a polycrystalline silicon film inside the contact holes 17 and 18. Accordingly, the adjacent contact holes 17 and 18 can be prevented from being short-circuited in the direction of extending the gate electrodes 7 (word lines WL).

The silicon oxide film 21 is used for forming the MISFETs (the n-channel MISFET and the p-channel MISFET) in the peripheral circuit part to have an LDD (Lightly Doped Drain) structure. More specifically, as not shown in the drawing, the silicon oxide film 21 is deposited, the semiconductor substrate 1 of the storage part is then covered with a photoresist film and the silicon oxide film 21 over the peripheral circuit part is anisotropically etched. Thereby, the sidewall insulating film is formed over the sidewalls of the gate electrodes in the peripheral circuit part. After that, As or P is ion implanted into the p-type well in the peripheral circuit part and thereby n$^+$type semiconductor regions (source/drain regions) of high impurity concentration are formed. B is ion implanted into the n-type well and thereby p-type semiconductor regions (source/drain regions) of high impurity concentration are formed. The n-channel MISFET and the p-channel MISFET in the peripheral circuit part are almost completed in the processes here.

Figure 14:
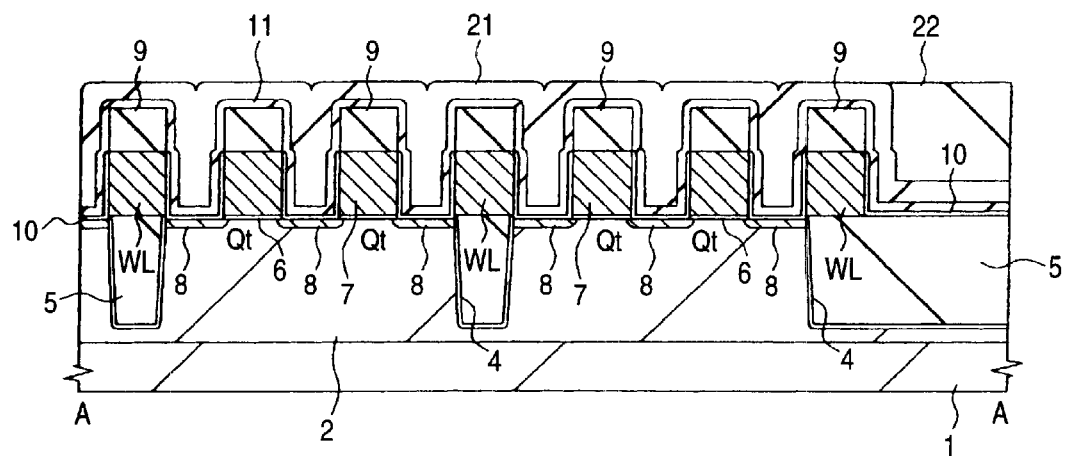
FIG. 14 depicts a section of a principal part during the process for fabricating the DRAM following FIG. 13.

Next, as shown in FIG. 14, the thick silicon oxide film 22 (fourth insulating film) having a film thickness of about 600 nm is deposited over the semiconductor substrate 1 by CVD, for example, and then the silicon oxide film 22 is polished and planarized by CMP. Thereby, the height of the silicon oxide film 22 is uniformed to that of the storage part and the peripheral circuit part not shown. At this time, the silicon nitride films configuring the cap insulating film 9 and the insulating film 11 are used as a polishing stopper, and the surface height of the silicon oxide film 22 may be backed to the upper face of the cap insulating film 9. Additionally, instead of the silicon oxide film 22, an organic or inorganic SOG film having wet etching resistance lower than that of the silicon oxide film 22 may be formed by coating, or a low dielectric constant insulating film having a dielectric constant of about four or less may be formed.

Figure 15:
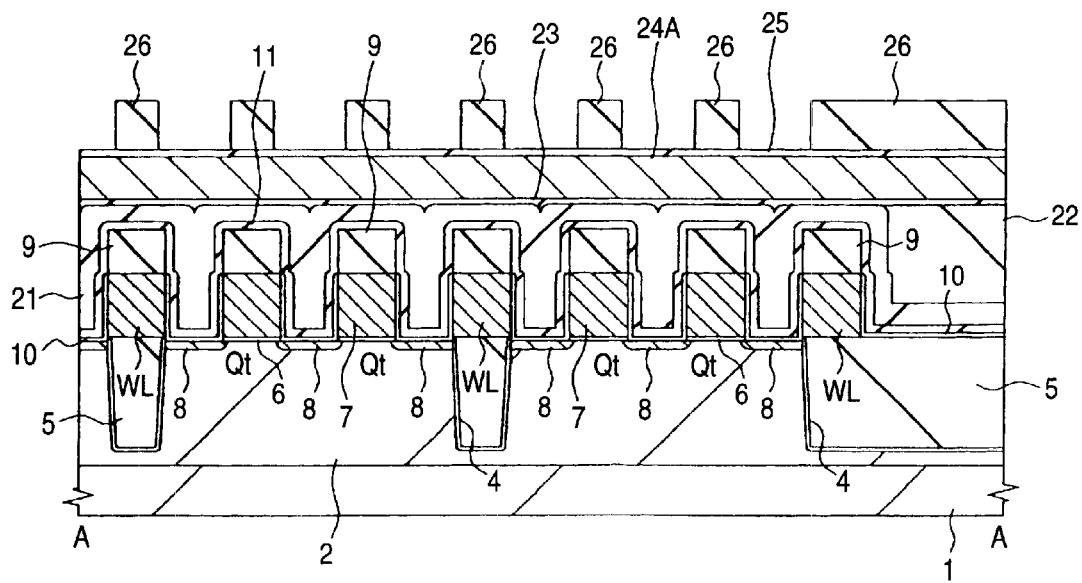
FIG. 15 depicts a section of a principal part during the process for fabricating the DRAM following FIG. 14.
Figure 16:
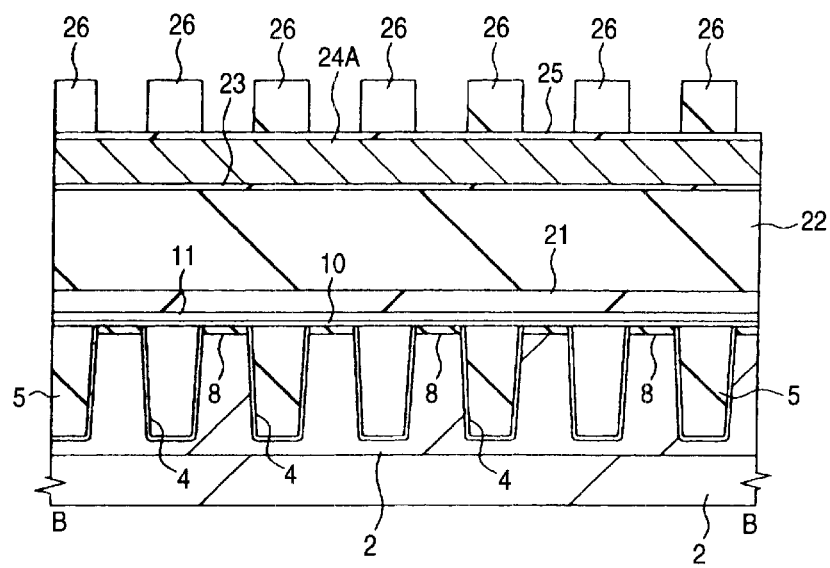
FIG. 16 depicts a section of a principal part during the process for fabricating the DRAM following FIG. 14.

Subsequently, as shown in FIGS. 15 and 16, a thin silicon oxide film 23 having a film thickness of about 10 nm is deposited over the silicon oxide film 22 by CVD, for example, and then a polycrystalline silicon film 24A having a film thickness of about 70 nm is deposited over the silicon oxide film 23 by CVD, for example. Then, an antireflection film 25 having a film thickness of about 60 nm and a photoresist film 26 having a film thickness of about 400 nm are spin coated over the polycrystalline silicon film 24A. The silicon oxide film 23 is deposited for repairing fine scratches on the surface of the underlying silicon oxide film 22; the scratches have been generated due to polishing by CMP.

Figure 17:
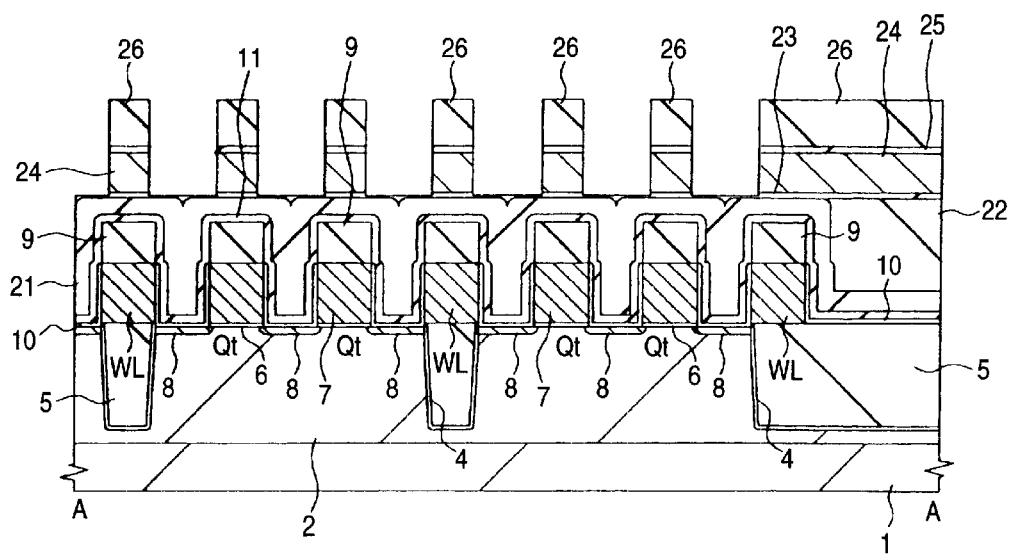
FIG. 17 depicts a section of a principal part during the process for fabricating the DRAM following FIG. 15.
Figure 18:
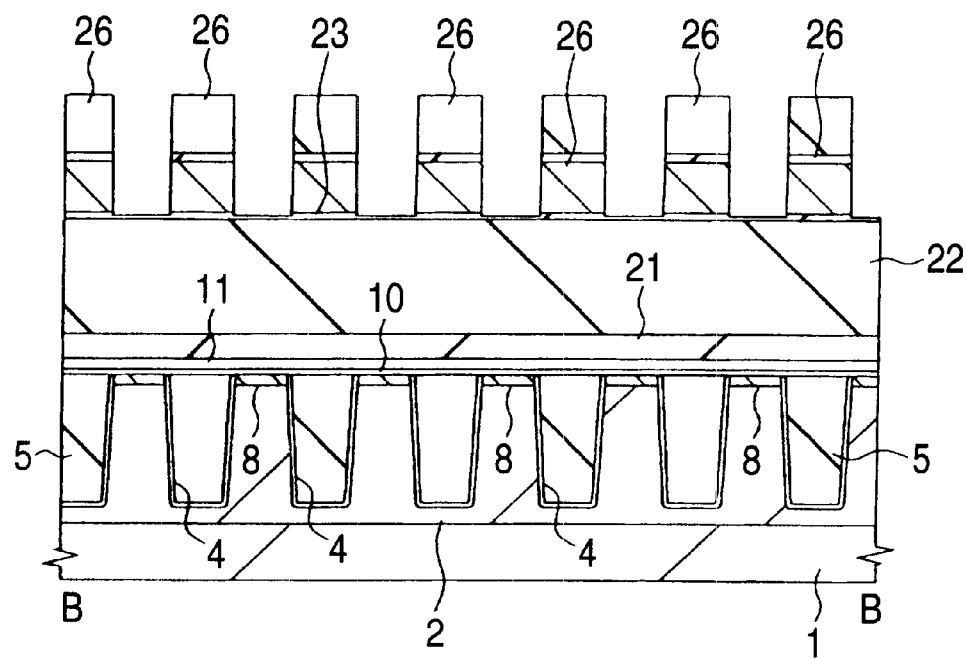
FIG. 18 depicts a section of a principal part during the process for fabricating the DRAM following FIG. 16.
Figure 19:
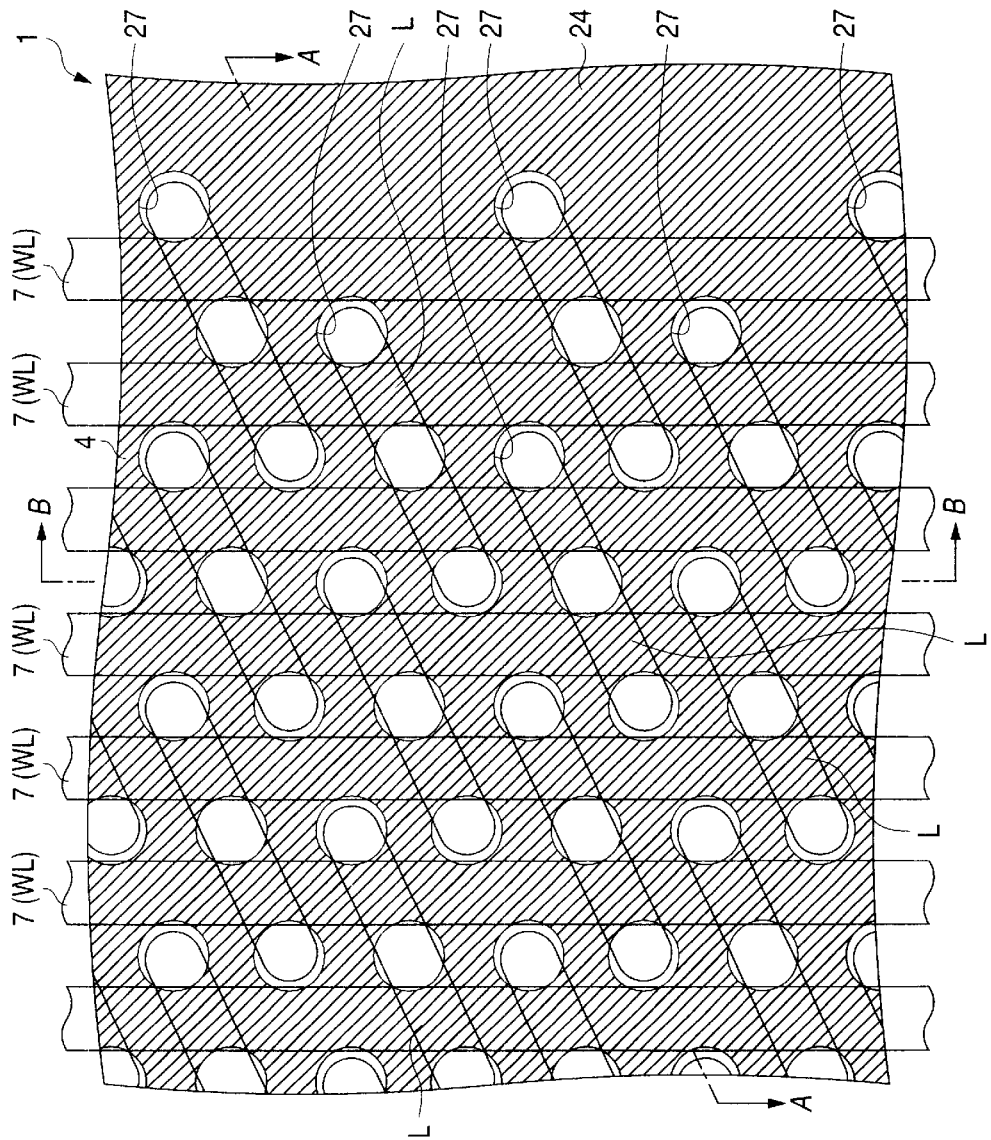
FIG. 19 depicts a plan view of a principal part illustrating the method for fabricating the DRAM of the embodiment of the invention.

Then, as shown in FIGS. 17 and 18, the photoresist film 26 is used as a mask to partially dry etch the antireflection film 25 and the polycrystalline silicon film 24A. Thereby, an etching resistant mask 24 is formed. FIG. 19 depicts a plan view illustrating a pattern of the etching resistant mask 24 (a portion applied to gray color) comprised of the polycrystalline silicon film 24A. As shown in the drawing, the etching resistant mask 24 has hole parts 27 on the active region L in the space between the gate electrodes 7 (word lines WL).

Figure 20:
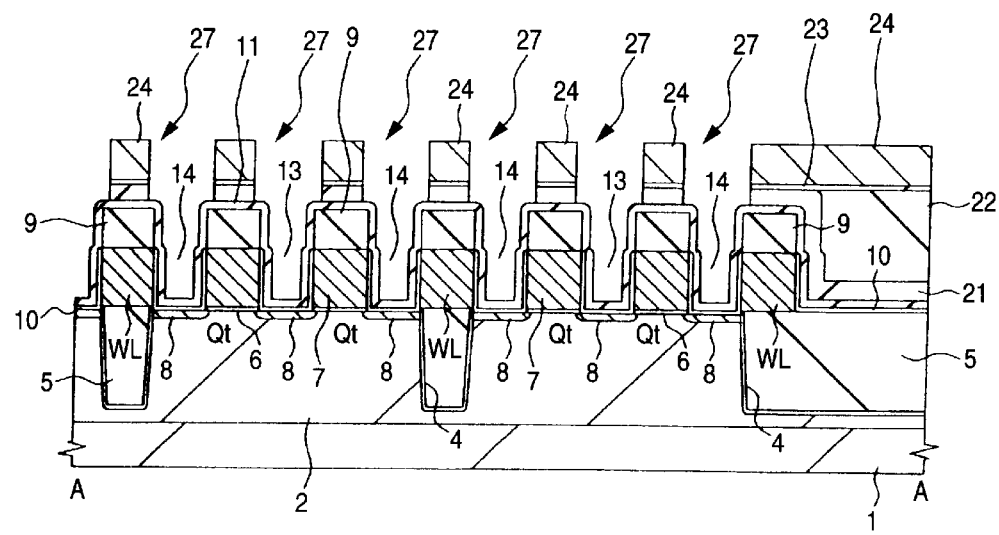
FIG. 20 depicts a section of a principal part during the process for fabricating the DRAM following FIG. 17.
Figure 21:
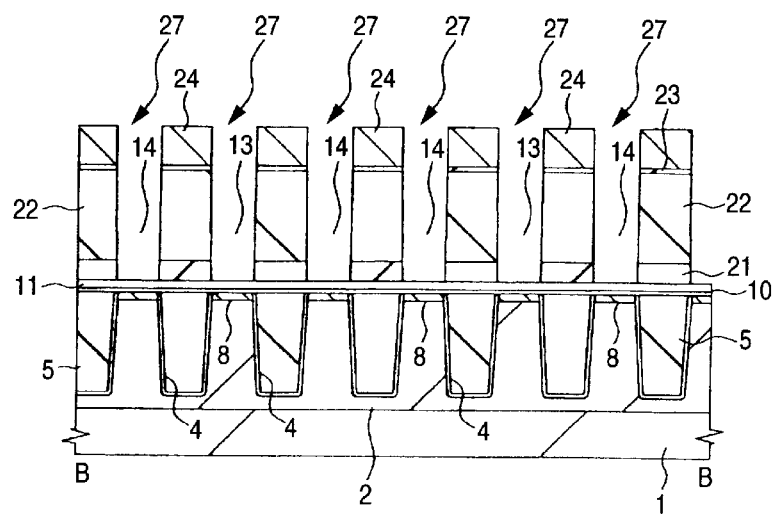
FIG. 21 depicts a section of a principal part during the process for fabricating the DRAM following FIG. 18.

Subsequently, the photoresist film 26 and the antireflection film 25 are removed. Then, the etching resistant mask 24 is used as a mask and the silicon oxide films 21, 22 and 23 inside the hole parts 27 are dry etched, as shown in FIGS. 20 and 21. Thereby, hole parts (first hole parts) 13 and 14 are formed over the n-type semiconductor regions (source/drain regions) 8, that is, the space between the gate electodes 7. The insulating films 11 and 10 in the bottom of the hole parts 13 and 14 are removed in the later processes and the hole parts 13 and 14 are formed to be the contact holes 17 and 18. Then, the contact hole 17 is used for connecting one of the n-type semiconductor regions (source/drain regions) 8 to the bit line BL and the contact hole 18 is used for connecting the other of the n-type semiconductor regions (source/drain regions) 8 to the under electrode 42 of the information storage capacitive element C that will be formed in the later processes.

In dry etching the silicon oxide films 21, 22 and 23, a mixed gas of $C_4F_8$ (fluorocarbon-based gas), Ar (argon (diluent gas)) and $O_2$ (oxygen) is used as an etching gas. An etching selective ratio to the insulating film 11 is made greater and the insulating film 11 issued as an etching stopper. Thereby, the hole parts 13 and 14 can be formed self-aligningly along the step between the gate electrodes 7 (word lines WL). Accordingly, a problem can be prevented that the cap insulating film 9 is cut to expose the surface of the gate electrodes 7 (word lines WL) in dry etching the silicon oxide films 21, 22 and 23.

Figure 22:
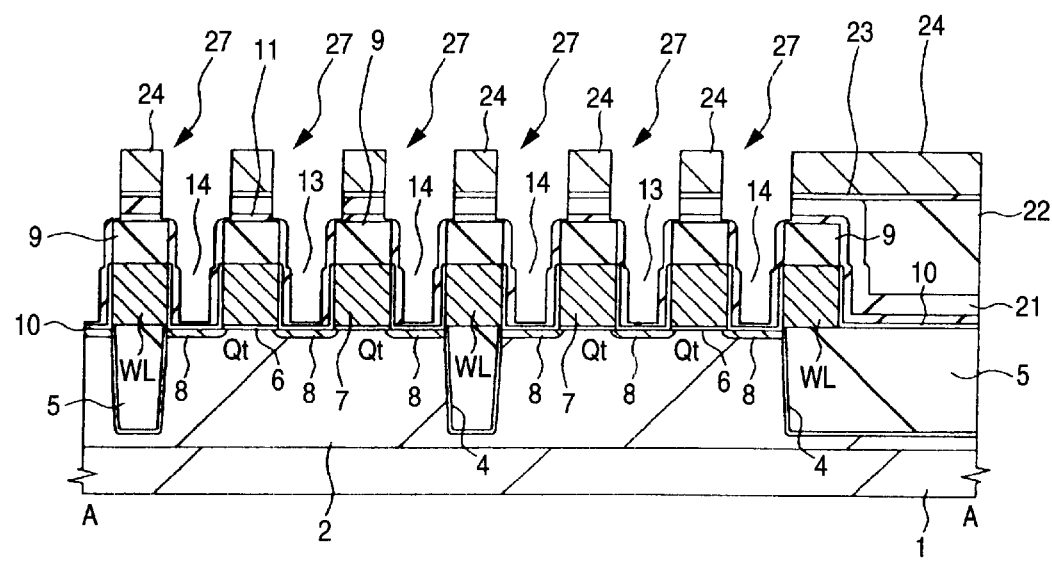
FIG. 22 depicts a section of a principal part during the process for fabricating the DRAM following FIG. 20.
Figure 23:
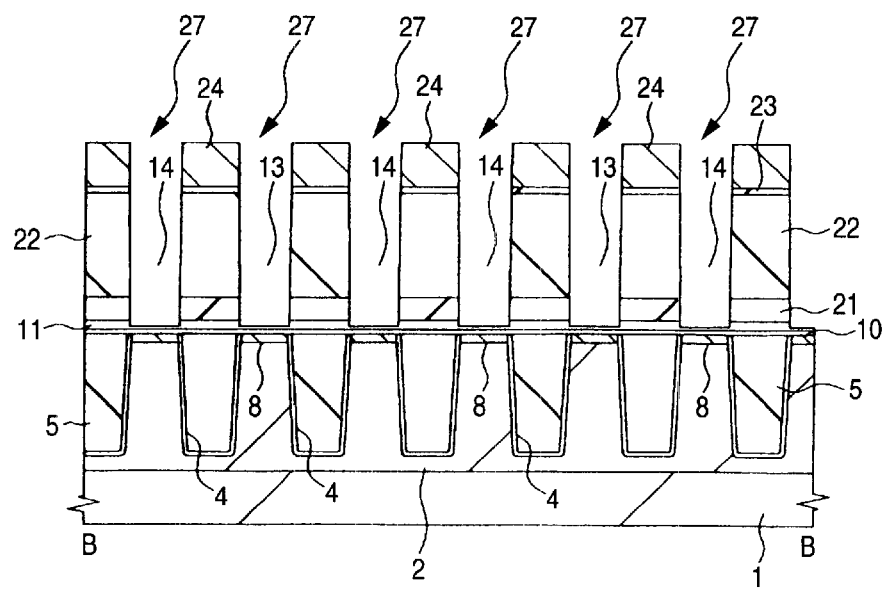
FIG. 23 depicts a section of a principal part during the process for fabricating the DRAM following FIG. 21.

Then, as shown in FIGS. 22 and 23, the insulating film 11 in the bottom of the hole parts 13 and 14 is etched by anisotropic etching (dry etching) using a mixed gas of $CHF_3$ and $O_2$ as an etching gas. At this time, the amount of the insulating film 11 etched is set equal to or above the film thickness of the insulating film 12 formed in the later processes and equal to or under the film thickness of the insulating film 11; the insulating film 11 in the bottom of the hole parts 13 and 14 is not completely removed by etching. The reason will be described later with reference to FIGS. 26 and 27. Furthermore, in etching the insulating film 11, etching time is controlled and thereby the insulating film 11 in the bottom of the hole parts 13 and 14 is not completely removed by etching; it can be left.

As described above, in the embodiment 1, etching conditions are changed and thereby the insulating film 11 in the bottom of the hole parts 13 and 14 is not completely removed by etching; it is left. Thereby, the insulating film 10 and the semiconductor substrate 1 underlying the bottom of the hole parts 13 and 14 can be prevented from being cut by over etching. Accordingly, it is possible to correspond to the shallow junction of the n-type semiconductor regions (source/drain regions) 8 and semiconductor devices can be formed minutely. In addition, the case where the insulating film 10 and the semiconductor substrate 1 underlying the bottom of the hole parts 13 and 14 happened to be cut by over etching will be described later with reference to FIGS. 36 and 37.

Furthermore, the semiconductor substrate 1 can be prevented from being cut and thus a damaged layer due to etching can be prevented from forming in the semiconductor substrate 1. Thereby, the process for removing the damaged layer can be omitted. Moreover, an increase in contact resistance due to the damaged layer can be prevented and the working speed, reliability and yield of the DRAM of the embodiment 1 can be enhanced.

Figure 24:
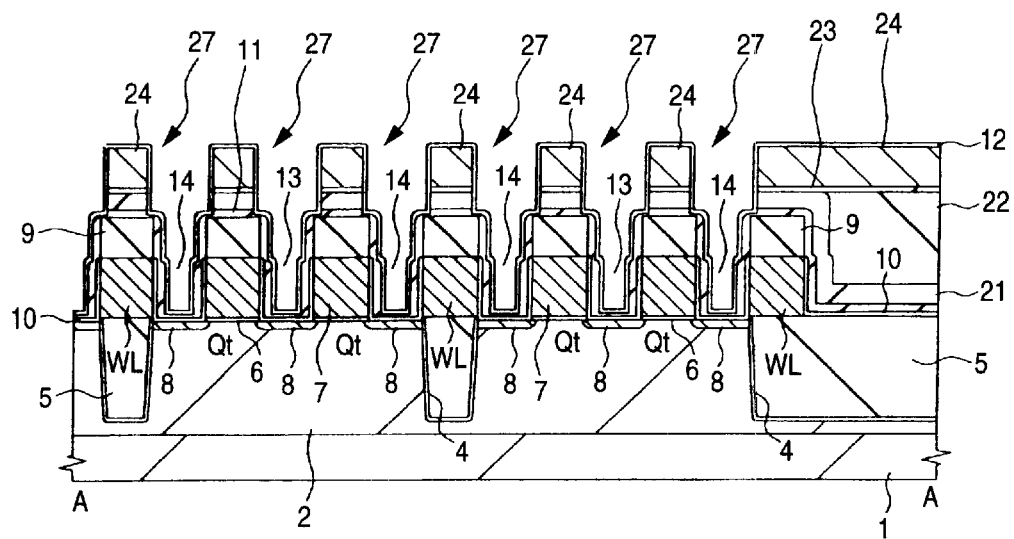
FIG. 24 depicts a section of a principal part during the process for fabricating the DRAM following FIG. 22.
Figure 25:
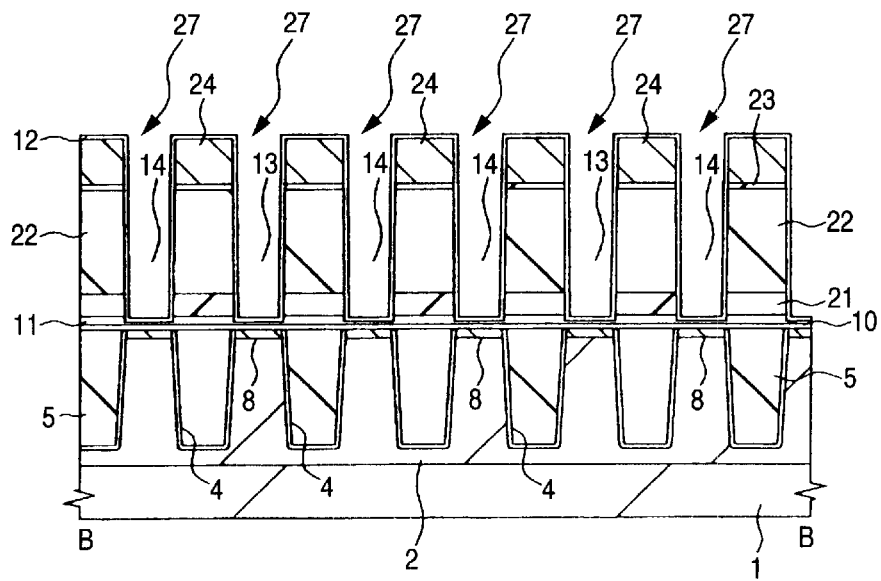
FIG. 25 depicts a section of a principal part during the process for fabricating the DRAM following FIG. 23.
Figure 26:
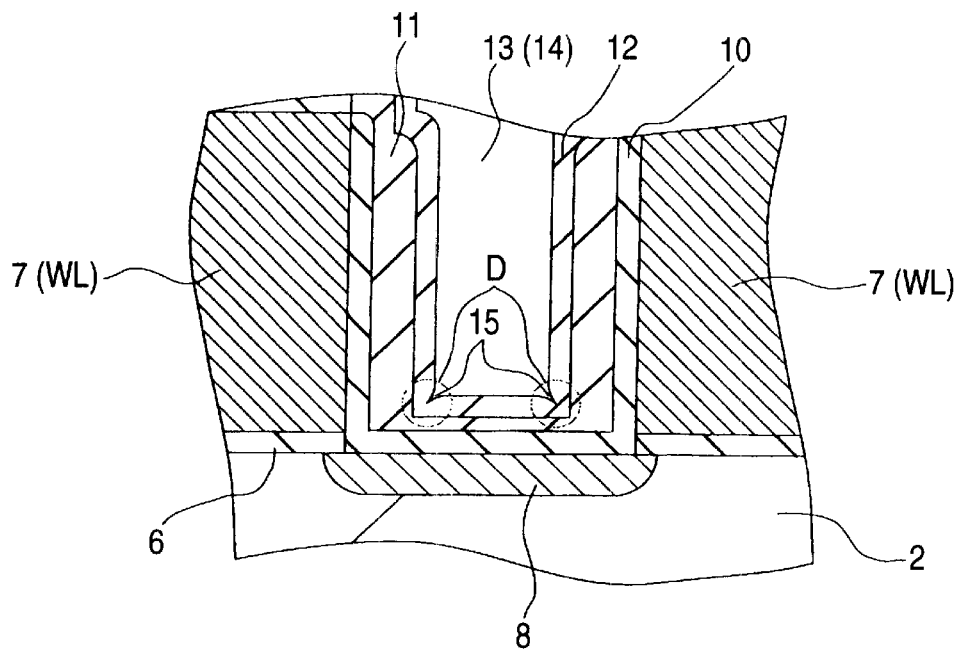
FIG. 26 depicts a section enlarging the vicinity of the hole part shown in FIG. 24.
Figure 27:
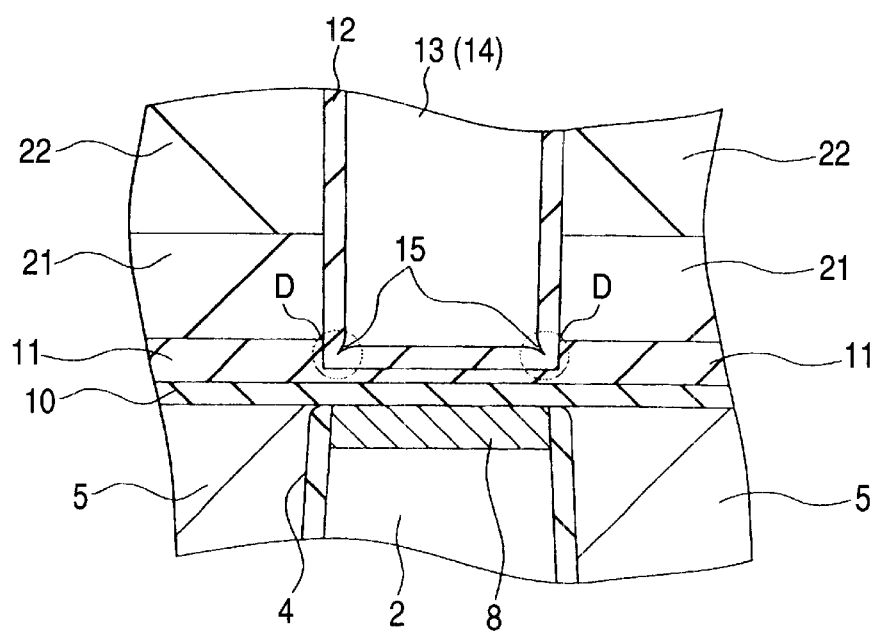
FIG. 27 depicts a section enlarging the vicinity of the hole part shown in FIG. 25.

FIGS. 24 and 25 depict sections during the process for fabricating the DRAM following FIGS. 22 and 23, respectively. FIGS. 26 and 27 depict sections enlarging the vicinity of the hole part 13 (or the hole part 14) corresponding to FIGS. 24 and 25, respectively.

Then, as shown in FIGS. 24 to 27, over the semiconductor substrate 1 including the inside of the hole parts 13 and 14, a silicon nitride film having a film thickness thinner than the insulating film 11 and not completely burying the space between the gate electrodes 7 (word lines WL) is deposited to form the insulating film 12 (fifth insulating film). In the embodiment 1, the film thickness of the insulating film 12 is set about 10 to 30 nm, for example, which is adjusted to the film thickness of the insulating film 11 described with reference to FIG. 13. For instance, the film thickness of the insulating film 12 is set about 10 to 30 nm when the film thickness of the insulating film 11 is about 50 nm, whereas the film thickness of the insulating film 12 is set about 10 nm when the film thickness of the insulating film 11 is about 20 nm.

At this time, as shown in FIGS. 26 and 27, at corners D in the bottom of the hole parts 13 and 14, the coverage of the insulating film 12 is deteriorated and restrictions 15 might be generated. However, as described with reference to FIGS. 22 and 23, the etched amount of the insulating film 11 in the bottom of the hole parts 13 and 14 is set equal to or above the film thickness of the insulating film 12 and equal to or under the film thickness of the insulating film 11. Thereby, a portion of the insulating film 12 overlapped with the insulating film 11 is formed at the corners D in the bottom of the hole parts 13 and 14. Thus, the silicon oxide film 21 can be prevented from being exposed in the sidewalls of the hole parts 13 and 14 in etching the insulating film 12 in the bottom of the hole parts 13 and 14 in the later process.

In the further later process, after the insulating films 11 and 10 underlying the insulating film 12 in the bottom of the hole parts 13 and 14 are removed, the semiconductor substrate 1 is cleaned in order to remove a silicon oxide film naturally formed on the surface of the semiconductor substrate 1 that is exposed in the bottom of the hole parts 13 and 14. However, in the method for fabricating the DRAM of the embodiment 1 as described above, the silicon oxide film 21 can be prevented from being exposed in the sidewalls of the hole parts 13 and 14. Thus, by a cleaning solution used in the cleaning process the insulating film 21 can be prevented from being wet etched. That is, when the silicon oxide film 21 is exposed in the sidewalls of the hole parts 13 and 14, a cavity might be generated in the insulating film 21 due to this wet etching. However, it can be prevented in the embodiment 1. This will be described later with reference to FIGS. 38 to 43.

Figure 28:
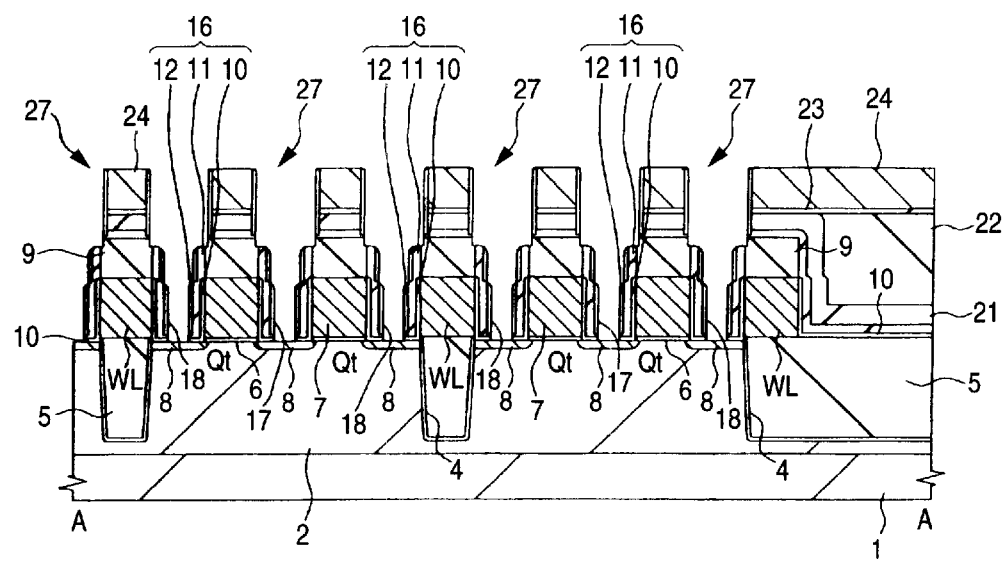
FIG. 28 depicts a section of a principal part during the process for fabricating the DRAM following FIG. 24.
Figure 29:
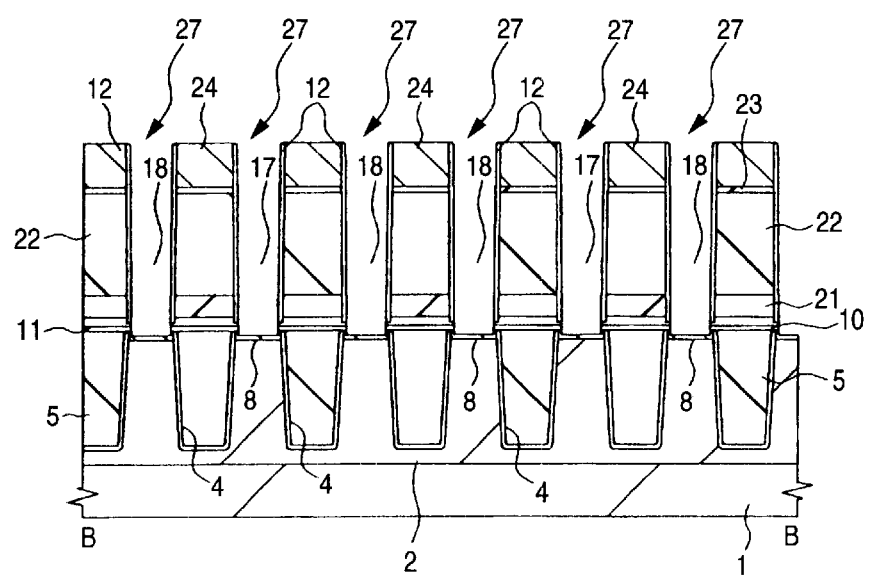
FIG. 29 depicts a section of a principal part during the process for fabricating the DRAM following FIG. 25.
Figure 30:
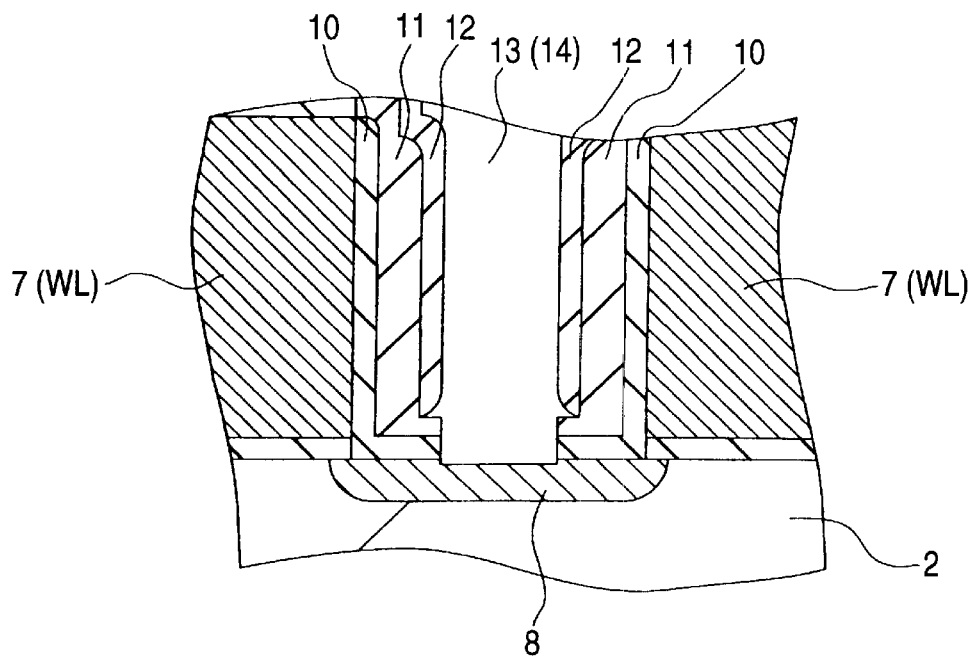
FIG. 30 depicts a section of a principal part during the process for fabricating the DRAM following FIG. 26.
Figure 31:
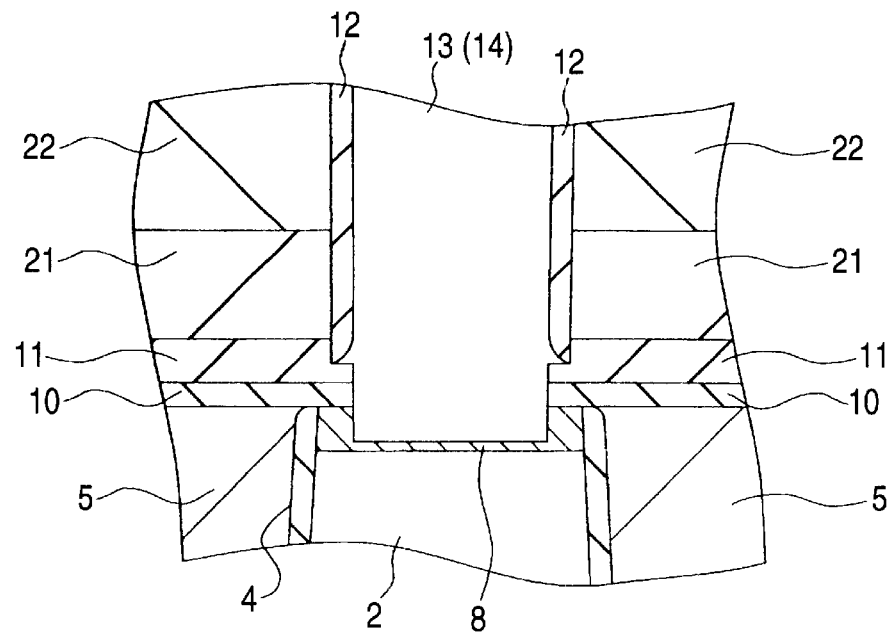
FIG. 31 depicts a section of a principal part during the process for fabricating the DRAM following FIG. 27.

FIGS. 28 and 29 depict sections during the process for fabricating the DRAM following FIGS. 24 and 25, respectively. FIGS. 30 and 31 depict sections enlarging the vicinity of the hole part 13 (or the hole part 14) corresponding to FIGS. 26 and 27, respectively.

Then, as shown in FIGS. 28 to 31, the insulating films 10, 11 and 12 in the bottom of the hole parts 13 and 14 are removed by etchback, for example. Thereby, the contact holes 17 and 18 (second hole parts) having the sidewall insulating film 16 comprised of the insulating films 10, 11 and 12 are formed.

Here, in the sidewalls of the contact holes 17 and 18 are formed the sidewall insulating film 16, a layered film comprised of the insulating films 10, 11 and 12 in the A—A section crossing the gate electrodes 7 (word lines WL), whereas the insulating film 12 is only formed in the B—B section parallel to the gate electrodes 7 (word lines WL). Additionally, in the B—B section, the end surfaces of the insulating films 10 and 11 are exposed at the corners in the bottom of the contact holes 17 and 18; a part of the end surface of the insulating film 11 is overlapped with a part of the insulating film 12.

Figure 32:
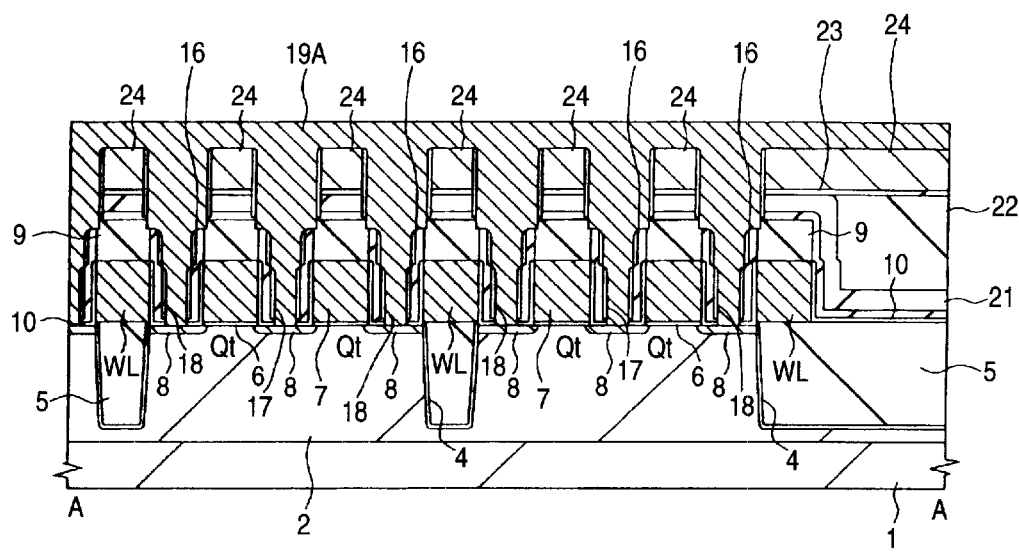
FIG. 32 depicts a section of a principal part during the process for fabricating the DRAM following FIG. 28.
Figure 33:
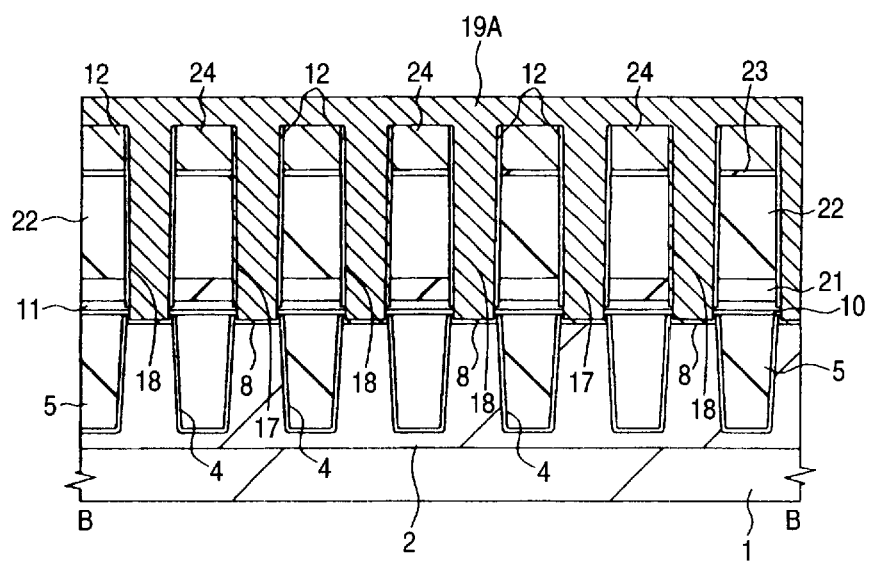
FIG. 33 depicts a section of a principal part during the process for fabricating the DRAM following FIG. 29.

Subsequently, as shown in FIGS. 32 and 33, an n-type polycrystalline silicon film 19A having a film thickness of about 100 nm doped with P, for example, is deposited by CVD and thereby the n-type polycrystalline silicon film 19A is buried inside the contact holes 17 and 18. Additionally, when a contact hole having a diameter larger than that of the contact holes 17 and 18 exists in the peripheral circuit region, not shown, the film thickness of the n-type polycrystalline silicon film 19A is shortened inside the contact hole and the substrate 1 in the bottom of the contact hole in the peripheral circuit region might be cut in polishing the n-type polycrystalline silicon film 19A in the subsequent process. Thus, a silicon oxide film having a film thickness of about 200 nm, for example, may be deposited further over the n-type polycrystalline silicon film 19A by CVD.

Figure 34:
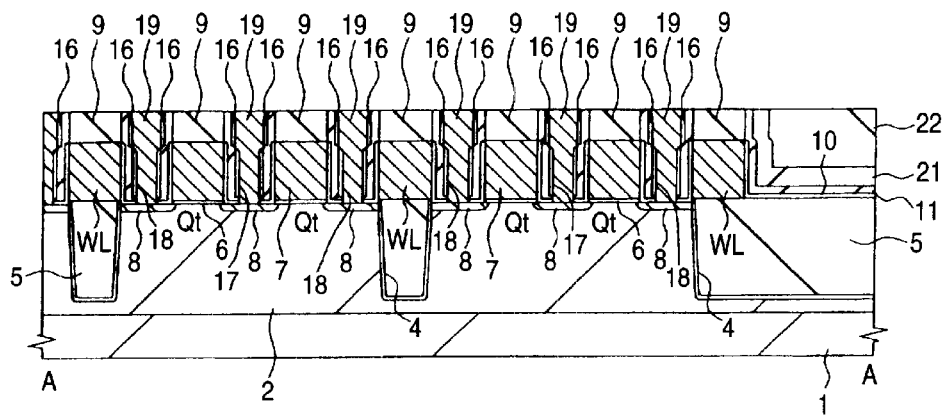
FIG. 34 depicts a section of a principal part during the process for fabricating the DRAM following FIG. 32.
Figure 35:
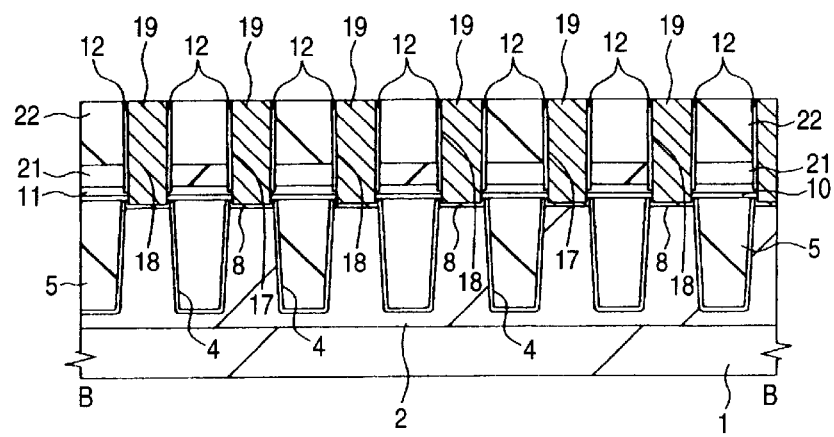
FIG. 35 depicts a section of a principal part during the process for fabricating the DRAM following FIG. 33.

Then, as shown in FIGS. 34 and 35, the n-type polycrystalline silicon film 19A, the etching resistant mask 24 comprised of a polycrystalline silicon film and the underlying silicon oxide film 23 are polished by CMP. Thereby, the n-type polycrystalline silicon film 19A outside the contact holes 17 and 18 is removed and the plug 19 (second conductive film) comprised of the n-type polycrystalline silicon film 19A is formed inside the contact holes 17 and 18. Polishing the n-type polycrystalline silicon film 19A, the etching resistant mask 24 and the silicon oxide film 23 by CMP is performed by using the silicon nitride film configuring the cap insulating film 9 as a stopper.

Figure 36:
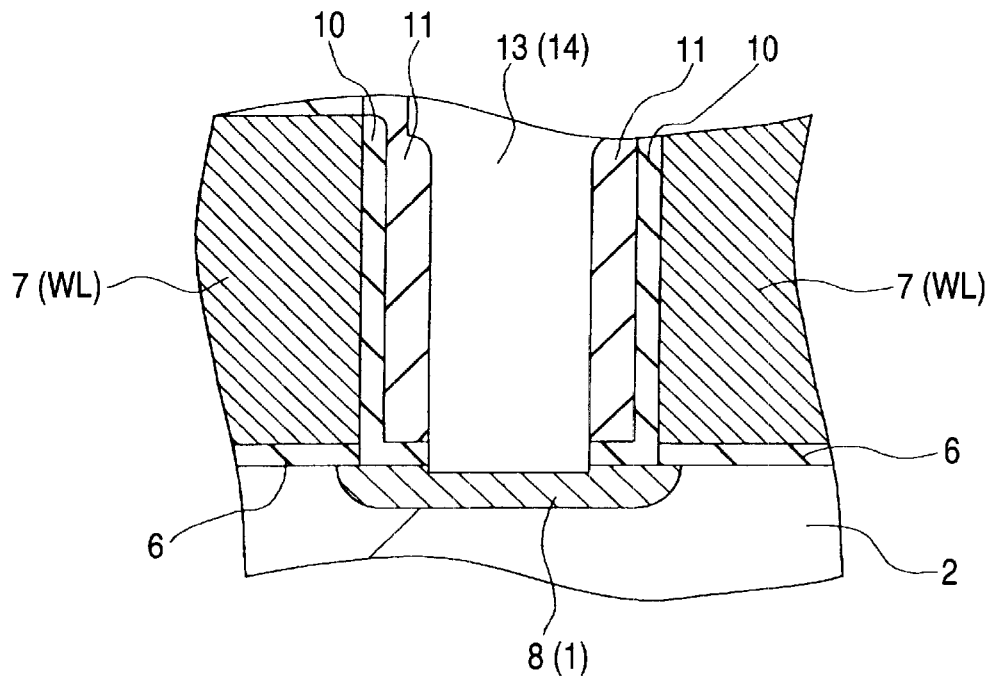
FIG. 36 depicts a section of a principal part illustrating a method for fabricating a DRAM, which is compared with the invention for study by the inventors.
Figure 37:
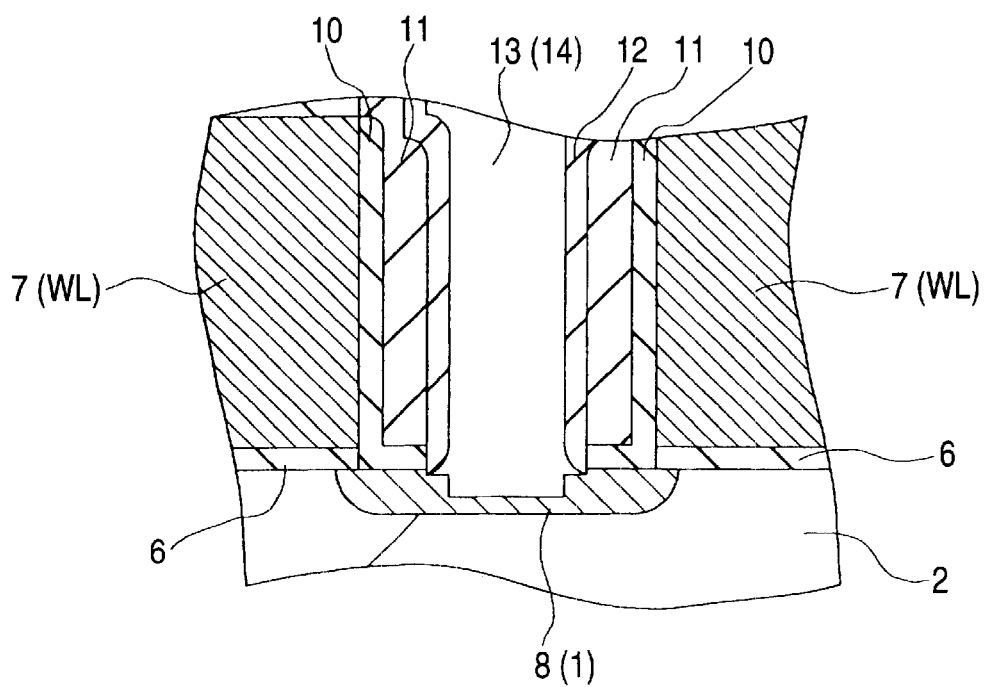
FIG. 37 depicts a section of a principal part during the process for fabricating the DRAM following FIG. 36.

However, FIG. 36 depicts a section enlarging the vicinity of the hole part 13 (or the hole part 14) when the insulating film 10 and the substrate 1 underlying the bottom of the hole parts 13 and 14 happened to be cut due to over etching in etching the insulating film 11 that has been described with reference to FIGS. 22 and 23. After that, the insulating film 12 is formed along the processes described with reference to FIGS. 24 to 31 under the conditions shown in FIG. 36 and the insulating film 12 in the bottom of the hole parts 13 and 14 is removed by etchback. Then, the semiconductor substrate 1 (n-type semiconductor regions 8 (source/drain regions)) is further cut due to over etching, as shown in FIG. 37. Consequently, it is impossible to correspond to the shallow junction of the n-type semiconductor regions 8 (source/drain regions) and semiconductor devices cannot be scaled down. That is, it causes the yield of the DRAM to be reduced.

In the embodiment 1, as described with reference to FIGS. 22 and 23, when the insulating film 11 in the bottom of the hole parts 13 and 14 is etched, the insulating film 11 is not completely removed by etching, leaving a part thereof. Consequently, the insulating film 10 and the semiconductor substrate 1 underlying the bottom of the hole parts 13 and 14 can be prevented from being cut due to over etching. Accordingly, the shallow junction of the n-type semiconductor regions 8 (source/drain regions) is possible and thus semiconductor devices can be scaled down. In addition, the damaged layer can be prevented from being generated due to cut and therefore an increase in contact resistance in the n-type semiconductor regions 8 (source/drain regions) can be avoided. More specifically, the yield and reliability of the DRAM of the embodiment 1 can be enhanced.

Figure 38:
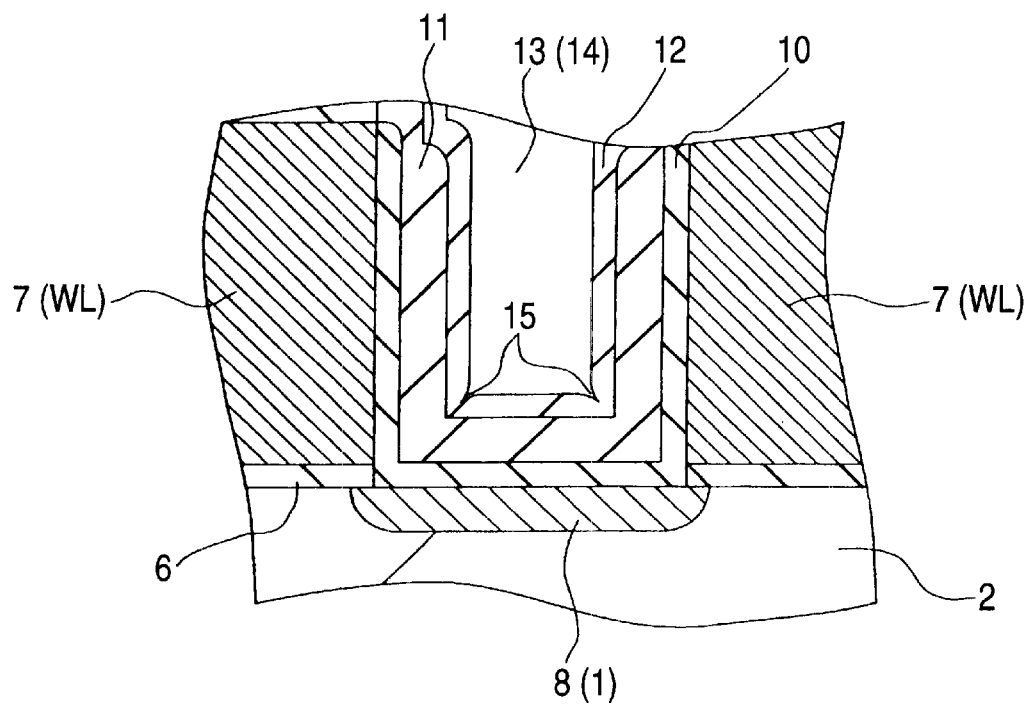
FIG. 38 depicts a section of a principal part illustrating a method for fabricating a DRAM, which is compared with the invention by the inventors.
Figure 39:
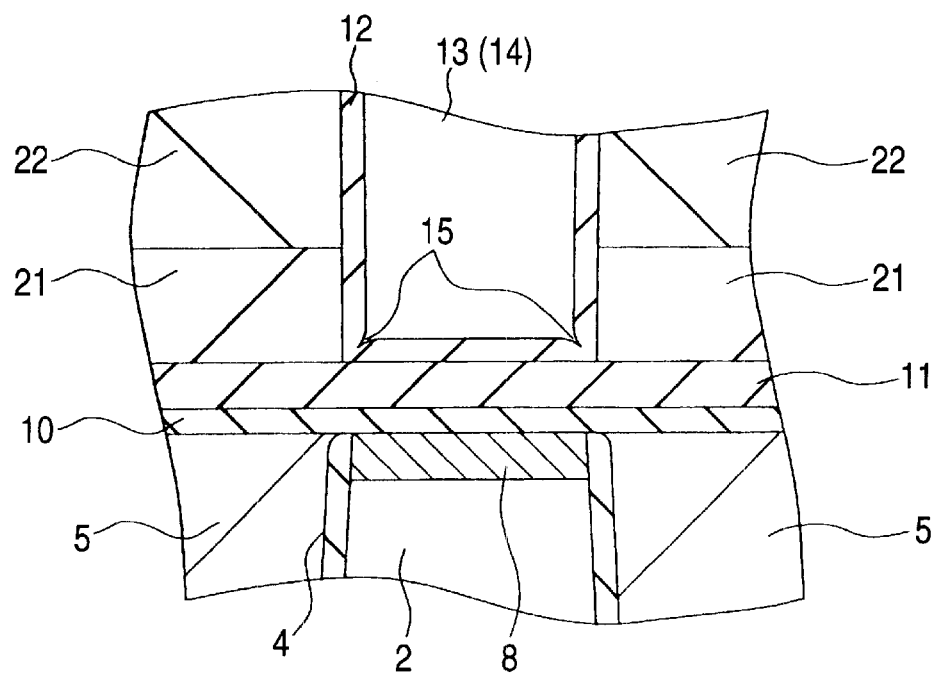
FIG. 39 depicts a section of a principal part illustrating a method for fabricating the DRAM, which is compared with the invention for study by the inventors.

Furthermore, FIGS. 38 and 39 depict sections enlarging the vicinity of the hole part 13 (or the hole part 14) when the insulating film 12 described with reference to FIGS. 24 to 27 is formed, not etching the insulating film 11 in the bottom of the hole parts 14 and 14 described with reference to FIGS. 22 and 23. Moreover, FIG. 38 depicts a section crossing the gate electrode 7 (word line WL) and FIG. 39 depicts a section parallel to the gate electrode 7 (word line WL).

Figure 40:
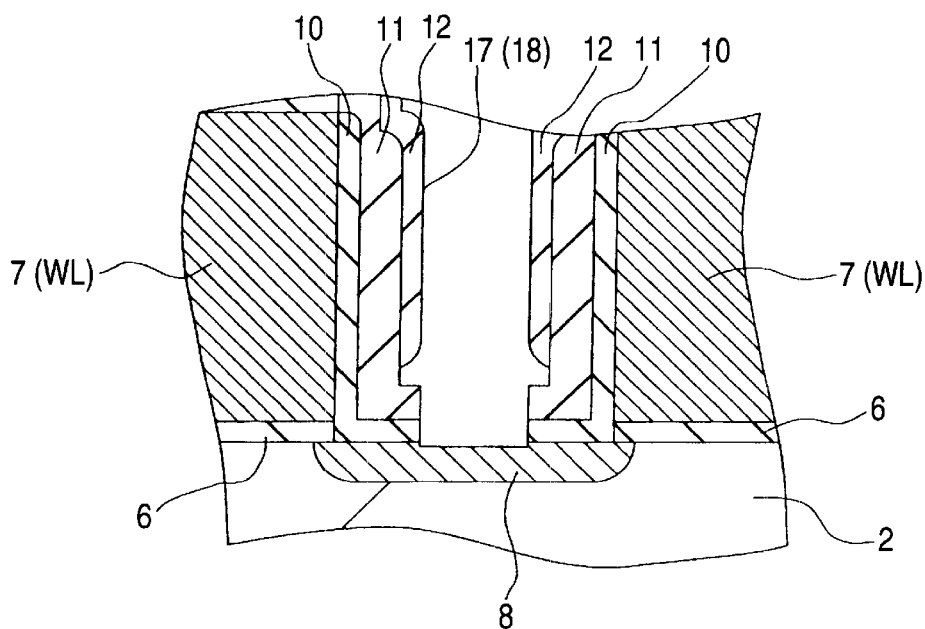
FIG. 40 depicts a section of a principal part during the process for fabricating the DRAM following FIG. 38.
Figure 41:
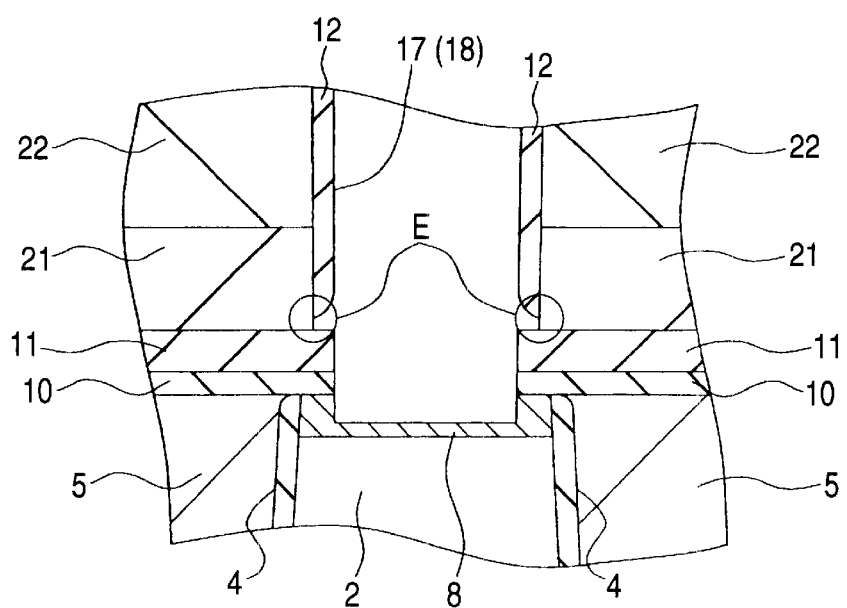
FIG. 41 depicts a section of a principal part during the process for fabricating the DRAM following FIG. 39.
Figure 42:
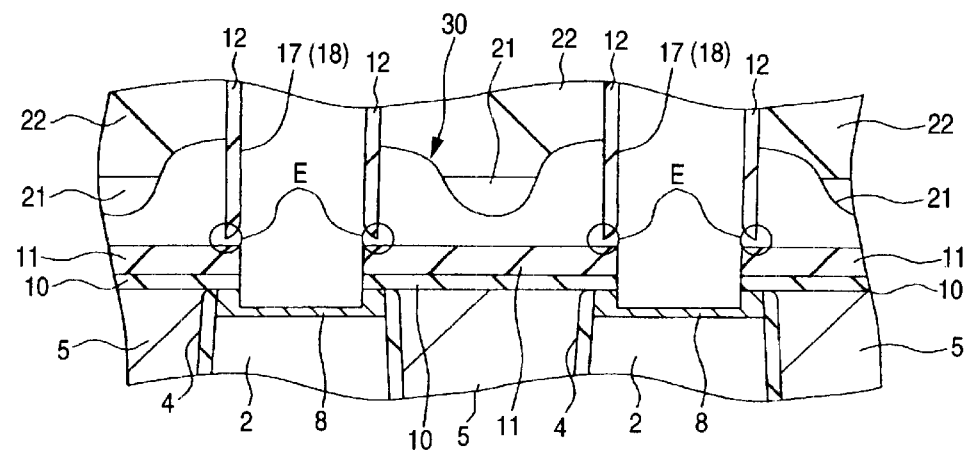
FIG. 42 depicts a section of a principal part during the process for fabricating the DRAM following FIG. 41.
Figure 43:
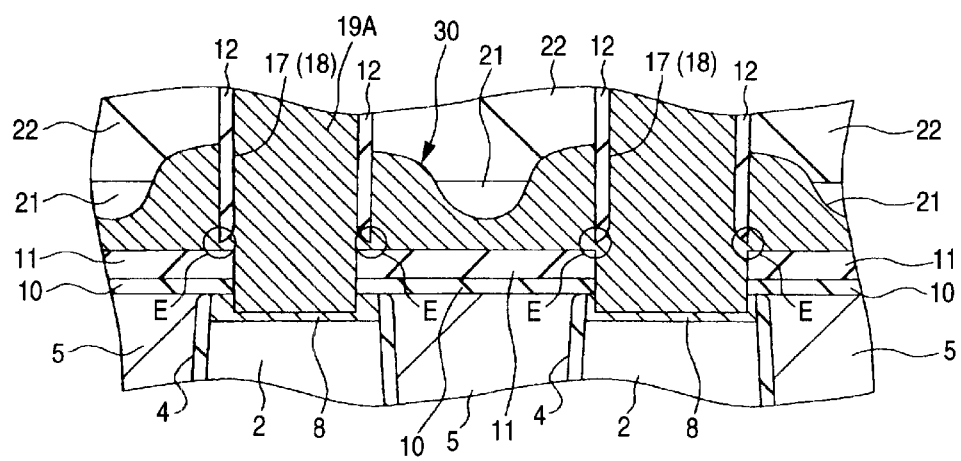
FIG. 43 depicts a section of a principal part during the process for fabricating the DRAM following FIG. 42.

Subsequently, when the insulating film 12 in the bottom of the hole parts 13 and 14 is removed by etchback along the process described with reference to FIGS. 28 to 31 under the conditions shown in FIGS. 38 and 39, as shown in FIGS. 40 and 41, the insulating film 21 is exposed from areas E in the sidewalls of the contact holes 17 and 18. When the semiconductor substrate 1 is cleaned under the conditions that the insulating film 21 is exposed from the areas E in the sidewalls of the contact holes 17 and 18, the insulating film 21 is wet etched by a cleaning solution used in the cleaning process and a cavity 30 is generated, as shown in FIG. 42. Furthermore, when the under part of the insulating film 12 is wet etched by the cleaning process, the exposed surface of the insulating film 21 in the areas E is increased and the cavity 30 might be further expanded. Then, when the n-type polycrystalline silicon film 19A for forming the plug 19 is buried in the contact holes 17 and 18 under the condition where the cavity 30 is formed as shown in FIG. 43, the n-type polycrystalline silicon film 19A also enters the cavity 30 to cause a problem that the adjacent contact holes 17 and 18 are short-circuited.

In the embodiment 1, as described with reference to FIG. 27, a portion of the insulating film 12 overlapped with the insulating film 11 is formed at the corners D in the bottom of the hole parts 13 and 14 as described with reference to FIG. 27. Thus, the silicon oxide film 21 can be prevented from being exposed in the sidewalls of the hole parts 13 and 14 when the insulating film 12 in the bottom of the hole parts 13 and 14 is removed by etching. That is, the silicon oxide film 21 can be prevented from being exposed in the sidewalls of the hole parts 13 and 14 and thus it can be prevented that the insulating film 21 is wet etched by the cleaning solution during the cleaning process of the semiconductor substrate 1 to form the cavity 30. Consequently, the adjacent contact holes 17 and 18 can be prevented from being short-circuited due to the buried n-type polycrystalline silicon film 19A when the n-type polycrystalline silicon film 19A is buried inside the contact holes 17 and 18.

Figure 44:
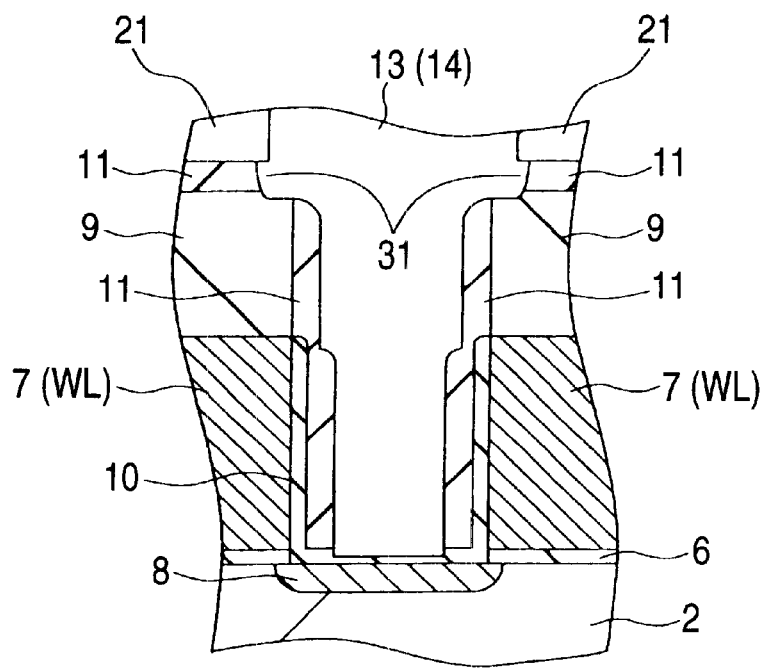
FIG. 44 depicts a section of a principal part illustrating a method for fabricating a DRAM, which is compared with the invention for study by the inventors.
Figure 45:
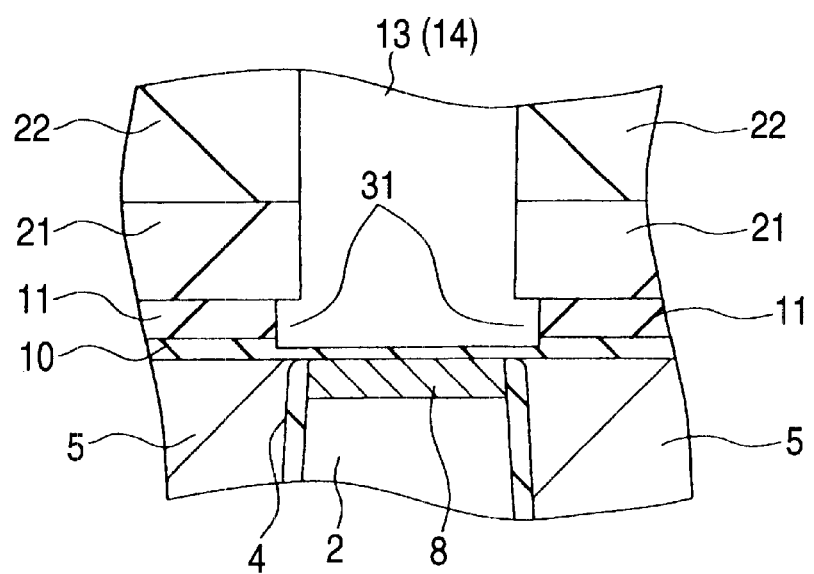
FIG. 45 depicts a section of a principal part illustrating a method for fabricating the DRAM, which is compared with the invention for study by the inventors.

Additionally, FIGS. 44 and 45 depict sections enlarging the vicinity of the hole part 13 (or the hole part 14) when an etching gas having a high etching selective ratio of the silicon nitride film to the silicon oxide film is used in etching the insulating film 11 in the bottom of the hole parts 13 and 14 described with reference to FIGS. 22 and 23. Furthermore, FIG. 44 depicts a section crossing the gate electrode 7 (word line WL) and FIG. 45 depicts a section parallel to the gate electrode 7 (word line WL).

According to the experiment conducted by the inventors, in the etching process of the insulating film 11 in the bottom of the hole parts 13 and 14 in the embodiment 1, it was found that the etching selective ratio and the etching anisotropy are in the trade-off relationship and etching becomes isotropic as the etching selective ratio is increased. That is, when an etching gas having a high etching selective ratio of the silicon nitride film to the silicon oxide film is used, it was found that side etching parts 31 are formed in the insulating film 11 due to isotropic etching as shown in FIGS. 44 and 45.

Figure 46:
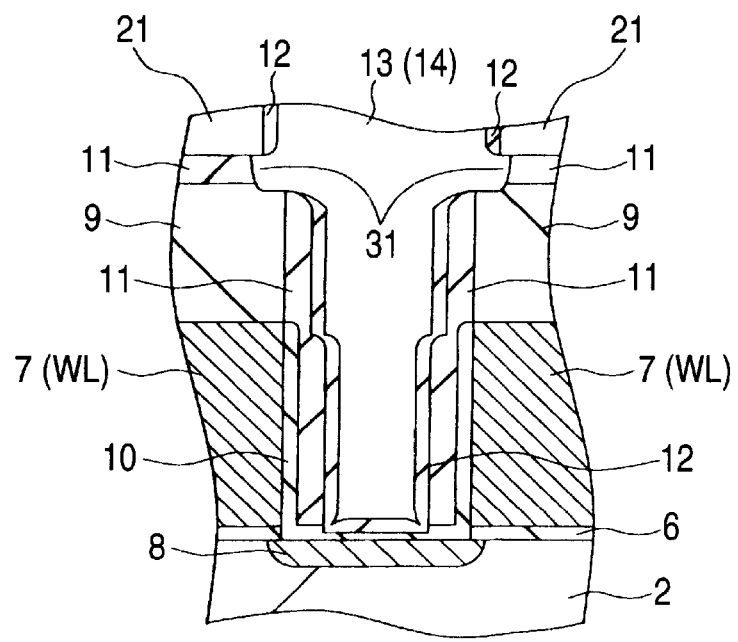
FIG. 46 depicts a section of a principal part during the process for fabricating the DRAM following FIG. 44.
Figure 47:
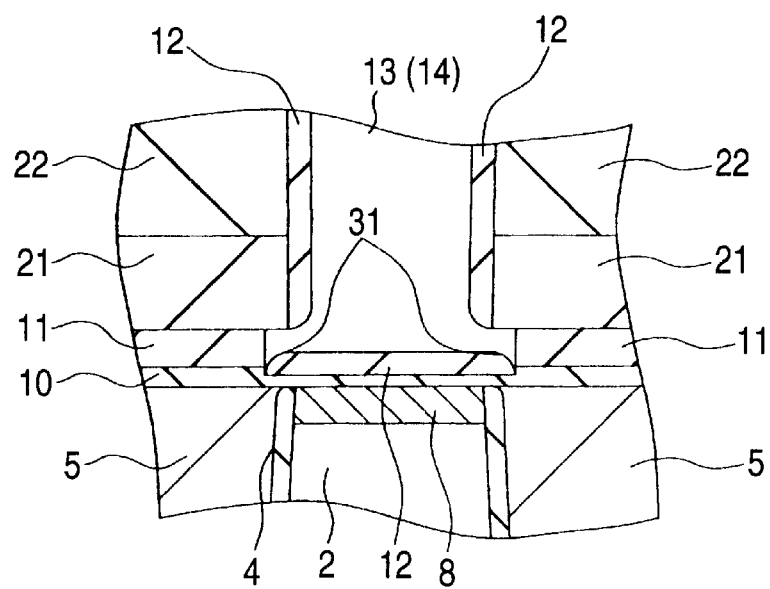
FIG. 47 depicts a section of a principal part during the process for fabricating the DRAM following FIG. 45.
Figure 48:
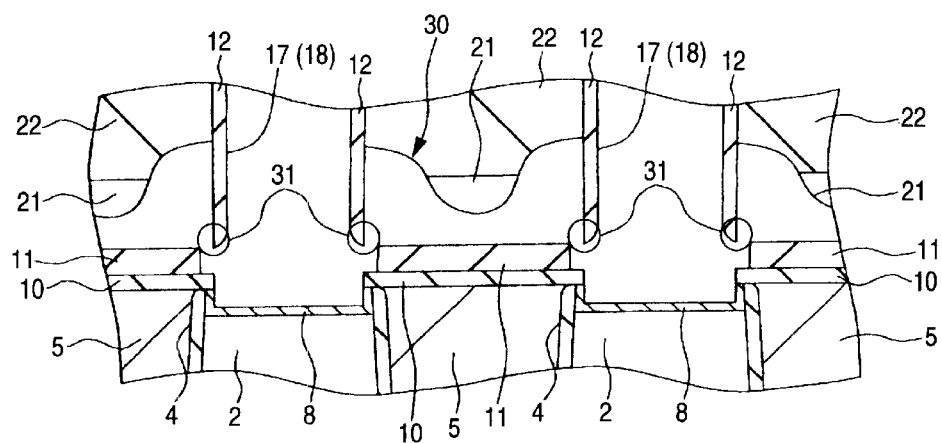
FIG. 48 depicts a section of a principal part during the process for fabricating the DRAM following FIG. 41.
Figure 49:
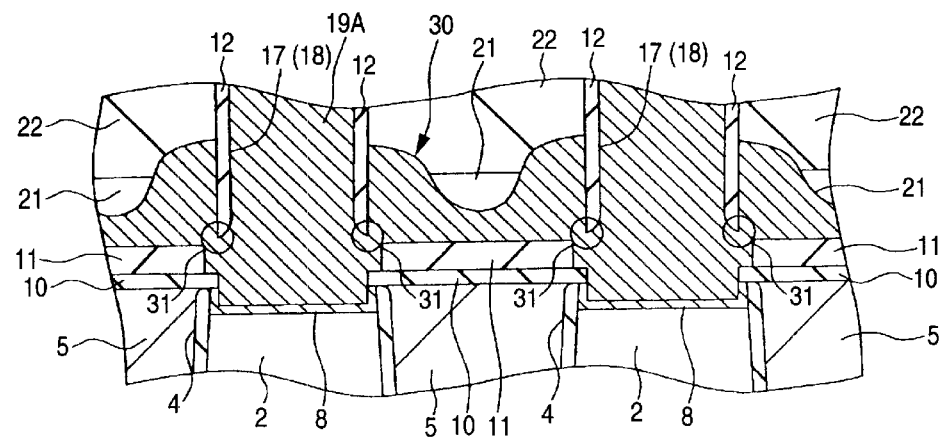
FIG. 49 depicts a section of a principal part during the process for fabricating the DRAM following FIG. 42.
Figure 50:
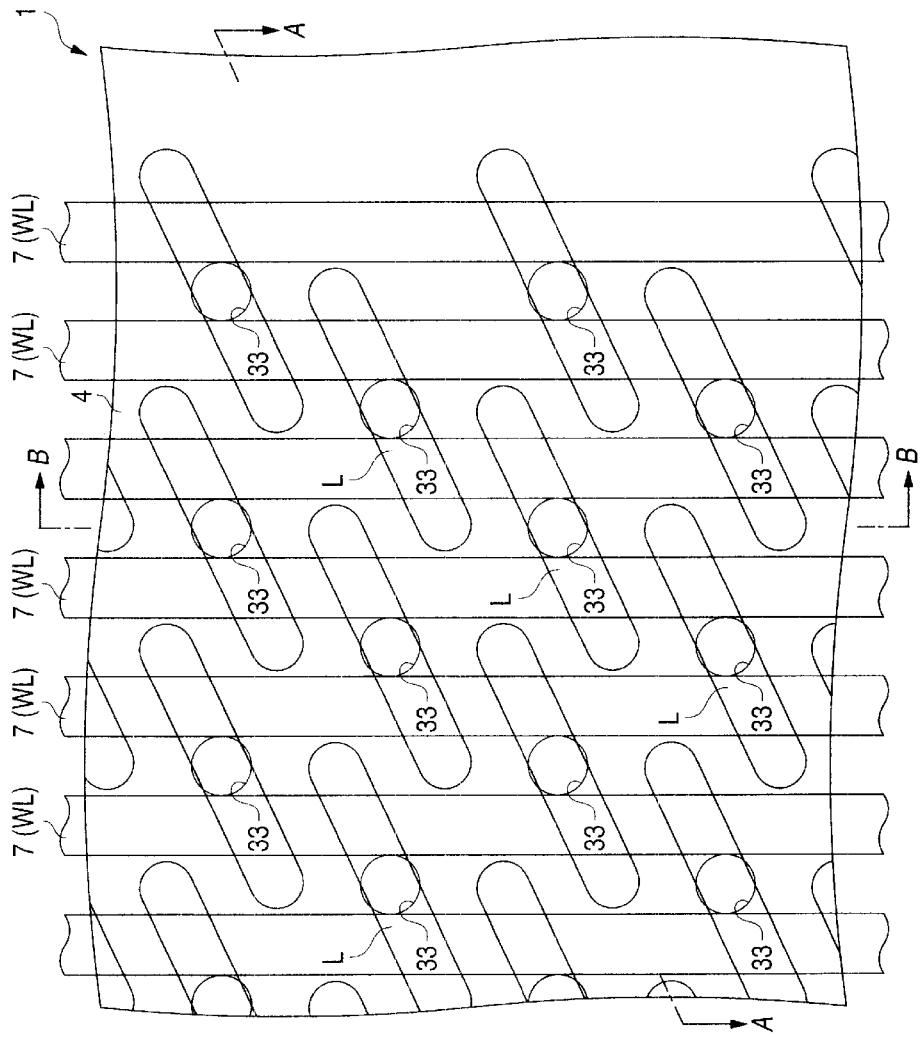
FIG. 50 depicts a plan view of a principal part illustrating the method for fabricating the DRAM of the embodiment of the invention.
Figure 51:
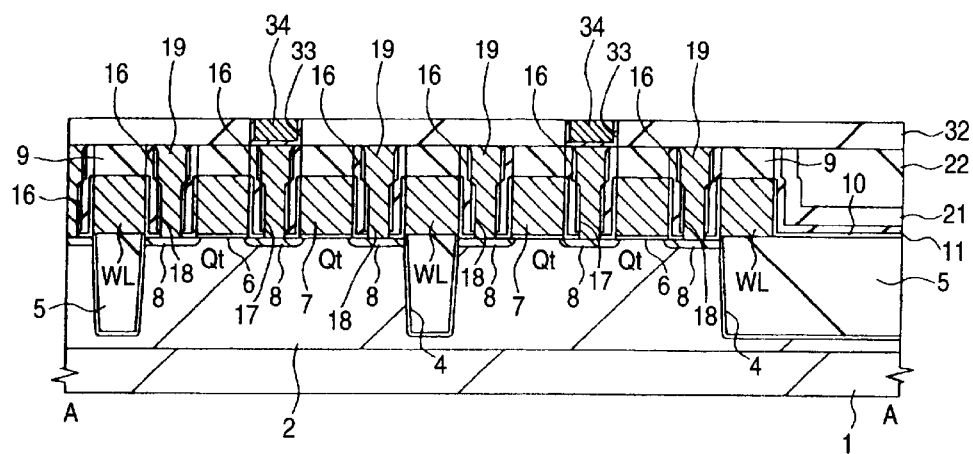
FIG. 51 depicts a section of a principal part during the process for fabricating the DRAM following FIG. 34.
Figure 52:
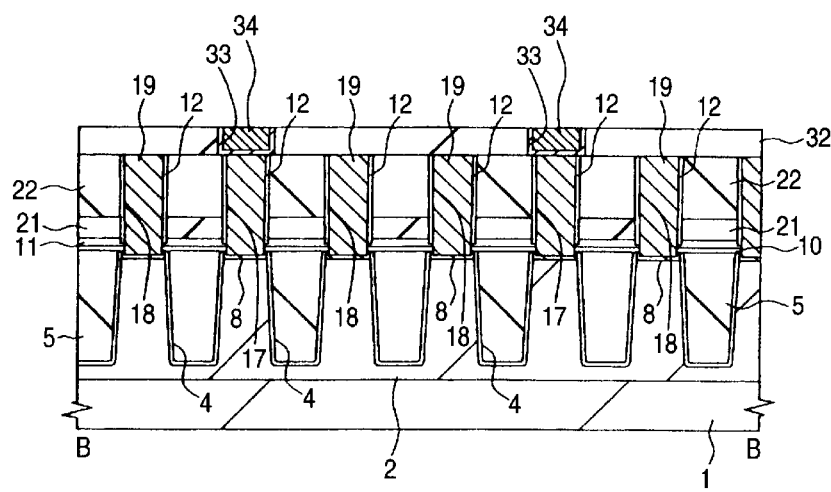
FIG. 52 depicts a section of a principal part during the process for fabricating the DRAM following FIG. 35.

When the insulating film 12 is formed along the process described with reference to FIGS. 24 to 27 under the conditions where the side etching parts 31 are formed as shown in FIGS. 46 and 47, the coverage of the insulating film 21 is dropped in the side etching parts 31 and the insulating film 21 might be exposed from the side etching parts 31. When the insulating film 12 in the bottom of the hole parts 13 and 14 is removed by etchback along the process described with reference to FIGS. 28 to 31 and subsequently the semiconductor substrate 1 is cleaned under the conditions as shown in FIGS. 48 and 49, the insulating film 21 is wet etched to form the cavity 30 due to the cleaning solution used in the cleaning process as similar to the case described with reference to FIGS. 40 and 41. Then, when the n-type polycrystalline silicon film 19A for forming the plug 19 is buried in the contact holes 17 and 18 under the conditions where the cavity 30 is formed, the n-type polycrystalline silicon film 19A also enters the cavity 30 to cause a problem that the adjacent contact holes 17 and 18 are short-circuited.

In the embodiment 1, as described with reference to FIGS. 22 and 23, the etching process of the insulating film 11 in the bottom of the hole parts 13 and 14 is performed by anisotropic etching and thus the side etching parts 31 can be prevented from being formed in the insulating film 11. That is, the side etching parts 31 can be prevented from being formed and thus the silicon oxide film 21 can be prevented from being exposed at the corners in the bottom of the hole parts 13 and 14 after the insulating film 12 is formed. Consequently, it can be prevented that the insulating film 21 is wet etched to form the cavity 30 during the cleaning process after removing the insulating film 12 in the bottom of the hole parts 13 and 14. Furthermore, the cavity 30 can be prevented from being formed and therefore the adjacent contact holes 17 and 18 can be prevented from being short-circuited due to the buried n-type polycrystalline silicon film 19A in burying the n-type polycrystalline silicon film 19A inside the contact holes 17 and 18.

Next, as shown in FIGS. 50 to 53, a silicon oxide film 32 having a film thickness of about 300 nm is deposited over the semiconductor substrate 1 by CVD, for example, and then a photoresist film (not shown) is used as a mask to dry etch the silicon oxide film 32 over the contact hole 17. Thereby, a through hole 33 for connecting the bit line BL, which will be formed later, to the contact hole 17 is formed. At this time, in the peripheral circuit region, not shown in the drawing, is also formed a contact hole for connecting the wiring in a first layer to the device. In addition, as a scheme for preventing the plug 19 buried inside the contact hole 17 from being cut in dry etching the silicon oxide film 32 over the contact hole 17, a silicon nitride film (not shown) having a film thickness of about 10 nm may be deposited under the silicon oxide film 32 to dry etch the silicon oxide film 31 using the silicon nitride film as an etching stopper and then the silicon nitride film may be etched.

Subsequently, a plug 34 is formed inside the through hole 33. In order to form the plug 34, a barrier metal comprised of TiN or the like is deposited over the silicon oxide film 3 by CVD, for example. Then, a W film is deposited over the barrier metal by CVD, for example, and thereby these films are buried inside the through hole 33. Then, these films outside the through hole 33 are removed by CMP. At this time, the plug 34 is also formed inside the contact hole in the peripheral circuit region, not shown.

Figure 53:
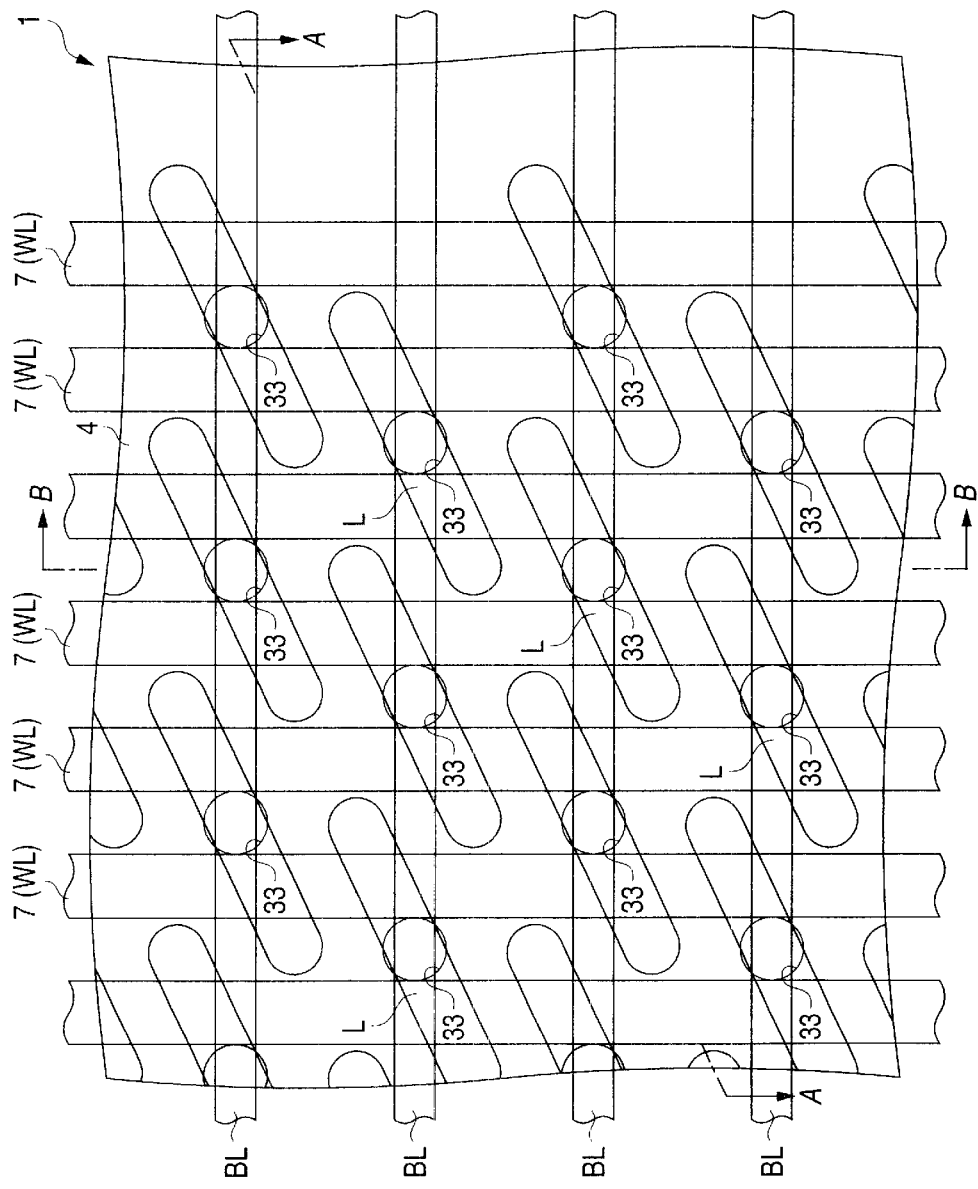
FIG. 53 depicts a plan view of a principal part during the process for fabricating the DRAM following FIG. 50.
Figure 54:
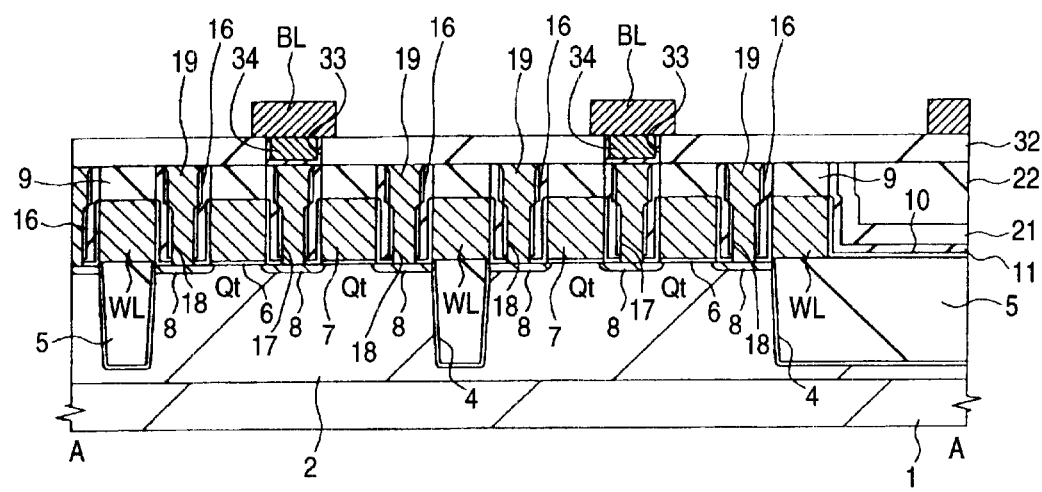
FIG. 54 depicts a section of a principal part during the process for fabricating the DRAM following FIG. 51.
Figure 55:
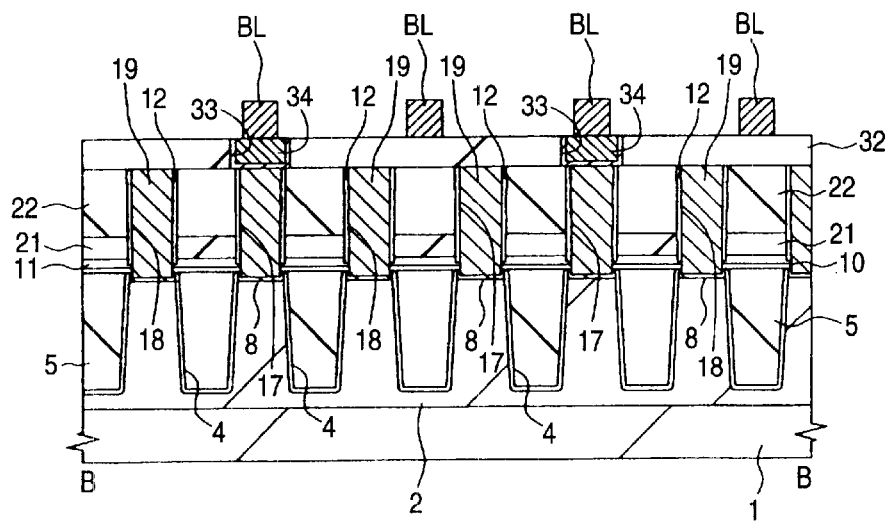
FIG. 55 depicts a section of a principal part during the process for fabricating the DRAM following FIG. 52.

Then, as shown in FIGS. 53 to 55, the bit line BL is formed over the silicon oxide film 32. In order to form the bit line BL, a TiN film (or a WN film) having a film thickness of about 10 nm and a W film having a film thickness of about 50 nm are deposited over the silicon oxide film 32 by spattering, for example, and then a photoresist film is used as a mask to dry etch these films. The bit line BL is electrically connected to one of the n-type semiconductor regions (source/drain regions) 8 of the memory cell selecting MISFET Qt through the plug 34 buried inside the through hole 33 and the plug 19 buried inside the contact hole 17.

Figure 56:
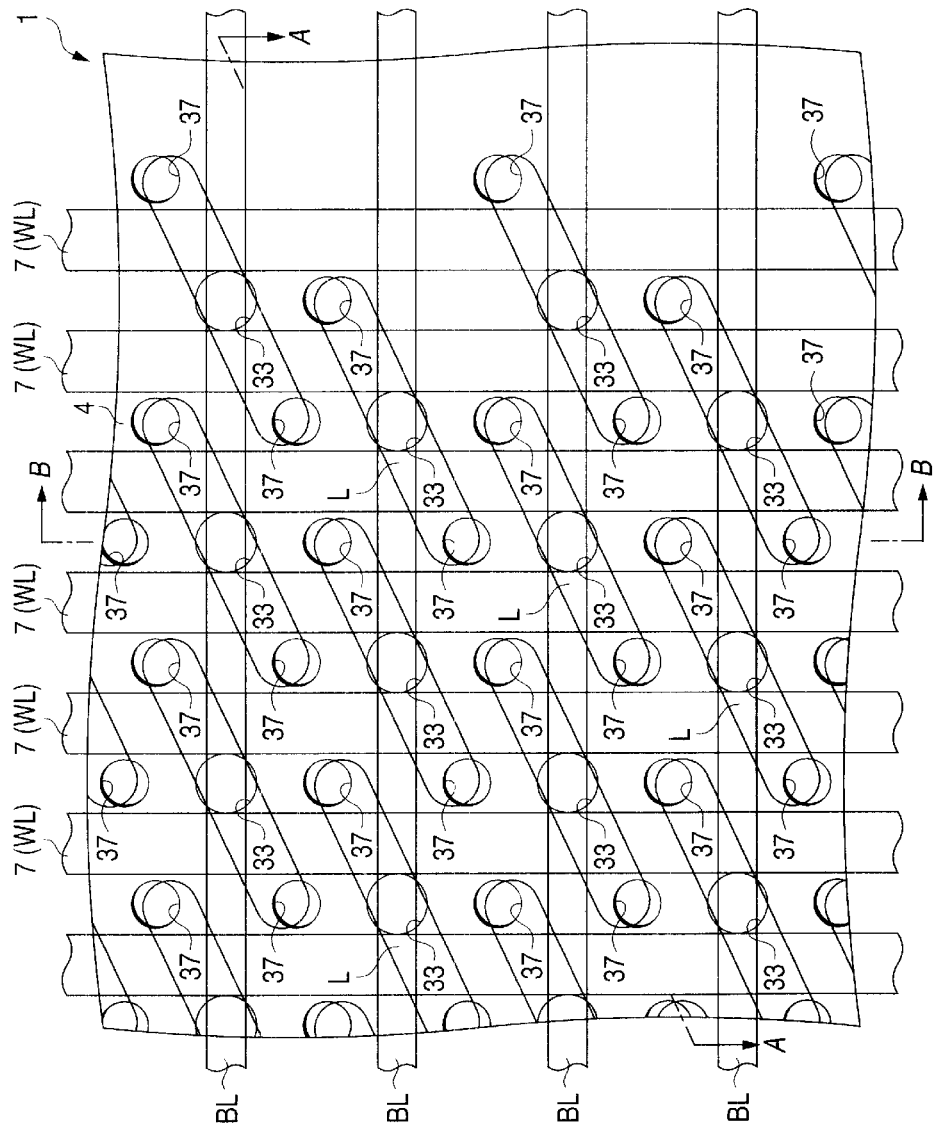
FIG. 56 depicts a plan view of a principal part during the process for fabricating the DRAM following FIG. 53.
Figure 57:
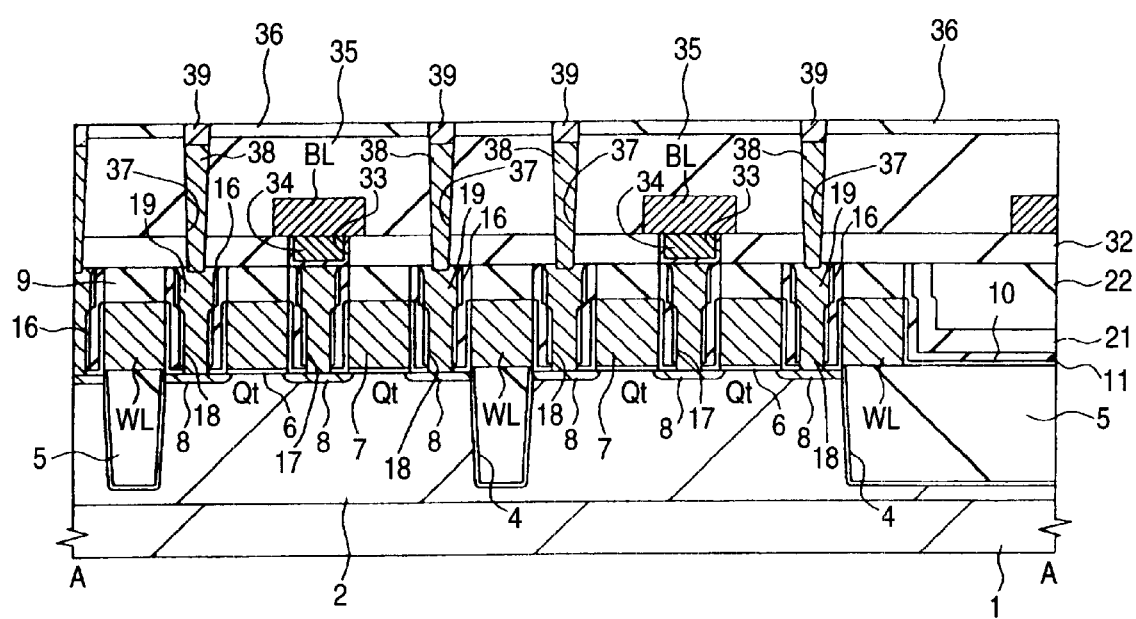
FIG. 57 depicts a section of a principal part during the process for fabricating the DRAM following FIG. 54.

Next, as shown in FIG. 56, a silicon oxide film 35 having a film thickness of about 300 nm is deposited over the bit lines BL by CVD, for example, and then the surface thereof is planarized by CMP. Subsequently, a silicon nitride film 36 having a film thickness of about 500 nm is deposited over the silicon oxide film 34 by CVD, for example, and then the silicon nitride film 36 and the silicon oxide films 35 and 32 are dry etched. Thereby, a through hole 37 is formed over the contact hole 18 buried with the plug 19.

Subsequently, a plug 38 is formed inside the through hole 37 and a barrier metal film 39 is formed over the surface of the plug 38. In order to form the plug 38 and the barrier metal film 39, an n-type polycrystalline silicon film doped with P is deposited over the silicon nitride film 36 by CVD, for example. Thereby, the n-type polycrystalline silicon film is buried inside the through hole 37 and then the n-type polycrystalline silicon film outside the through hole 37 is removed by dry etching. At this time, the n-type polycrystalline silicon film inside the through hole 37 is over etched and the surface of the plug 38 is recessed below the surface of the silicon nitride film 36. Thereby, a space for burying the barrier metal film 39 is secured in the upper part of the plug 38. Then, a TaN film is deposited over the silicon nitride film 36 by spattering, for example. Thereby, the TaN (tantalum nitride) film is buried in the upper part of the plug 38 inside the through hole 37 and then the TaN film outside the through hole 37 is removed by CMP.

The barrier metal film 39 interposed between the under electrode of the information storage capacitive element C, formed over the through hole 37, and the plug 38 is formed to suppress the generation of an undesirable reaction in the interface between an Ru film configuring the under electrode and the polycrystalline silicon film configuring the plug 38 in high temperature heat treatment that is performed in the process for forming the capacitive insulating film of the information storage capacitive element C in the later process.

After that, the information storage capacitive element C configured of the under electrode 42, the capacitive insulating film 43 and the upper electrode 44 is formed over the through hole 37. The under electrode 42 of the information storage capacitive element C is electrically connected to one of the n-type semiconductor regions (source/drain regions) 8 of the memory cell selecting MISFET Qt through the plug 38 buried inside the through hole 37 and the plug 19 buried inside the contact hole 18.

Figure 58:
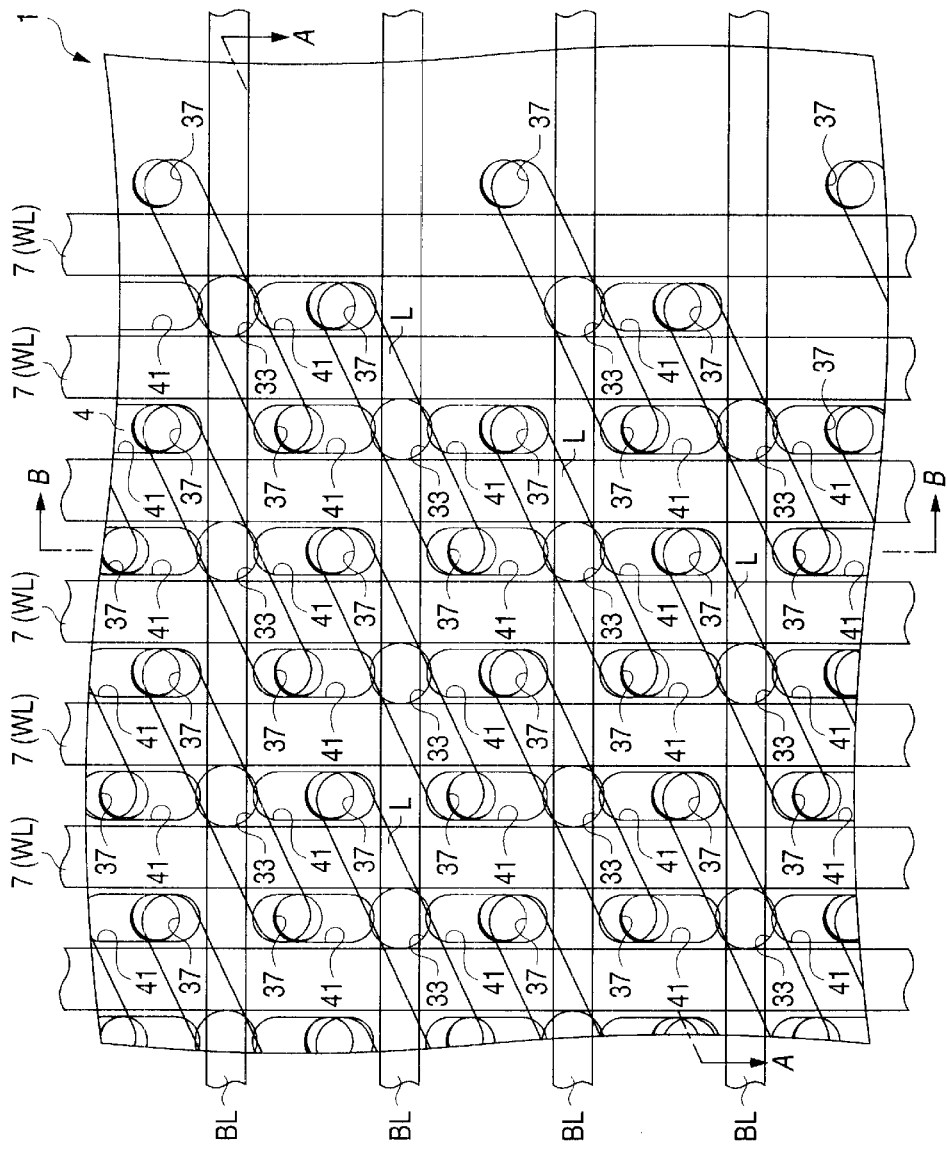
FIG. 58 depicts a plan view of a principal part during the process for fabricating the DRAM following FIG. 56.
Figure 59:
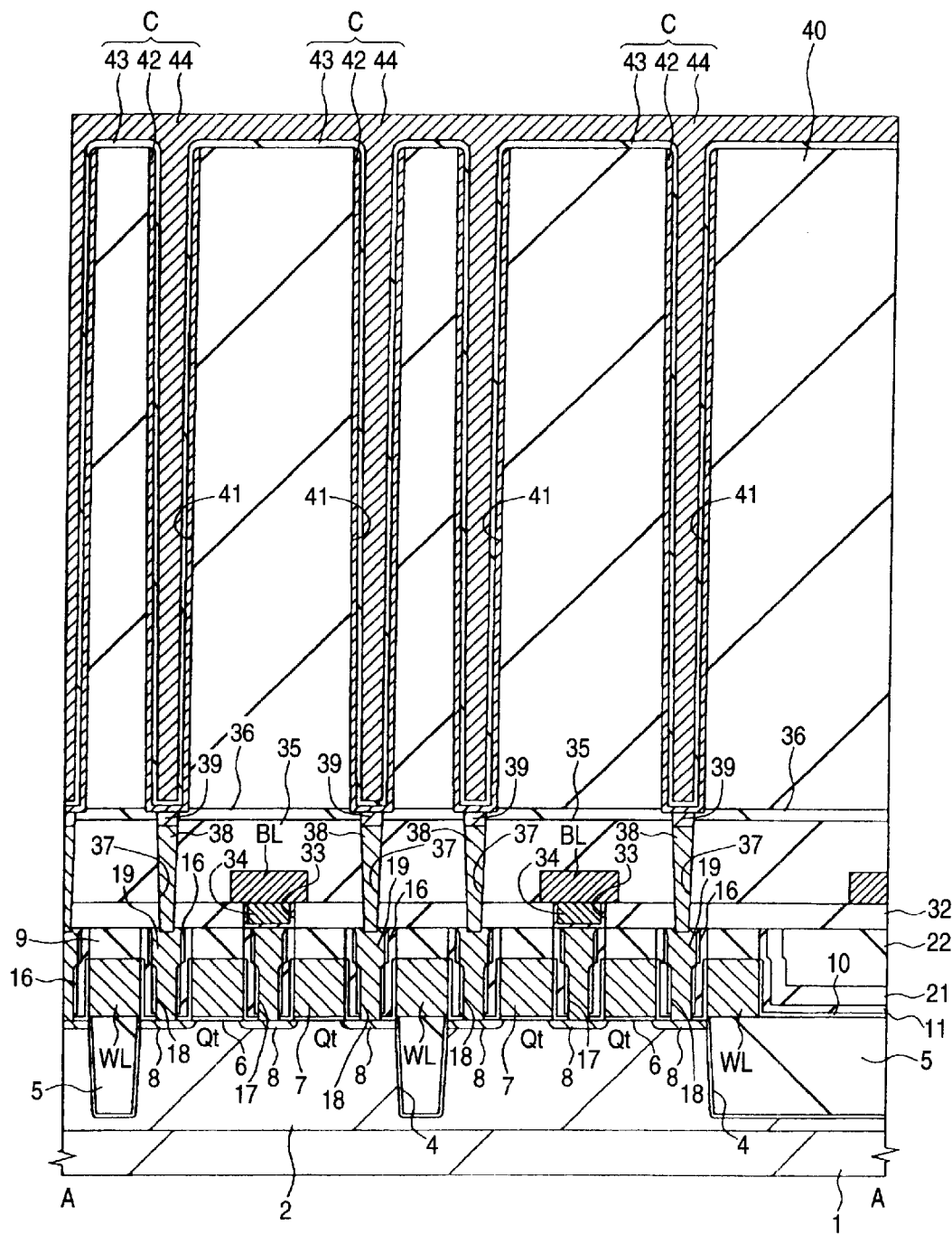
FIG. 59 depicts a section of a principal part during the process for fabricating the DRAM following FIG. 57.

In order to form the information storage capacitive element C, as shown in FIGS. 58 and 59, a thick silicon oxide film 40 having a film thickness of about 1 μm is deposited over the silicon nitride film 36 by CVD, for example, and subsequently a photoresist film is used as a mask to dry etch the silicon oxide film 40. Thereby, a trench 41 is formed over the through hole 37. The silicon oxide film 40 is etched by using the silicon nitride film 36 as an etching stopper so as not to cut the underlying silicon oxide film 35.

Then, after the photoresist film is removed, an Ru film having a film thickness of about 70 to 80 nm is deposited over the silicon oxide film 40 including the inside of the trench 41 by CVD, for example. Subsequently, a photoresist film is buried inside the trench 41 to prevent the Ru film inside the trench 41 from being removed. Then, the Ru film outside the trench 41 not covered with the photoresist film is removed by dry etching and the photoresist film buried inside the trench 41 is removed by ashing. Thereby, the under electrode 42 comprised of the Ru film is formed over the sidewalls and bottom of the trench 41.

Next, the capacitive insulating film 43 is formed over the silicon oxide film 40 including the inside of the trench 41 formed with the under electrode 42. The capacitive insulating film 43 is comprised of a BST film having a film thickness of about 20 nm deposited by CVD, for example. The capacitive insulating film 43 may be comprised of a high dielectric (ferroelectric) made of perovskite metallic oxides such as $Ta_2O_5$, $BaTiO_3$ (barium titanate), $PbTiO_3$ (lead titanate), PZT, PLT and PLZT as well as the BST film.

Subsequently, the upper electrode 44 is formed over the capacitive insulating film 43. The upper electrode 44 is comprised of an Ru film having a film thickness of about 200 nm deposited by CVD or spattering, for example.

By the processes until here, the information storage capacitive element C configured of the under electrode 42 comprised of the Ru film, the capacitive insulating film 43 comprised of the BST film and the upper electrode 44 comprised of the Ru film is completed.

After that, Al wiring having about two layers sandwiching the interlayer insulating film is formed over the information storage capacitive element C and a passivation film is formed over the topmost Al wiring. However, the drawings therefor are omitted. In this manner, the DRAM of the embodiment 1 shown in FIG. 2 is fabricated.

Embodiment 2

A method for fabricating a DRAM of embodiment 2 is that the insulating film 10 is used as an etching stopper to etch the insulating film 11 in etching the insulating film 11 in the bottom of the hole parts 13 and 14 described with reference to FIGS. 22 and 23 in the embodiment 1. Other processes and members are the same as those in the embodiment 1, omitting the description of the same processes and members.

Next, the method for fabricating the DRAM of the embodiment 2 will be described in accordance with FIGS. 60 to 65.

The method for fabricating the DRAM of the embodiment 2 is the same until the processes described with reference to FIGS. 3 to 21 in the embodiment 1.

Figure 60:
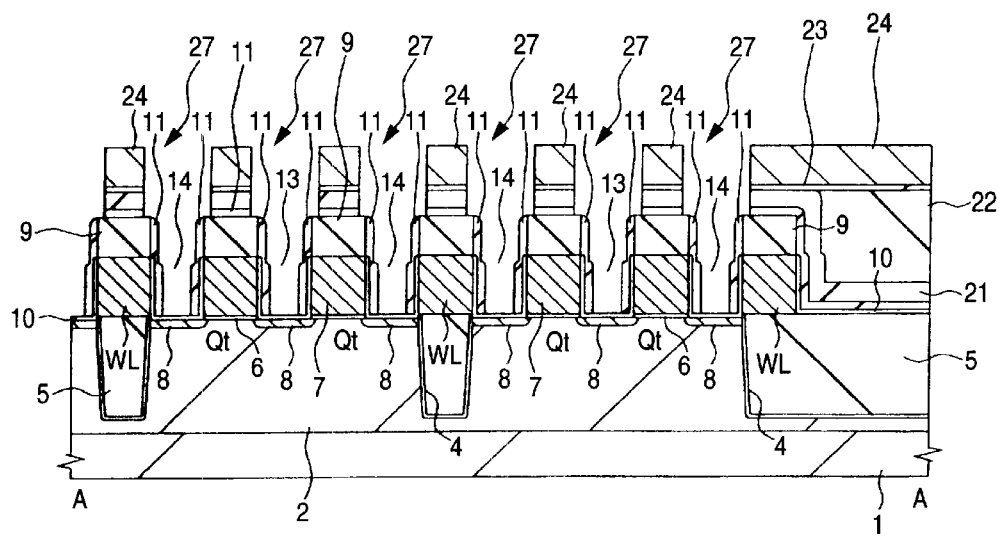
FIG. 60 depicts a section of a principal part illustrating a method for fabricating a DRAM of one embodiment of the invention.
Figure 61:
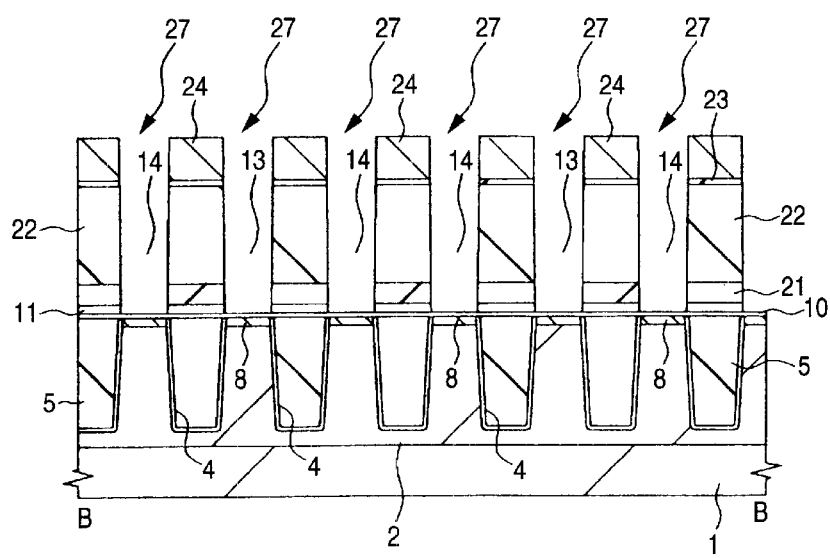
FIG. 61 depicts a section of a principal part illustrating the method for fabricating the DRAM of one embodiment of the invention.

After that, as shown in FIGS. 60 and 61, the insulating film 11 in the bottom of the hole parts 13 and 14 is removed by anisotropic etching (dry etching). At this time, a mixed gas of $CHF_3$ and $O_2$ is used as an etching gas to increase the etching selective ratio of the insulating film 11 comprised of the silicon nitride film with respect to the insulating film 10 comprised of the silicon oxide film. Consequently, the insulating film 11 in the bottom of the hole parts 13 and 14 can be etched, using the insulating film 10 as an etching stopper.

As described above, the insulating film 11 in the bottom of the hole parts 13 and 14 can be etched using the insulating film 10 as an etching stopper. Thereby, the semiconductor substrate 1 underlying the bottom of the hole parts 13 and 14 can be prevented from being cut due to over etching, as similar to the case of the embodiment 1. Additionally, the semiconductor substrate 1 can be prevented from being cut and thereby a damaged layer due to etching can be prevented from being formed in the semiconductor substrate 1. Thus, a process for removing the damaged layer can be omitted.

Figure 62:
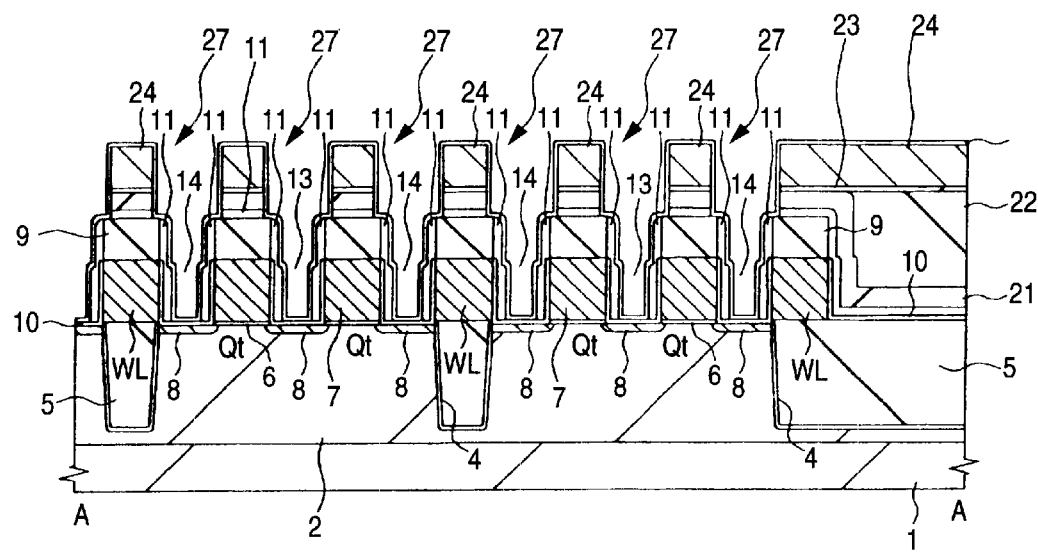
FIG. 62 depicts a section of a principal part during a process for fabricating the DRAM following FIG. 60.
Figure 63:
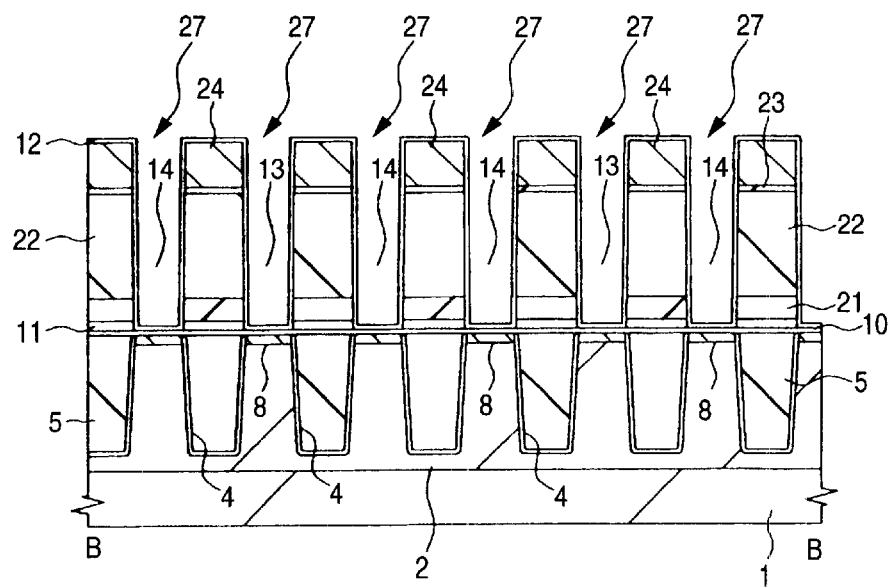
FIG. 63 depicts a section of a principal part during the process for fabricating the DRAM following FIG. 61.
Figure 64:
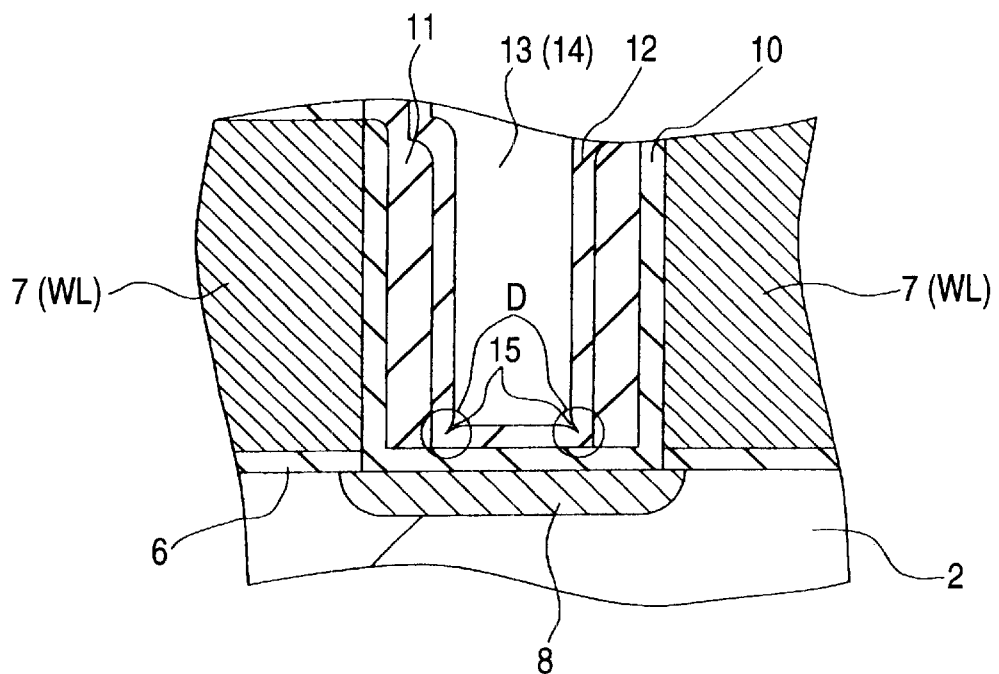
FIG. 64 depicts a section enlarging the vicinity of the hole part shown in FIG. 62.
Figure 65:
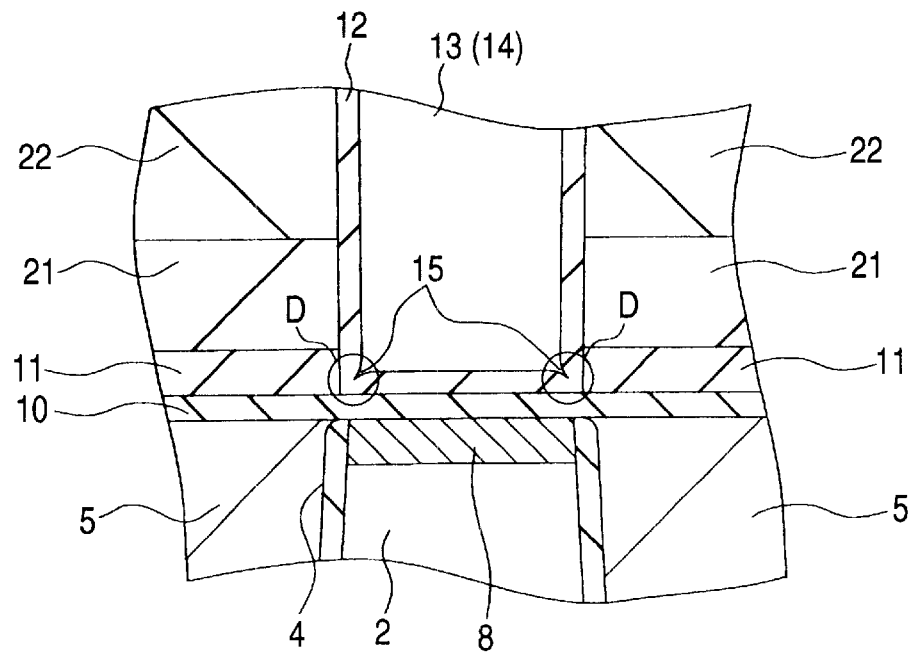
FIG. 65 depicts a section enlarging the vicinity of the hole part shown in FIG. 63.
Figure 66:
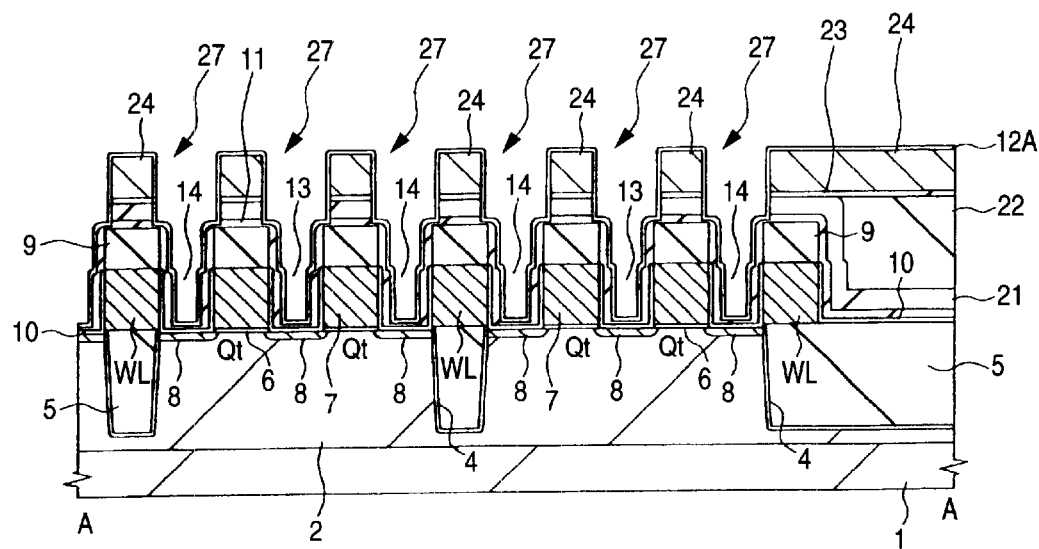
FIG. 66 depicts a section of a principal part illustrating a method for fabricating a DRAM of one embodiment of the invention.
Figure 67:
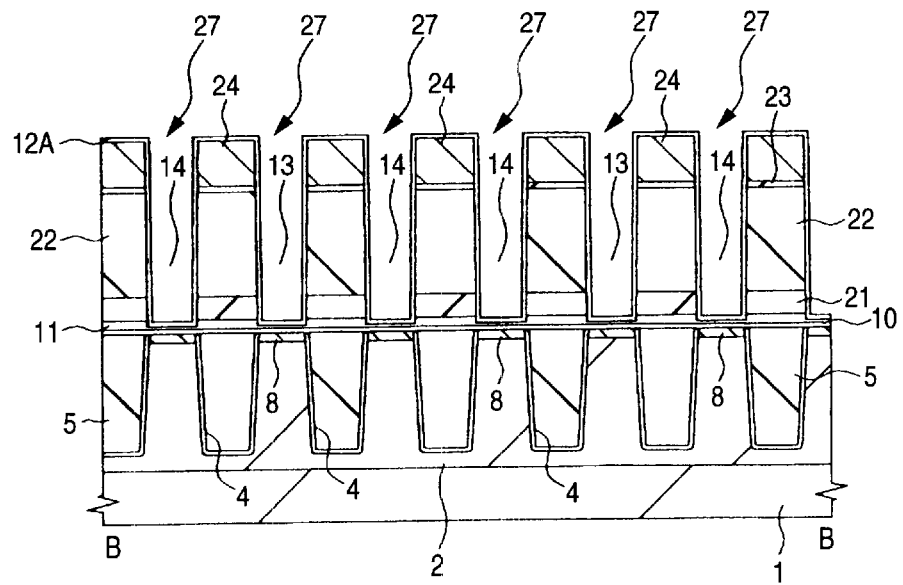
FIG. 67 depicts a section of a principal part illustrating the method for fabricating the DRAM of the embodiment of the invention.

FIGS. 62 and 63 depict sections during the process for fabricating the DRAM following FIGS. 60 and 61, respectively. FIGS. 64 and 65 depict sections enlarging the vicinity of the hole part 13 (or the hole part 14) corresponding to FIGS. 62 and 63, respectively.

Then, as shown in FIGS. 62 and 65, a silicon nitride film having a film thickness thinner than the insulating film 11 and not fully burying the space between the gate electrodes 7 (word lines WL) is deposited over the semiconductor substrate 1 including the hole parts 13 and 14 to form the insulating film 12, as similar to the process described with reference to FIGS. 24 to 27 in the embodiment 1.

At this time, as shown in FIGS. 64 and 65, the coverage of the insulating film 12 is deteriorated at the corners D in the bottom of the hole parts 13 and 14 and restrictions 15 might be generated, as similar to the case described with reference to FIGS. 26 and 27 in the embodiment 1. However, as described with reference to FIGS. 60 and 61, the insulating film 11 in the bottom of the hole parts 13 and 14 is removed using the insulating film 10 as an etching stopper. Thereby, a portion of the insulating film 12 overlapped with the insulating film 11 is formed at the corners D in the bottom of the hole parts 13 and 14. Thus, the silicon oxide film 21 can be prevented from being exposed in the sidewalls of the hole parts 13 and 14 in etching the insulating film 12 in the bottom of the hole parts 13 and 14 in the later process.

Furthermore, as similar to the case of the embodiment 1, the semiconductor substrate 1 is cleaned in the process after removing the insulating films 12 and 10 in the bottom of the hole parts 13 and 14. However, in the method for fabricating the DRAM in the embodiment 2, the silicon oxide film 21 can be prevented from being exposed in the sidewalls of the hole parts 13 and 14. Therefore, the insulating film 21 can be prevented from being wet etched by the cleaning solution used in the cleaning process.

After that, the DRAM of the embodiment 2 is fabricated by the same processes as those described with reference to FIGS. 28 to 35 and 50 to 59 in the embodiment 1.

Embodiment 3

A method for fabricating a DRAM of embodiment 3 is that the insulating film 12, described with reference to FIGS. 24 to 27 in the embodiment 1 and FIGS. 62 to 65 in the embodiment 2, is comprised of a silicon oxide film. Other processes and members are the same as those in the embodiment 1 or embodiment 1, omitting the description of the same processes and members.

Next, the method for fabricating the DRAM of the embodiment 3 will be described in accordance with FIGS. 66 to 73.

The method for fabricating the DRAM of the embodiment 3 is the same until the processes described with reference to FIGS. 3 to 23 in the embodiment 1 or the processes described with reference to FIGS. 60 to 65 in the embodiment 2. However, a deposited amount of the silicon nitride film configuring the insulating film 11 (third insulating film) is set about 10 nm.

Figure 68:
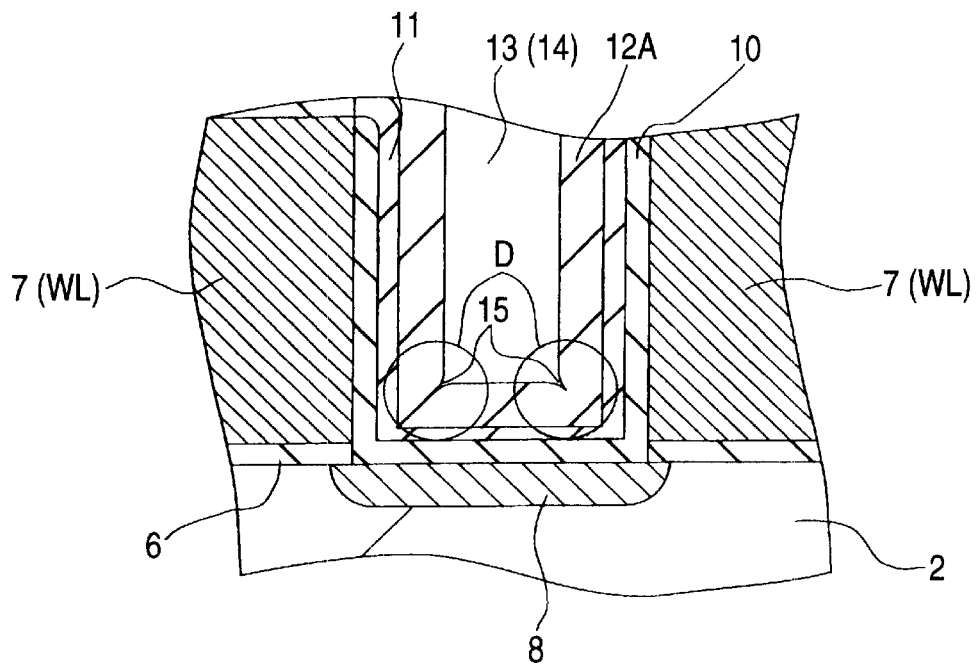
FIG. 68 depicts a section enlarging the vicinity of the hole part shown in FIG. 66.
Figure 69:
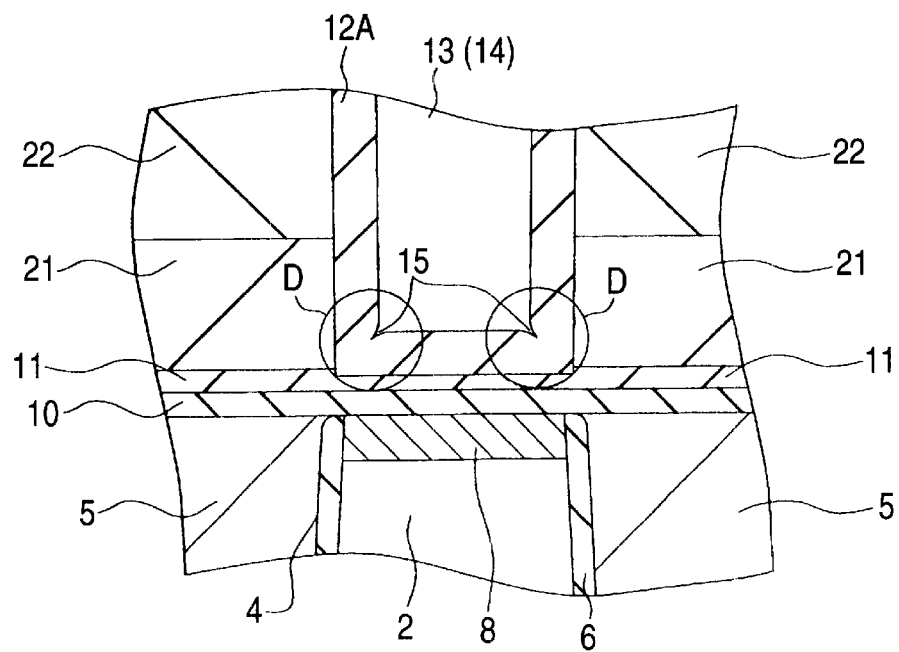
FIG. 69 depicts a section enlarging the vicinity of the hole part shown in FIG. 67.
Figure 70:
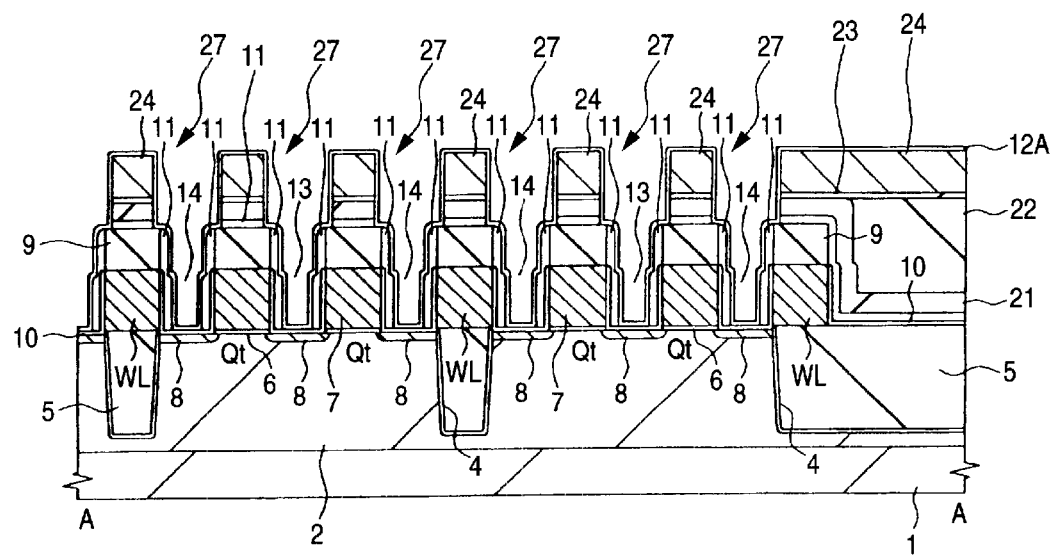
FIG. 70 depicts a section of a principal part illustrating the method for fabricating the DRAM of the embodiment of the invention.
Figure 71:
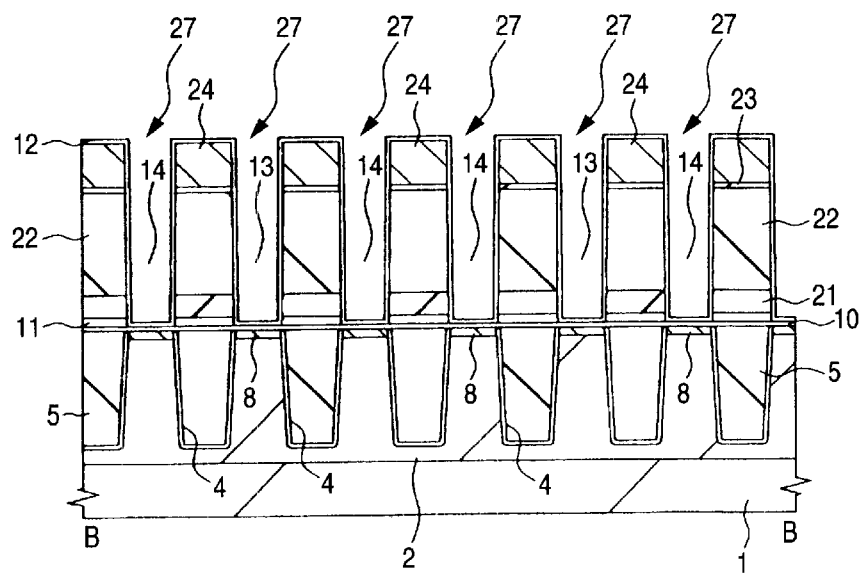
FIG. 71 depicts a section of a principal part illustrating the method for fabricating the DRAM of the embodiment of the invention.
Figure 72:
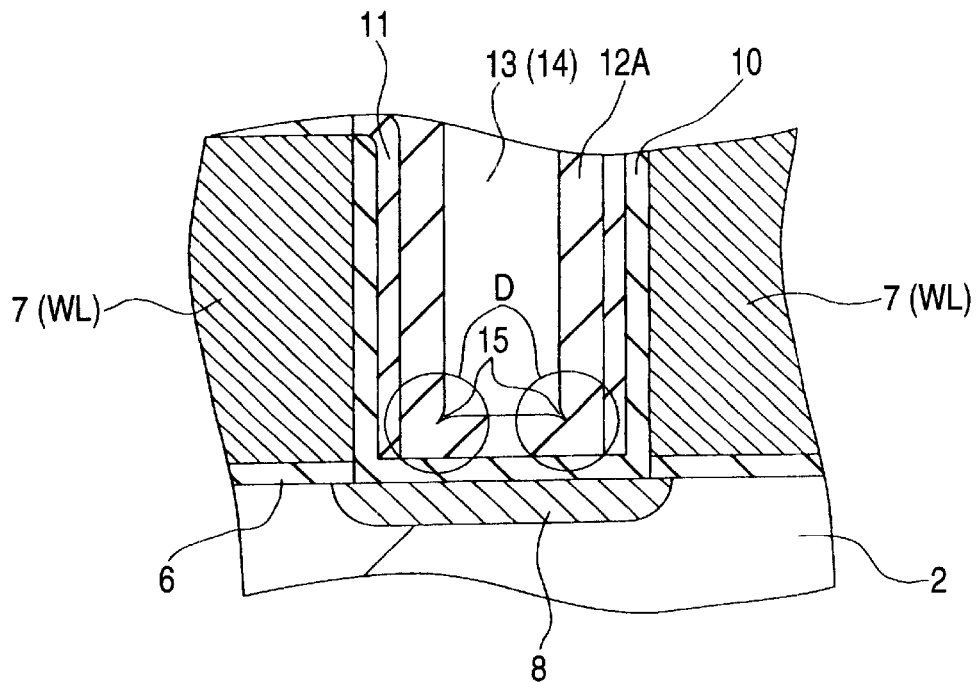
FIG. 72 depicts a section enlarging the vicinity of the hole part shown in FIG. 70.
Figure 73:
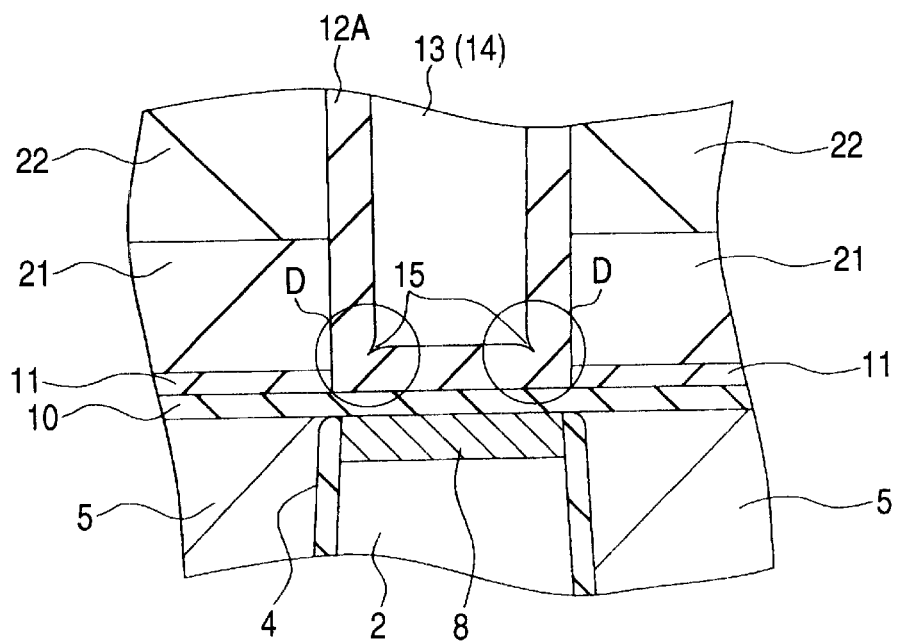
FIG. 73 depicts a section enlarging the vicinity of the hole part shown in FIG. 71.

Then, as shown in FIGS. 66 to 69 or 70 to 73, a silicon oxide film having a film thickness not completely burying the space between the gate electrodes 7 (word lines WL) is deposited over the semiconductor substrate 1 including the inside of the hole parts 13 and 14 to form an insulating film 12A (fifth insulating film). In the embodiment 3, the insulating film 12A is formed by CVD and the film thickness thereof can be formed to be about 30 nm, for example. The silicon oxide film configuring the insulating film 12A tends to be wet etched as compared with the silicon nitride film configuring the insulating film 12 in the embodiments 1 and 2. Thus, the insulating film 12A is formed to be thicker than the case of the insulating film (silicon nitride film) 12. The insulating film 12A is formed by CVD and thereby the insulating film 12A can hardly be wet etched in the later cleaning process. Additionally, FIGS. 68 and 69 depict sections enlarging the vicinity of the hole part 13 (or the hole part 14) corresponding to FIGS. 66 and 67, respectively. FIGS. 72 and 73 depict sections enlarging the vicinity of the hole part 13 (or the hole part 14) corresponding to FIGS. 70 and 71, respectively. In addition, FIGS. 66 to 69 show the case where the insulating film 11 in the bottom of the hole part 13 (or the hole part 14) was not completely removed by etching, partially left in the previous process, whereas FIGS. 70 to 73 show the case where the insulating film 11 in the bottom of the hole part 13 (or the hole part 14) was completely removed by etching in the previous process.

At this time, as shown in FIGS. 68, 69, 72 and 73, the coverage of the insulating film 12A is deteriorated at the corners D in the bottom of the hole parts 13 and 14 and restrictions 15 might be generated, as similar to the case described with reference to FIGS. 26 and 27 in the embodiment 1 and FIGS. 64 and 65 in the embodiment 2. However, as similar to the case of the embodiments 1 and 2, a portion of the insulating film 12A overlapped with the insulating film 11 is formed at the corners D in the bottom of the hole parts 13 and 14. Thus, the silicon oxide film 21 can be prevented from being exposed in the sidewalls of the hole parts 13 and 14 in removing the insulating film 12A in bottom of the hole parts 13 and 14 by etching in the later process.

Furthermore, the insulating films 12A, 11 (the case shown in FIGS. 70 to 73 is not considered) and 10 in the bottom of the hole parts 13 and 14 are removed and the semiconductor substrate 1 is cleaned as similar to the case of the embodiments 1 and 2. However, in the method for fabricating the DRAM in the embodiment 3 as described above, the silicon oxide film 21 can be prevented from being exposed in the sidewalls of the hole parts 13 and 14 and thus it can be prevented that the insulating film 21 is wet etched by the cleaning solution used in the cleaning process.

Meanwhile, the silicon oxide film configuring the insulating film 12A has a dielectric constant lower than that of the silicon nitride film configuring the insulating film 12 in the embodiments 1 and 2. Therefore, the wiring capacitance of the plug 19 formed inside the contact holes 17 and 18 (the hole parts 13 and 14) in the later process can be reduced. Here, wiring delay is proportional to the product of wiring resistance and wiring capacitance. Thus, the wiring capacitance of the plug 19 can be reduced in the embodiment 3, and thereby the wiring delay in the plug 19 can be improved more than the case of the embodiments 1 and 2.

After that, the DRAM of the embodiment 3 is fabricated by the same processes as those described with reference to FIGS. 28 to 35 and 50 to 59.

Embodiment 4

A method for fabricating a DRAM of the embodiment 4 is that the insulating film 11 described with reference to FIGS. 22 and 23 in the embodiment 1 is etched in which the section of the hole parts 13 and 14 is formed into a forward tapered shape, smaller toward the bottom. Other processes and members are the same as those in the embodiment 1, omitting the description of the same processes and members.

Next, the method for fabricating the DRAM of the embodiment 4 will be described with reference to FIGS. 74 to 76.

The method for fabricating the DRAM of the embodiment 4 is the same until the processes described with reference to FIGS. 3 to 21 in the embodiment 1.

Figure 74:
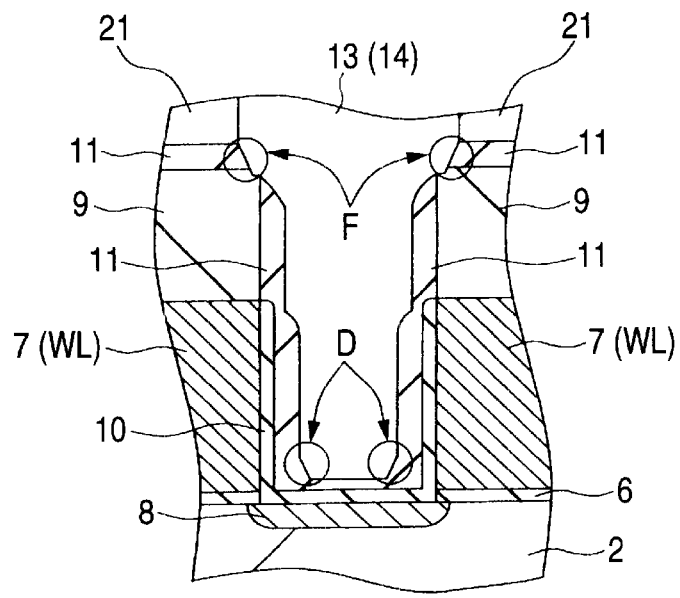
FIG. 74 depicts a section of a principal part illustrating a method for fabricating a DRAM of one embodiment of the invention.
Figure 75:
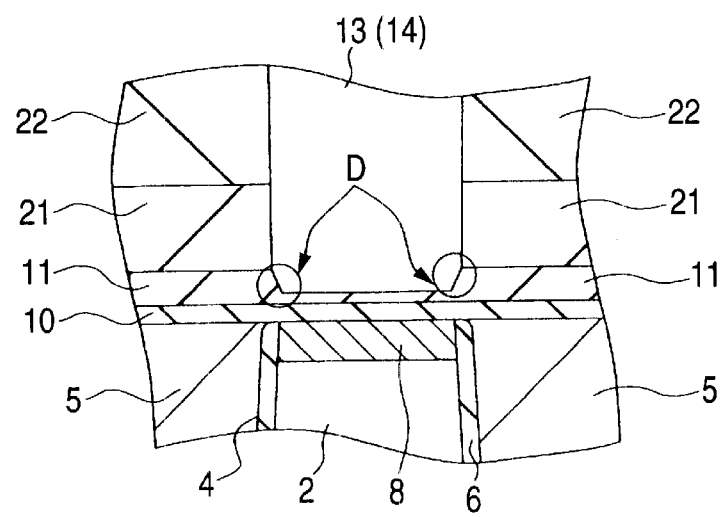
FIG. 75 depicts a section of a principal part illustrating the method for fabricating the DRAM of the embodiment of the invention.

Then, as shown in FIGS. 74 and 75, the insulating film 11 formed in the bottom of the hole parts 13 and 14 and at corners F in the upper face of the cap insulating film 9 is etched by anisotropic etching (dry etching) using a mixed gas of $CHF_3$ and $O_2$ as an etching gas. At this time, the amount of the insulating film 11 etched is set equal to or above the film thickness of the insulating film 12 formed in the subsequent process and equal to or under the film thickness of the insulating film 11. In addition, FIG. 74 depicts a section enlarging the vicinity of the hole part 13 (or the hole part 14) corresponding to FIG. 22 used in the embodiment 1. FIG. 75 depicts a section enlarging the vicinity of the hole part 13 (or the hole part 14) corresponding to FIG. 23 used in the embodiment 1.

In the etching process of the insulating film 11 described above, a ratio of $CHF_3$ is increased with respect to $O_2$ in a composition ratio of a mixed gas of $CHF_3$ and $O_2$, for example. The embodiment 4 can exemplify approximately $CHF_3/O_2=3$, for instance. Thereby, the insulating film 11 can be etched so as to form the section of the hole parts 13 and 14 into a forward tapered shape smaller toward the bottom at the corners F in the upper face of the cap insulating film 9 shown in FIG. 76 and at the corners D in the bottom of the hole parts 13 and 14 shown in FIG. 77.

Figure 76:
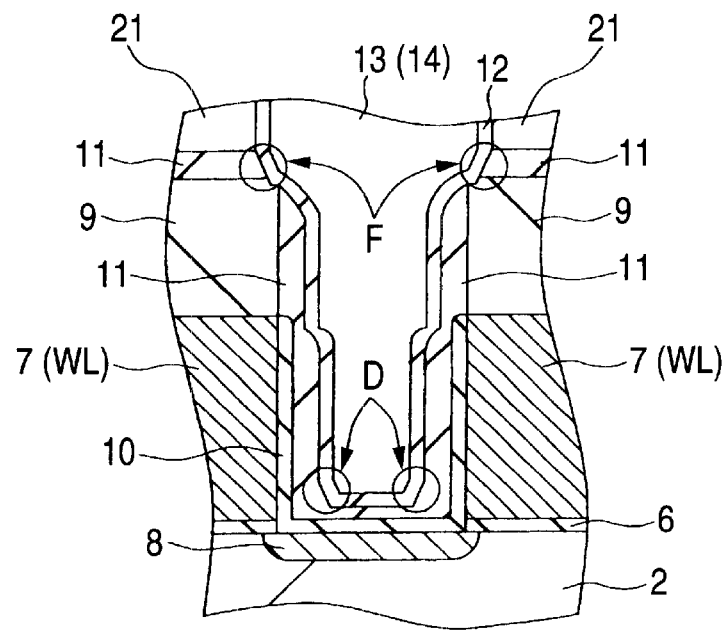
FIG. 76 depicts a section of a principal part during a process for fabricating the DRAM following FIG. 74.
Figure 77:
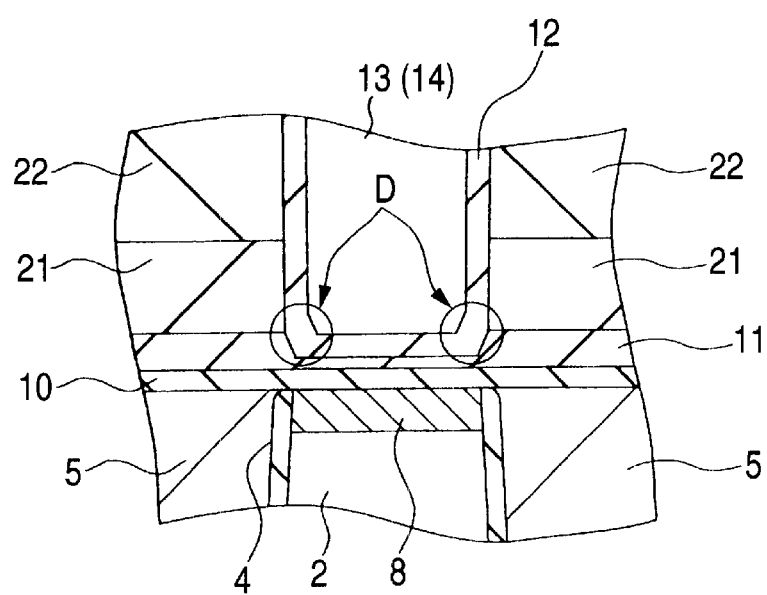
FIG. 77 depicts a section of a principal part during the process for fabricating the DRAM following FIG. 75.

Subsequently, as shown in FIGS. 76 and 77, the insulating film 12 is formed by the same process as that described with reference to FIGS. 24 and 25 in the embodiment 1.

As described above, the insulating film 11 is etched so as to form the section of the hole parts 13 and 14 into a forward tapered shape smaller toward the bottom at the corners F in the upper face of the cap insulating film 9 shown in FIG. 76 and at the corners D in the bottom of the hole parts 13 and 14 shown in FIG. 77. Therefore, the coverage of the insulating film 12 can be enhanced at the corners F in the upper face of the cap insulating film 9 and at the corners D in the bottom of the hole parts 13 and 14 as compared with the case of the embodiment 1. Consequently, the junction strength of the insulating films 11 to 12 can be enhanced at the corners F in the upper face of the cap insulating film 9 and at the corners D in the bottom of the hole parts 13 and 14 as compared with the embodiment 1. In addition, the junction strength of the insulating films 11 to 12 can be enhanced and thus it can be prevented more surely than the embodiment 1 that the silicon oxide film 21 is exposed in the sidewalls of the hole parts 13 and 14 in etching the insulating film 12 in the bottom of the hole parts 13 and 14 in the later process.

After that, the DRAM of the embodiment 4 is fabricated by the same processes as those described with reference to FIGS. 28 to 35 and 50 to 59 in the embodiment 1.

The process that the insulating film 11 is etched so as to form the section of the hole parts 13 and 14 into the forward tapered shape smaller toward the bottom at the corners F in the upper face of the cap insulating film 9 and at the corners D in the bottom of the hole parts 13 and 14 can be adapted to the case of the embodiments 2 and 3.

Embodiment 5

A method for fabricating a DRAM of embodiment 5 is that in the etching resistant mask 24, described with reference to FIG. 19 in the embodiment 1, is formed narrow and long slit-like or groove-like hole parts extending the direction of the long side of the active region L crossing the storage part. Other processes and members are the same as those in the embodiment 1 or embodiment 1, omitting the description of the same processes and members.

Next, the method for fabricating the DRAM of the embodiment 5 will be described in accordance with FIGS. 78 to 84.

The method for fabricating the DRAM of the embodiment 5 is the same until the processes described with reference to FIGS. 3 to 14 in the embodiment 1.

Figure 78:
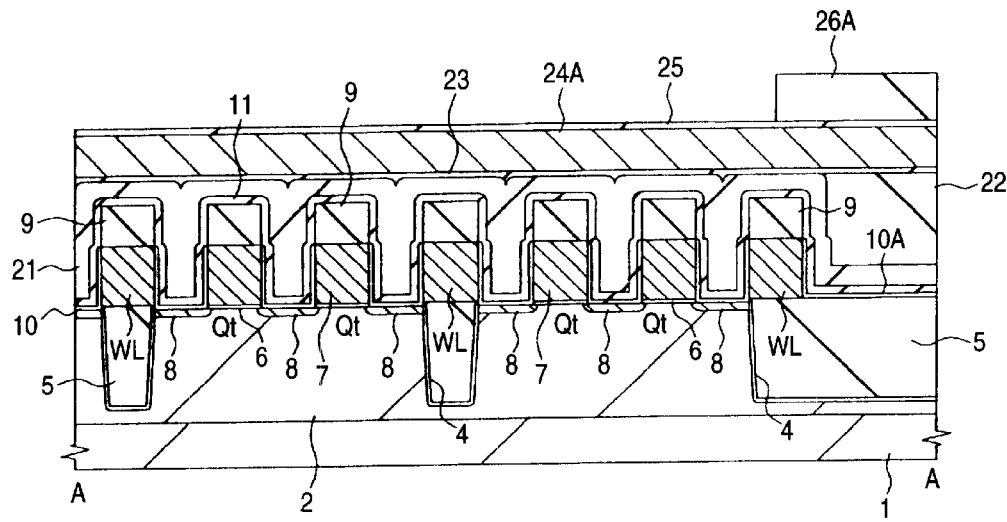
FIG. 78 depicts a section of a principal part illustrating a method for fabricating a DRAM of one embodiment of the invention.
Figure 79:
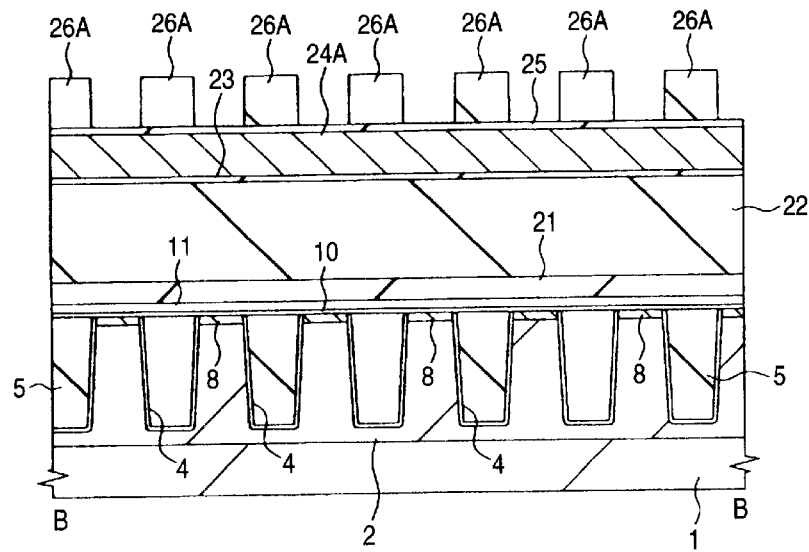
FIG. 79 depicts a section of a principal part illustrating the method for fabricating the DRAM of the embodiment of the invention.

After that, as shown in FIGS. 78 and 79, a thin silicon oxide film 23 having a film thickness of about 10 nm is deposited over the silicon oxide film 22 by CVD, for example. Subsequently, a polycrystalline silicon film 24A having a film thickness of about 70 nm is deposited over the silicon oxide film 23 by CVD, for example, and then an antireflection film 25 having a film thickness of about 60 nm and a photoresist film 26A having a film thickness of about 400 nm are spin coated over the polycrystalline silicon film 24A.

Figure 80:
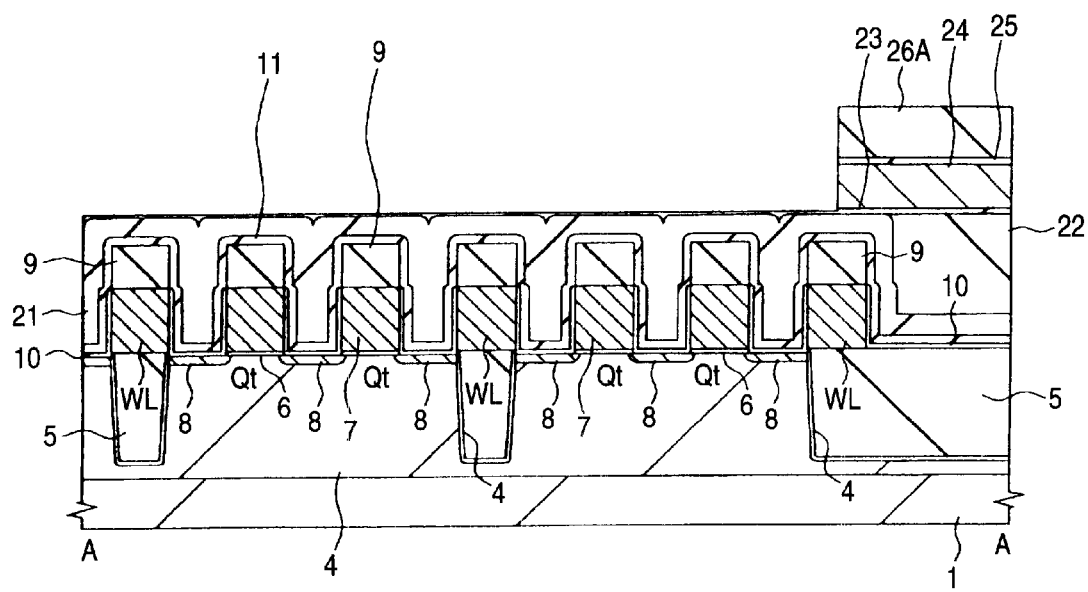
FIG. 80 depicts a section of a principal part during the process for fabricating the DRAM following FIG. 78.
Figure 81:
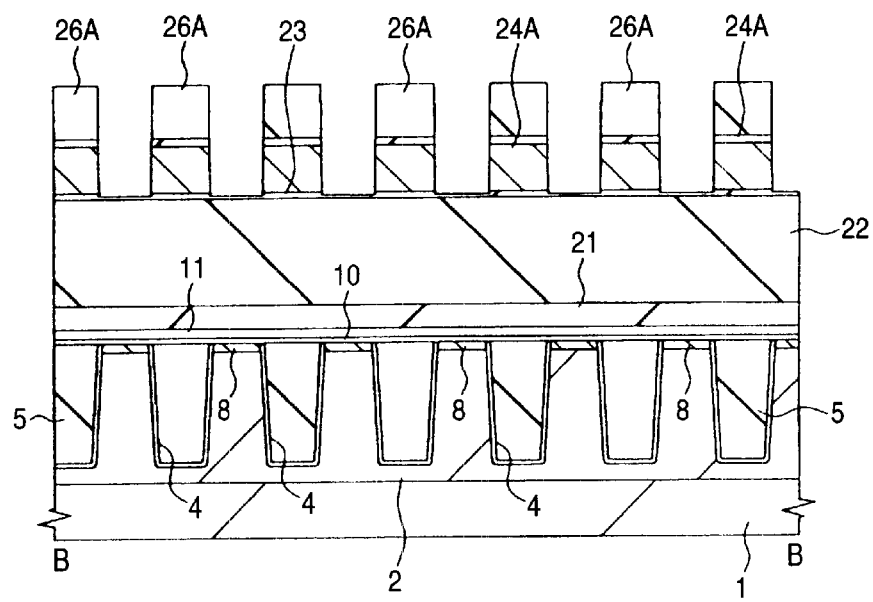
FIG. 81 depicts a section of a principal part during the process for fabricating the DRAM following FIG. 79.
Figure 82:
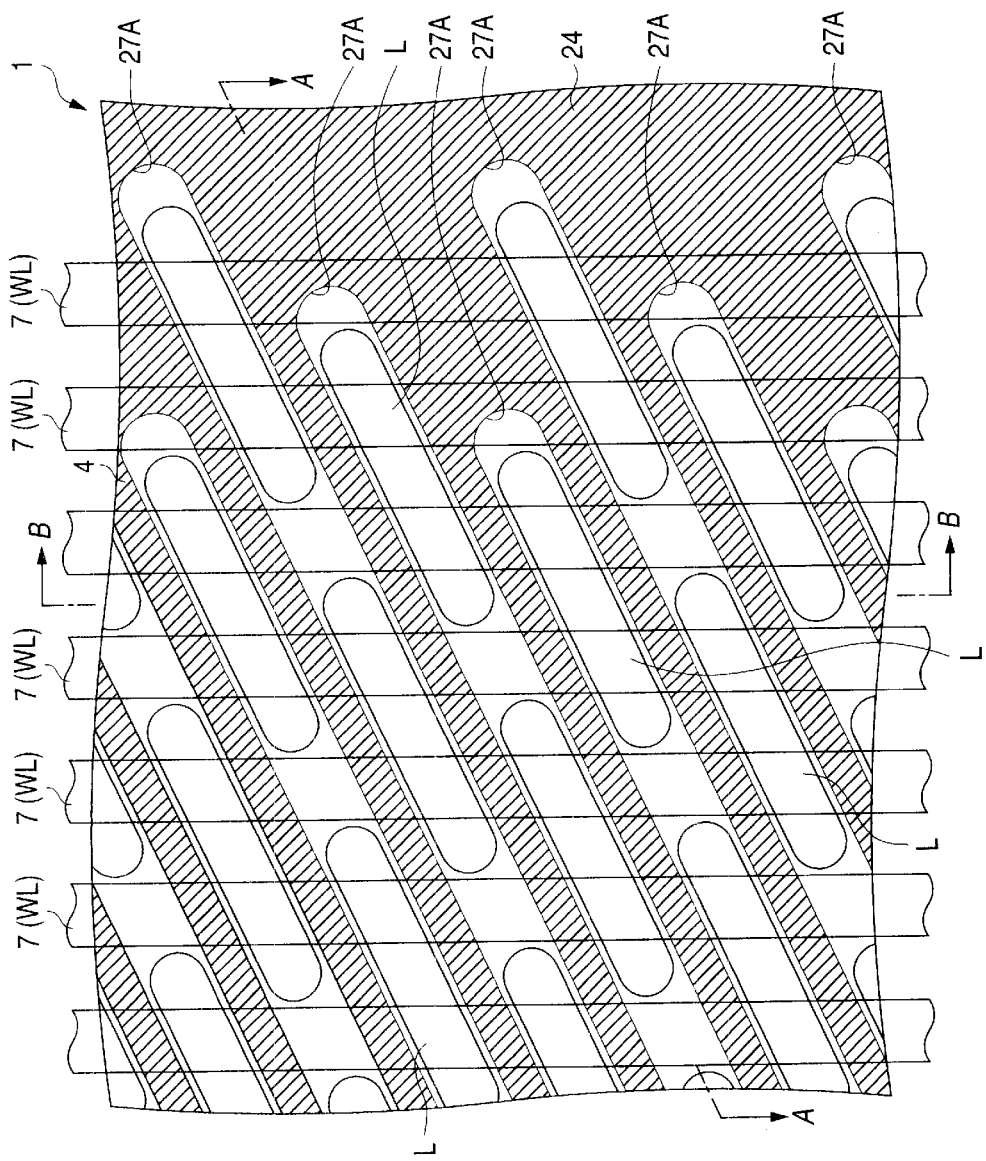
FIG. 82 depicts a plan view of a principal part illustrating the method for fabricating the DRAM of the embodiment of the invention.

Subsequently, as shown in FIGS. 80 and 81, the photoresist film 26A is used as a mask to partially dry etch the antireflection film 25 and the polycrystalline silicon film 24A. Thereby, an etching resistant mask 24 is formed. FIG. 82 depicts a plan view illustrating a pattern of the etching resistant mask 24 (a portion applied to gray color) comprised of the polycrystalline silicon film 24A. As shown in the drawing, the etching resistant mask 24 has narrow and long slit-like or groove-like hole parts 27A extending the direction of the long side of the active region L crossing the storage part.

Here, in the case where the planar circle hole parts 27 are formed in the etching resistant mask 24 shown in FIG. 19 in the embodiment 1, the hole positions of the hole parts 27 are to be shifted in the direction of the long side of the active region L when the photomask is misaligned. In this case, the hole positions of the hole parts 13 and 14, formed self-aligningly in the later process, are also shifted in the direction of the long side of the active region L and the hole area of the hole parts 13 and 14 is to be reduced. The hole area of the hole parts 13 and 14 is reduced and thereby the hole area of the contact holes 17 and 18, formed by removing the insulating films 11 and 10 in the bottom of the hole parts 13 and 14 in the later process, is also decreased. Consequently, the area where the plug 19 to be buried inside the contact holes 17 and 18 contacts the n-type semiconductor regions 8 is reduced as well.

Figure 83:
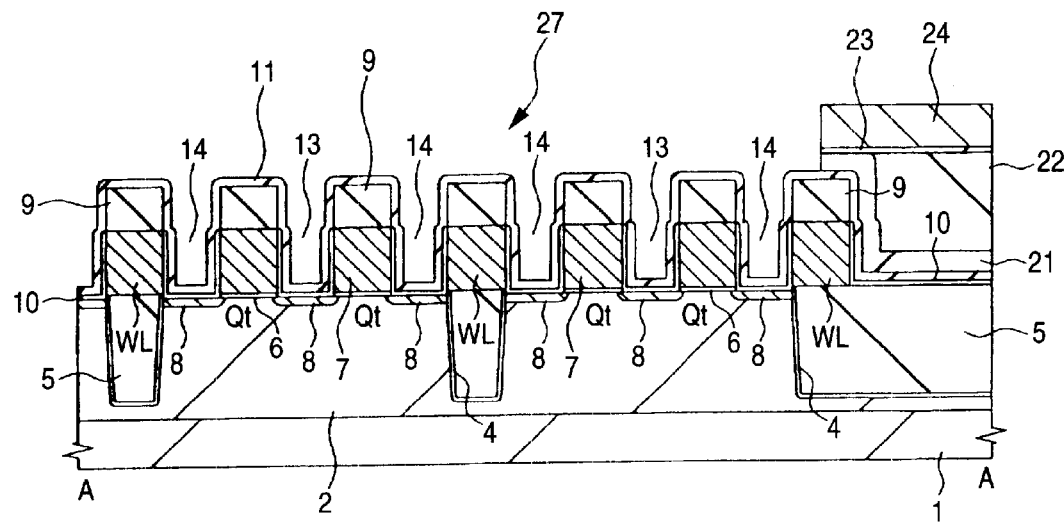
FIG. 83 depicts a section of a principal part during the process for fabricating the DRAM following FIG. 80.
Figure 84:
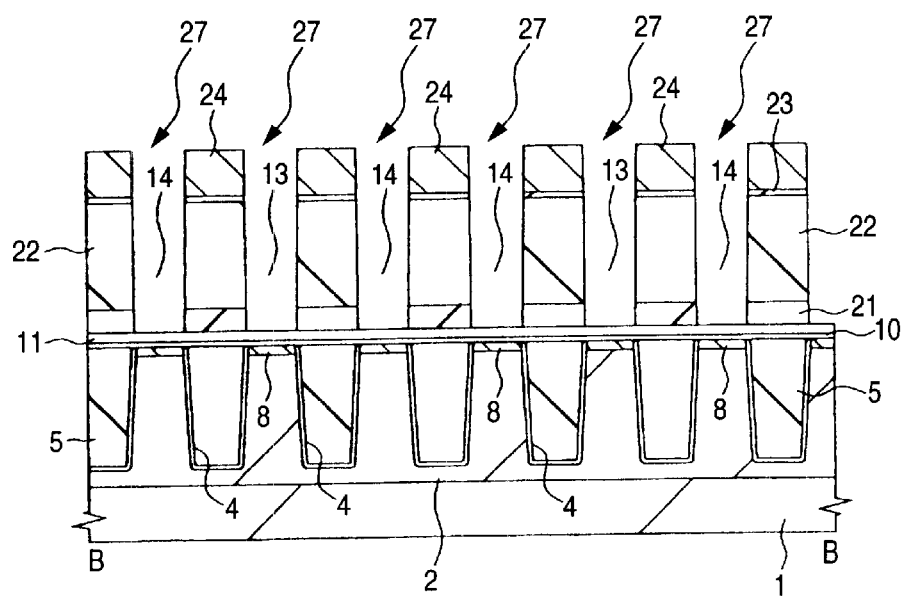
FIG. 84 depicts a section of a principal part during the process for fabricating the DRAM following FIG. 81.

On the other hand, in the embodiment 5, the hole parts 13 and 14 are formed by using the etching resistant mask 24 having the narrow and long slit-like or groove-like hole parts 27A extending the direction of the long side of the active region L, as shown in FIGS. 83 and 84. On this account, when the misalignment of the photomask causes the positions of the hole parts 27A to be shifted in the direction of the long side of the active region L, the hole area of the hole parts 13 and 14 is not reduced. Consequently, the hole area of the contact holes 17 and 18 is not decreased and thus it can be prevented that the area where the plug 19 to be buried inside the contact holes 17 and 18 contacts the n-type semiconductor regions 8 is reduced. More specifically, according to the embodiment 5 that the hole parts 13 and 14 are formed by using the etching resistant mask 24 having the slit-like or groove-like hole parts 27A, the area where the plug 19 buried inside the contact holes 17 and 18 contacts the n-type semiconductor regions 8 can be secured to the maximum. Therefore, an increase in the contact resistance between the plug 19 and the n-type semiconductor regions 8 can be suppressed.

After that, the DRAM of the embodiment 5 is fabricated by the same processes as those described with reference to FIGS. 23 to 35 and 50 to 59 in the embodiment 1.

Embodiment 6

Figure 85:
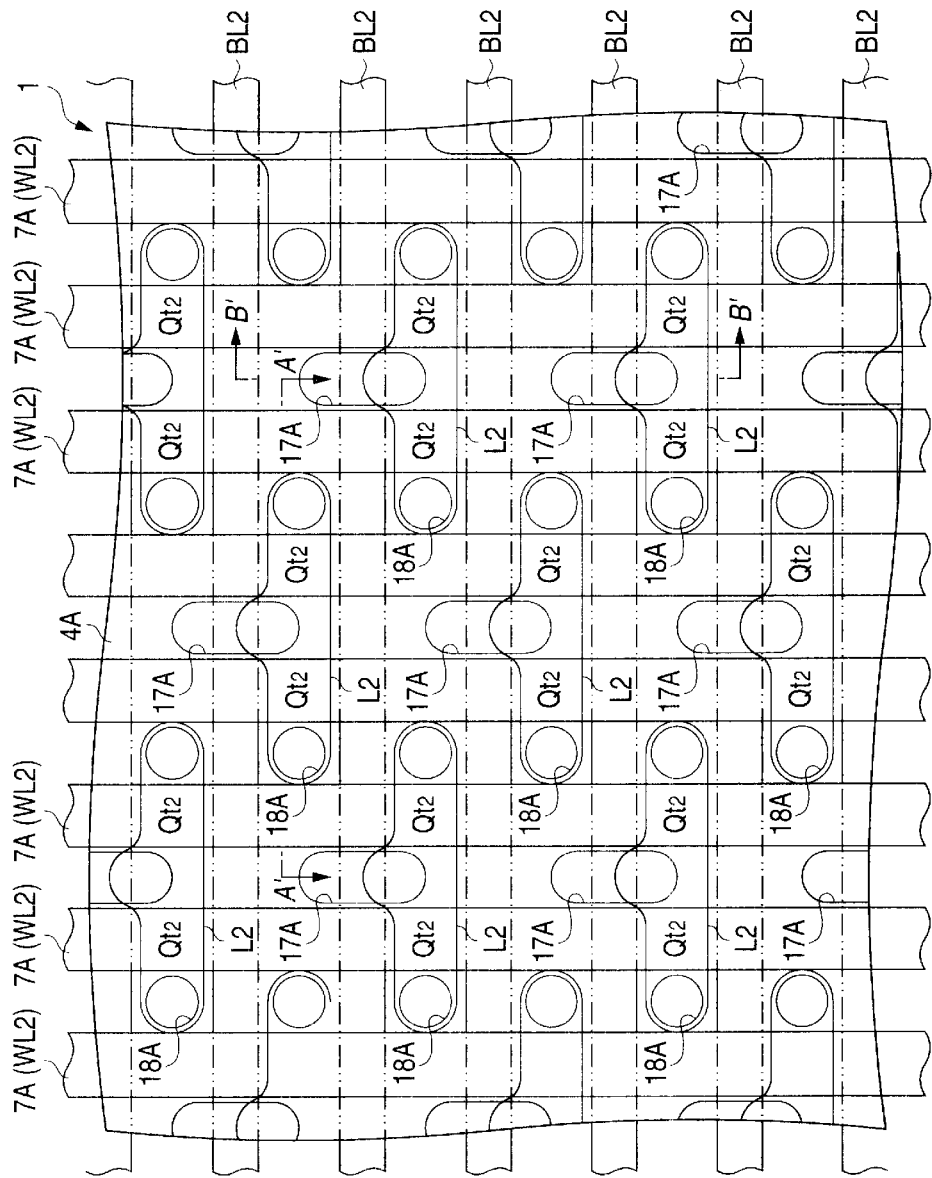
FIG. 85 depicts a plan view of a principal part illustrating a method for fabricating a DRAM of one embodiment of the invention.
Figure 86:
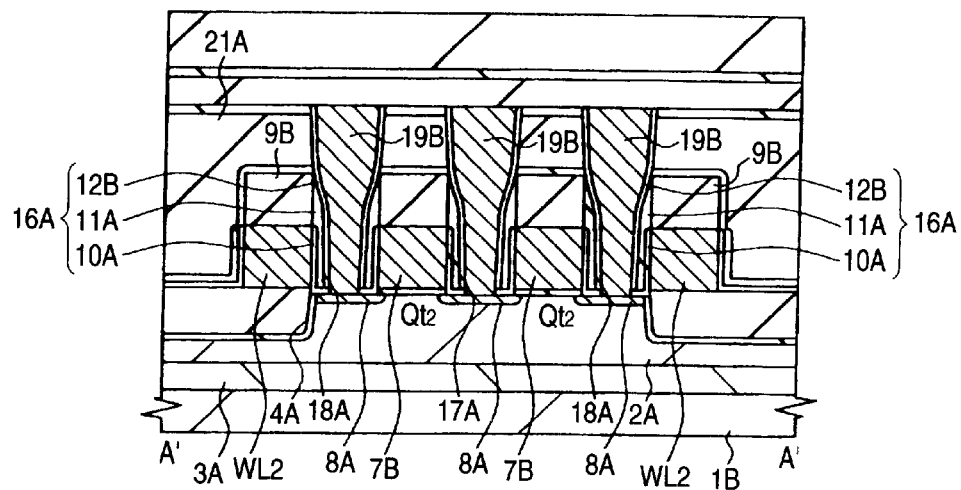
FIGS. 86A and 86B depict a section of a principal part illustrating the method for fabricating the DRAM of the embodiment of the invention.
Figure 86:
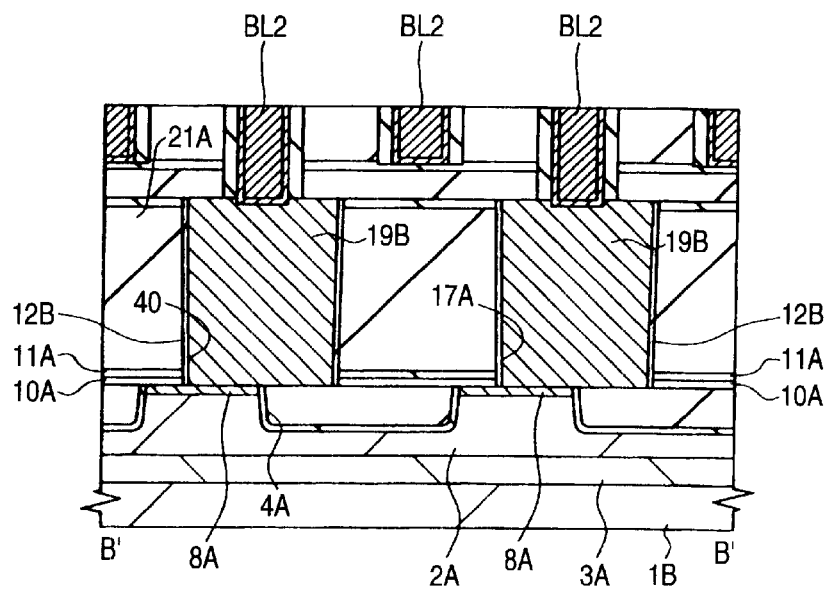

FIG. 85 depicts a plan view of a principal part of a substrate illustrating memory cells in the midway of the process for fabricating a DRAM of embodiment 6. FIG. 86A depicts a section of a line A'—A' shown in FIG. 85 and FIG. 86B depicts a section of a line B'—B' shown in FIG. 85.

For example, in the main surface of a semiconductor substrate 1B are formed an n-type well 3A and a p-type well 2A. In the p-type well is formed active regions L2 where the periphery thereof is defined by a device isolation trench 4A. As shown in FIG. 85, the active area L2 is configured of a planar pattern having a reverse T-shape extended in the lateral direction of the drawing and the center thereof is projected in a bump shape upward the drawing.

In each of the active regions L2 are formed two MISFETs (memory cell selecting MISFET $Qt_2$) sharing one of a source and drain. A contact hole 18A (second hole part) buried with a plug 19B (second insulating film) comprised of a low resistant polycrystalline silicon film, for example, is formed in the upper part of one of the source and drain (n-type semiconductor regions 8) of the memory cell selecting MISFET $Qt_2$. An information storage capacitive element, formed in the later process, is electrically connected to one of the source and drain (n-type semiconductor regions 8) through the contact hole 18A. In addition, a gate electrode 7B of the memory cell selecting MISFET $Qt_2$ is configured integratedly with a word line WL2. A cap insulating film 9B comprised of a silicon nitride film is formed over the gate electrode 7B (word line WL2).

A bit line BL2 is electrically connected to the other of the source and drain (n-type semiconductor regions shared by two memory cell selecting MISFETs $Qt_2$) through a contact hole 17A (second hole part). Furthermore, the contact hole 17A has an oval or rectangular planar pattern and the long side thereof is extended in the vertical direction of FIG. 85.

Two layers of insulating films 10A (second insulating film) and 11A (third insulating film) are formed over the sidewalls of the gate electrode 7B (word line WL2) of the memory cell selecting MISFET $Qt_2$. In the two layers of the insulating films 10A and 11A, the inner-side insulating film 10A is comprised of a silicon oxide film and the outer-side insulating film 11A is comprised of a silicon nitride film.

In the sidewalls of the contact holes 17A and 18A are formed an insulating film 12B (fifth insulating film) comprised of a silicon nitride film so as to surround the periphery thereof. In the section crossing the gate electrode 7B (word line WL2), a sidewall insulating film 16A comprised of the insulating films 10A, 11A and 12B is formed.

The insulating films 10A, 11A and 12B are formed by the same processes as those where the insulating films 10, 11 and 12 were formed as described with reference to FIGS. 12 to 27 in the embodiment 1. Here, according to the experiment conducted by the inventors, it was found that the restrictions 15 described with reference to FIGS. 26 and 27 in the embodiment 1 an liable to be generated in the insulating film 12B at the corners in the bottom of the contact hole 17A when the contact hole 17A has an oval or rectangular planar pattern, as described above, where a ratio of the long side to the short side of the oval or rectangular figure is about 1 to 3 and a ratio of the depth to the length of the long side is about one or greater. In the DRAM of the embodiment 6, the insulating films 10A, 11A and 12B are formed by the same processes as those of the insulating films 10, 11 and 12 in the embodiment 1. Thus, a portion of the insulating film 12B overlapped with the insulating film 11A can be formed at the corners in the bottom of the contact hole 17A. Consequently, a silicon oxide film 21A can be prevented from being exposed in the sidewalls of the contact hole 17A, as similar to the case of the embodiment 1. That is, the insulating film 21A can be prevented from being wet etched in the cleaning process after forming the insulating film 12B.

As described above, the invention made by the inventors has been described in accordance with the embodiments. However, it is needles to say that the invention is not limited to the embodiments, which can be modified variously within the scope of the teachings, not deviating it.

For example, the embodiments exemplified that the gate electrode of the memory cell selecting MISFET is configured of the polycrystalline silicon film. However, it may be configured of a poly-metal structure where a barrier metal film such as a WN (tungsten nitride) film or TiN (titanium nitride) film is layered with a W (tungsten) film over the polycrystalline silicon film. In such a structure, the gate electrode is formed higher and the aspect ratio of the contact hole becomes greater. Thus, it is considered that the problems described in the embodiments tend to occur, but adopting the scheme described in the embodiments can avoid these problems.

The followings are the brief summary of the effects obtained by the representative inventions among the inventions disclosed in the application.

(1) According to the invention, in forming a contact hole reaching a semiconductor substrate by etching, the etching conditions are changed in the midway of the formation. Therefore, the semiconductor substrate underlying the bottom of the contact hole can be prevented from being cut.

(2) According to the invention, the semiconductor substrate underlying the bottom of the contact holes can be prevented from being cut in forming the contact hole reaching the semiconductor substrate by etching. Therefore, a damaged layer due to etching can be prevented from being formed in the semiconductor substrate.

(3) According to the invention, an insulating film having a main component of silicon oxide can be prevented from being exposed in the sidewalls of the contact hole reaching the semiconductor substrate. Therefore, the insulating film can be prevented from being wet etched in the cleaning process.

(4) According to the invention, an interlayer insulating film can be prevented from being wet etched from the sidewalls of the contact hole. Therefore, the adjacent contact holes can be prevented from being short-circuited.

What is claimed is:

1. A method of producing a semiconductor integrated circuit device comprising the steps of:
   (a) forming a first conductive film over a semiconductor substrate and then forming a first insulating film over the first conductive film;
   (b) forming a plurality of gate electrodes and a cap insulating film covering an upper part of the gate electrodes by etching the first conductive film and the first insulating film;
   (c) forming a third insulating film over the semiconductor substrate including sidewalls and an upper part of the cap insulating film;
   (d) forming a fourth insulating film over the third insulating film;
   (e) forming a first hole part by etching the fourth insulating film;
   (f) etching the third insulating film exposed in a bottom of the first hole part by a predetermined amount after the step (e);
   (g) forming a fifth insulating film having a film thickness not fully burying a space between the plurality of the gate electrodes over the fourth insulating film and sidewalls and the bottom of the first hole part; and
   (h) forming a second hole part by applying anisotropic etching to the fifth insulating film.

2. The method of producing the semiconductor integrated circuit device according to claim 1, wherein an amount of the third insulating film etched in the step (f) is equal to or above a film thickness of the fifth insulating film formed in the step (g) and equal to or under a film thickness of the third insulating film.

3. The method of producing the semiconductor integrated circuit device according to claim 1, wherein the step of removing the fifth insulating film over the fourth insulating film and in the bottom of the first hole part and removing the third insulating film underlying the bottom of the first hole part in the step (h) is performed by etchback.

4. The method of producing the semiconductor integrated circuit device according to claim 1, wherein the third insulating film is etched by anisotropic etching in the step (f).

5. The method of producing the semiconductor integrated circuit device according to claim 1, wherein the first insulating film is comprised of an insulating film having a main component of silicon nitride, the third insulating film is comprised of an insulating film having a main component of silicon nitride, the fourth insulating film is comprised of an insulating film having a main component of silicon oxide and the fifth insulating film is comprised of an insulating film having a main component of silicon nitride.

6. The method of producing the semiconductor integrated circuit device according to claim 5, wherein etching in the step (e) is performed by dry etching using an etching gas containing a fluorocarbon-based gas, a diluent gas and a gas having oxygen.

7. The method of producing the semiconductor integrated circuit device according to claim 6, wherein the etching gas is formed at a composition ratio where the fluorocarbon-based gas is greater than the gas having oxygen and the third insulating film is etched so as to form the first hole part into a forward tapered shape narrowing from top to bottom.

8. The method of producing the semiconductor integrated circuit device according to claim 5, wherein etching in the step (f) is performed by dry etching using an etching gas containing a fluorocarbon-based gas, a diluent gas and a gas having oxygen.

9. The method of producing the semiconductor integrated circuit device according to claim 8, wherein the etching gas is formed at a composition ratio where the fluorocarbon-based gas is greater than the gas having oxygen and the third insulating film is etched so as to form the first hole part into a forward tapered shape narrowing from top to bottom.

10. A method of producing a semiconductor integrated circuit device comprising the steps of:
    (a) forming a first conductive film over a semiconductor substrate and then forming a first insulating film over the first conductive film;
    (b) forming a plurality of gate electrodes and a cap insulating film covering an upper part of the gate electrodes by etching the first conductive film and the first insulating film;
    (c) forming a second insulating film by oxidizing sidewalls of the plurality of gate electrodes and a surface of the semiconductor substrate between the plurality of gate electrodes;
    (d) forming a third insulating film over the semiconductor substrate including an upper part of the second insulating film and an upper part and sidewalls of the cap insulating film;
    (e) forming a fourth insulating film over the third insulating film;
    (f) forming a first hole part by etching the fourth insulating film;
    (g) etching the third insulating film exposed in a bottom of the first hole part using the second insulating film as an etching stopper after the step (f);
    (h) forming a fifth insulating film having a film thickness not fully burying a space between the plurality of gate electrodes over the fourth insulating film and sidewalls and the bottom of the first hole part;
    (i) applying anisotropic etching to the fifth insulating film to expose the second insulating film; and
    (j) forming a second hole part by removing the second insulating film exposed from the fifth insulating film.

11. The method of producing the semiconductor integrated circuit device according to claim 10, wherein the step of removing the fifth insulating film over the fourth insulating film and the bottom of the first hole part and removing the second insulating film underlying the bottom of the first hole part in the step (i) is performed by etchback.

12. The method of producing the semiconductor integrated circuit device according to claim 10, wherein the third insulating film is etched by anisotropic etching in the step (g).

13. The method of producing the semiconductor integrated circuit device according to claim 10, wherein the first insulating film is comprised of an insulating film having a main component of silicon nitride, the second insulating film is comprised of an insulating film having a main component of silicon oxide, the third insulating film is comprised of an insulating film having a main component of silicon nitride, the fourth insulating film is comprised of an insulating film having a main component of silicon oxide and the fifth insulating film is comprised of an insulating film having a main component of silicon nitride.

14. The method of producing the semiconductor integrated circuit device according to claim 13, wherein etching in the step (f) is performed by dry etching using an etching gas containing a fluorocarbon-based gas, a diluent gas and a gas having oxygen.

15. The method of producing the semiconductor integrated circuit device according to claim 14, wherein the etching gas is formed at a composition ratio where the fluorocarbon-based gas is greater than the gas having oxygen and the third insulating film is etched so as to form the first hole part into a forward tapered shape narrowing from top to bottom.

16. The method of producing the semiconductor integrated circuit device according to claim 13, wherein etching in the step (g) is performed by dry etching using an etching gas containing a fluorocarbon-based gas, a diluent gas and a gas having oxygen.

17. The method of producing the semiconductor integrated circuit device according to claim 16, wherein the etching gas is formed at a composition ratio where the fluorocarbon-based gas is greater than the gas having oxygen and the third insulating film is etched so as to form the first hole part into a forward tapered shape narrowing from top to bottom.

18. A method of producing a semiconductor integrated circuit device comprising the steps of:
    (a) forming a first conductive film over a semiconductor substrate and then forming a first insulating film over the first conductive film;
    (b) forming a plurality of gate electrodes and a cap insulating film covering an upper part of the gate electrodes by etching the first conductive film and the first insulating film;
    (c) forming a third insulating film over the semiconductor substrate including an upper part and sidewalls of the cap insulating film;
    (d) forming a fourth insulating film over the third insulating film;
    (e) forming a first hole part by etching the fourth insulating film;
    (f) etching the third insulating film exposed in a bottom of the first hole part by a predetermined amount after the step (e);
    (g) forming a fifth insulating film having a film thickness not fully burying a space between the plurality of the gate electrodes over the fourth insulating film and sidewalls and the bottom of the first hole part;
    (h) forming a second hole part by applying anisotropic etching to the fifth insulating film; and
    (i) forming a second conductive film inside the second hole part,
        wherein the third insulating film is overlapped with the fifth insulating film in the bottom of the second hole part.

19. The method of producing the semiconductor integrated circuit device according to claim 18, wherein the semiconductor substrate is cleaned before the step (i).

20. The method of producing the semiconductor integrated circuit device according to claim 19, wherein the fourth insulating film is an organic-based insulating film.

21. The method of producing the semiconductor integrated circuit device according to claim 20, wherein the fourth insulating film is an organic SOG film.

22. The method of producing the semiconductor integrated circuit device according to claim 19, wherein the fourth insulating film is an inorganic-based insulating film.

23. The method of producing the semiconductor integrated circuit device according to claim 22, wherein the fourth insulating film is an inorganic SOG film.

24. The method of producing the semiconductor integrated circuit device according to claim 19, wherein the fourth insulating film is an insulating film having a dielectric constant of about four or under.

25. The method of producing the semiconductor integrated circuit device according to claim 19, wherein a plan shape of an opening of the second hole part is formed to be circular, oval or rectangular.

26. The method of producing the semiconductor integrated circuit device according to claim 25, wherein a ratio of a length of a long side to a short side of the opening of the second hole part is about from one to three.

27. The method of producing the semiconductor integrated circuit device according to claim 25, wherein a ratio of a depth to the long side of the opening of the second hole part is about one or greater.

28. The method of producing the semiconductor integrated circuit device according to claim 25, wherein a ratio of a depth to the long side of the opening of the second hole part is about one or greater.

29. The method of producing the semiconductor integrated circuit device according to claim 18, wherein the fifth insulating film is formed to have a film thickness thinner than that of the third insulating film.

30. A method of producing a semiconductor integrated circuit device comprising the steps of:
    (a) forming a first conductive film over a semiconductor substrate and then forming a first insulating film over the first conductive film;
    (b) forming a plurality of gate electrodes and a cap insulating film covering an upper part of the gate electrodes by etching the first conductive film and the first insulating film;
    (c) forming a second insulating film by oxidizing sidewalls of the plurality of gate electrodes and a surface of the semiconductor substrate between the plurality of gate electrodes;
    (d) forming a third insulating film over the semiconductor substrate including an upper part of the second insulating film and an upper part and sidewalls of the cap insulating film;
    (e) forming a fourth insulating film over the third insulating film;
    (f) forming a first hole part by etching the fourth insulating film;
    (g) etching the third insulating film exposed in a bottom of the first hole part using the second insulating film as an etching stopper after the step (f);
    (h) forming a fifth insulating film having a film thickness not fully burying a space between the plurality of gate electrodes over the fourth insulating film and sidewalls and the bottom of the first hole part;
    (i) applying anisotropic etching to the fifth insulating film to expose the second insulating film;
    (j) forming a second hole part by removing the second insulating film exposed from the fifth insulating film; and
    (k) forming a second conductive film inside the second hole part,
        wherein the third insulating film is overlapped with the fifth insulating film in a bottom of the second hole part.

31. The method of producing the semiconductor integrated circuit device according to claim 30, wherein the semiconductor substrate is cleaned before the step (k).

32. The method of producing the semiconductor integrated circuit device according to claim 30, wherein the fifth insulating film is formed to have a film thickness thicker than that of the third insulating film.

33. The method of producing the semiconductor integrated circuit device according to claim 31, wherein the fourth insulating film is an organic-based insulating film.

34. The method of producing the semiconductor integrated circuit device according to claim 33, wherein the fourth insulating film is an organic SOG film.

35. The method of producing the semiconductor integrated circuit device according to claim 31, wherein the fourth insulating film is an inorganic-based insulating film.

36. The method of producing the semiconductor integrated circuit device according to claim 35, wherein the fourth insulating film is an inorganic SOG film.

37. The method of producing the semiconductor integrated circuit device according to claim 31, wherein the fourth insulating film is an insulating film having a dielectric constant of about four or under.

38. The method of producing the semiconductor integrated circuit device according to claim 31, wherein a plan shape of an opening of the second hole part is formed to be circular, oval or rectangular.

39. The method of producing the semiconductor integrated circuit device according to claim 38, wherein a ratio of a length of a long side to a short side of the opening of the second hole part is about from one to three.

40. The method of producing the semiconductor integrated circuit device according to claim 39, wherein a ratio of a depth to the long side of the opening of the second hole part is about one or greater.

41. The method of producing the semiconductor integrated circuit device according to claim 38, wherein a ratio of a depth to the long side of the opening of the second hole part is about one or greater.

* * * * *